(12) United States Patent
Adkins et al.

(10) Patent No.: US 11,415,629 B2
(45) Date of Patent: Aug. 16, 2022

(54) RELAY COIL DRIVE CIRCUIT

(71) Applicant: Rockwell Automation Technologies, Inc., Mayfield Heights, OH (US)

(72) Inventors: Kyle B. Adkins, Oak Creek, WI (US); Andrew E. Carlson, Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 360 days.

(21) Appl. No.: 16/587,968

(22) Filed: Sep. 30, 2019

(65) Prior Publication Data

US 2021/0096185 A1    Apr. 1, 2021

(51) Int. Cl.
| | | |
|---|---|---|
| *H01H 47/22* | (2006.01) | |
| *H01H 47/00* | (2006.01) | |
| *H01H 47/02* | (2006.01) | |
| *H01H 9/16* | (2006.01) | |
| *H01H 9/56* | (2006.01) | |
| *G01R 31/327* | (2006.01) | |
| *H02P 1/10* | (2006.01) | |
| *H03K 17/18* | (2006.01) | |

(52) U.S. Cl.
CPC ..... *G01R 31/3274* (2013.01); *G01R 31/3278* (2013.01); *H01H 9/16* (2013.01); *H01H 9/56* (2013.01); *H01H 47/002* (2013.01); *H01H 47/02* (2013.01); *H01H 47/22* (2013.01); *H02P 1/10* (2013.01); *H03K 17/18* (2013.01); *H01H 2047/008* (2013.01)

(58) Field of Classification Search
CPC ...... H01H 47/22; H01H 47/223; H01H 47/02; H01H 47/002; H01H 2047/008; H01H 9/56; H01H 9/16; G01R 31/3278; G01R 31/3274; H02P 1/10
See application file for complete search history.

(56) References Cited

U.S. PATENT DOCUMENTS

| | | |
|---|---|---|
| 3,265,938 A | 8/1966 | Daiden |
| 3,790,862 A | 2/1974 | Kampf et al. |
| 6,233,132 B1 | 5/2001 | Jenski |
| 10,393,809 B2 | 8/2019 | Bock et al. |
| 10,396,688 B2 | 8/2019 | Jaap et al. |
| 2003/0160517 A1 | 8/2003 | Lo et al. |

(Continued)

FOREIGN PATENT DOCUMENTS

CN    105428154 A  *  3/2016

OTHER PUBLICATIONS

Machine english translation ,REN TAO "A DC Electromagnetic Relay Driving Circuit And Driving Method Thereof", Mar. 23, 2016 (Year : 2016).*

(Continued)

*Primary Examiner* — Sisay G Tiku

(74) *Attorney, Agent, or Firm* — Fletcher Yoder, P.C.

(57) ABSTRACT

A relay device may include an armature that moves between a first position that electrically couples the armature to a first contact and a second position that electrically couples the armature to a second contact. The relay device may also include a relay coil that receives a voltage to magnetize the relay coil, thereby causing the armature to move from the first position to the second position. The relay device may also include a drive circuit that couple the voltage to the relay coil, such that the voltage is higher than a rated voltage associated with the relay coil.

20 Claims, 32 Drawing Sheets

(56) References Cited

U.S. PATENT DOCUMENTS

| | | |
|---|---|---|
| 2010/0177453 A1 | 7/2010 | Critchley et al. |
| 2021/0096186 A1* | 4/2021 | Elmiger .................. H01H 47/02 |
| 2021/0098207 A1* | 4/2021 | Elmiger .................. H01H 9/563 |
| 2021/0098216 A1* | 4/2021 | Omari .................... H01H 50/54 |
| 2021/0098217 A1* | 4/2021 | Omari .................... H02P 29/50 |

OTHER PUBLICATIONS

European Search Report for EP Application No. 20195797.4 dated Feb. 1, 2021, 11 pages.

* cited by examiner

RELAY COIL DRIVE CIRCUIT

BACKGROUND

The present disclosure relates generally to switching devices, and more particularly to operation and configuration of the switching devices.

Switching devices are generally used throughout industrial, commercial, material handling, process and manufacturing settings, to mention only a few. As used herein, "switching device" is generally intended to describe any electromechanical switching device, such as mechanical switching devices (e.g., a contactor, a relay, air break devices, and controlled atmosphere devices) or solid-state devices (e.g., a silicon-controlled rectifier (SCR)). More specifically, switching devices generally open to disconnect electric power from a load and close to connect electric power to the load. For example, switching devices may connect and disconnect three-phase electric power to an electric motor. As the switching devices open or close, electric power may be discharged as an electric arc and/or cause current oscillations to be supplied to the load, which may result in torque oscillations. To facilitate reducing likelihood and/or magnitude of such effects, the switching devices may be opened and/or closed at specific points on the electric power waveform. Such carefully timed switching is sometimes referred to as "point on wave" or "POW" switching. However, the opening and closing of the switching devices are generally non-instantaneous. For example, there may be a slight delay between when the make instruction is given and when the switching device actually makes (i.e., closes). Similarly, there may be a slight delay between when break instruction is given and when the switching device actually breaks (i.e., opens). Accordingly, to facilitate making or breaking at a specific point on the electric power waveform, a number of embodiments may be employed to enable the switching device to operate with respect to a specific point on the electrical power waveform. As such, the present disclosure relates to various different technical improvements in the field of POW switching, which may be used in various combinations to provide advances in the art.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a relay device may include an armature that moves between a first position that electrically couples the armature to a first contact and a second position that electrically couples the armature to a second contact. The relay device may also include a relay coil that receives a voltage to magnetize the relay coil, thereby causing the armature to move from the first position to the second position. The relay device may also include a drive circuit that couple the voltage to the relay coil, such that the voltage is higher than a rated voltage associated with the relay coil.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
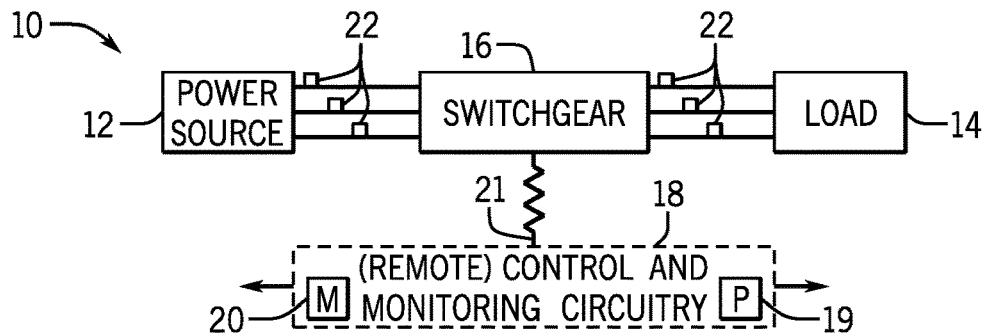
FIG. 1 is a diagrammatical representation of a set of switching devices to provide power to an electrical load, in accordance with an embodiment.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

As described above, switching devices are used in various implementations, such as industrial, commercial, material handling, manufacturing, power conversion, and/or power distribution, to connect and/or disconnect electric power from a load. To consistently implement POW switching, a number of factors may be taken into consideration to ensure that the respective switching device closes or opens within a consistent amount of time after receiving a signal causing the respective switching device to close or open. That is, a coil drive circuit that controls the closing and opening of the switching device may be affected by a coil resistance, a temperature, a coil supply voltage, a coil inductance, and the like. The present embodiments described herein assists the switching device to close or open within a consistent time frame that may enable the POW switching operations to be more effective.

With the foregoing in mind, it should be noted that an ideal inductor current is expected to be linear when coupled to a constant voltage source. That is, the inductor current (i) is inversely proportional to the coil inductance (L) when coupled to a constant voltage source (v(t)), as described below in Equation 1.

$$v(t) = L\frac{di}{dt} \rightarrow i = \frac{1}{L}\int_0^t v\, dt \rightarrow i(t) = \frac{1}{L}(vt) \qquad (1)$$

However, due to the change in inductance of the coil as the armature of the switching device (e.g., relay device) moves, the coil current is not linear when a voltage that corresponds to the rating of the coil is applied to the coil. With this in mind, in some embodiments, a voltage source that outputs a voltage that is higher (e.g., 4 to 5 times higher) than the rated voltage of the coil. The higher voltage may significantly reduce the variability of the time in which various switching devices closes due to the coil current reaching a threshold current value within a shorter amount of time as compared to when the rated voltage is applied to the coil for the same various switching devices. In other words, driving the coil using a higher voltage source than the voltage rating for the respective coil will minimize the effect of inductance variability in the coil on the operation (e.g., close time) of the switching device.

In addition to using a higher voltage source as compared to the rating of the coil, the present embodiments may also employ a constant current source to drive the coil. The constant current source may enable the switching device to close more consistently over various coil resistances (e.g., +/−10%), various temperatures (e.g., additional +/−10% on coil resistance), various coil supply voltages (e.g., +/−5%). Additional details for employing a constant current source with a relatively high voltage source to drive the coil of a switching device is described below with reference to FIGS. 1-14.

By way of introduction, FIG. 1 depicts a system 10 that includes a power source 12, a load 14, and switchgear 16, which includes one or more switching devices that may be controlled using the techniques described herein. In the depicted embodiment, the switchgear 16 may selectively connect and/or disconnect three-phase electric power output by the power source 12 to the load 14, which may be an electric motor or any other powered device. In this manner, electrical power flows from the power source 12 to the load 14. For example, switching devices in the switchgear 16 may close to connect electric power to the load 14. On the other hand, the switching devices in the switchgear 16 may open to disconnect electric power from the load 14. In some embodiments, the power source 12 may be an electrical grid.

It should be noted that the three-phase implementation described herein is not intended to be limiting. More specifically, certain aspects of the disclosed techniques may be employed on single-phase circuitry and/or for applications other than power an electric motor. Additionally, it should be noted that in some embodiments, energy may flow from the source 12 to the load 14. In other embodiments energy may flow from the load 14 to the source 12 (e.g., a wind turbine or another generator). More specifically, in some embodiments, energy flow from the load 14 to the source 12 may transiently occur, for example, when overhauling a motor.

In some embodiments, operation of the switchgear 16 (e.g., opening or closing of switching devices) may be controlled by control and monitoring circuitry 18. More specifically, the control and monitoring circuitry 18 may instruct the switchgear 16 to connect or disconnect electric power. Accordingly, the control and monitoring circuitry 18 may include one or more processors 19 and memory 20. More specifically, as will be described in more detail below, the memory 20 may be a tangible, non-transitory, computer-readable medium that stores instructions, which when executed by the one or more processors 19 perform various processes described. It should be noted that non-transitory merely indicates that the media is tangible and not a signal. Many different algorithms and control strategies may be stored in the memory and implemented by the processor 19, and these will typically depend upon the nature of the load, the anticipated mechanical and electrical behavior of the load, the particular implementation, behavior of the switching devices, and so forth.

Additionally, as depicted, the control and monitoring circuitry 18 may be remote from the switchgear 16. In other words, the control and monitoring circuitry 18 may be communicatively coupled to the switchgear 16 via a network 21. In some embodiments, the network 21 may utilize various communication protocols such as DeviceNet, Profibus, Modbus, and Ethernet, to mention only a few. For example, to transmit signals between the control and monitoring circuitry 18 may utilize the network 21 to send make and/or break instructions to the switchgear 16. The network 21 may also communicatively couple the control and monitoring circuitry 18 to other parts of the system 10, such as other control circuitry or a human-machine-interface (not separately depicted). Additionally, the control and monitoring circuitry 18 may be included in the switchgear 16 or directly coupled to the switchgear, for example, via a serial cable.

Furthermore, as depicted, the electric power input to the switchgear 16 and output from the switchgear 16 may be monitored by sensors 22. More specifically, the sensors 22 may monitor (e.g., measure) the characteristics (e.g., voltage or current) of the electric power. Accordingly, the sensors 22 may include voltage sensors and current sensors. These sensors may alternatively be modeled or calculated values determined based on other measurements (e.g., virtual sensors). Many other sensors and input devices may be used, depending upon the parameters available and the application. Additionally, the characteristics of the electric power measured by the sensors 22 may be communicated to the control and monitoring circuitry 18 and used as the basis for algorithmic computation and generation of waveforms (e.g., voltage waveforms or current waveforms) that depict the electric power. More specifically, the waveforms generated based on input the sensors 22 monitoring the electric power input into the switchgear 16 may be used to define the control of the switching devices, for example, by reducing electrical arcing when the switching devices open or close. The waveforms generated based on the sensors 22 monitoring the electric power output from the switchgear 16 and supplied to the load 14 may be used in a feedback loop to, for example, monitor conditions of the load 14.

Figure 2:
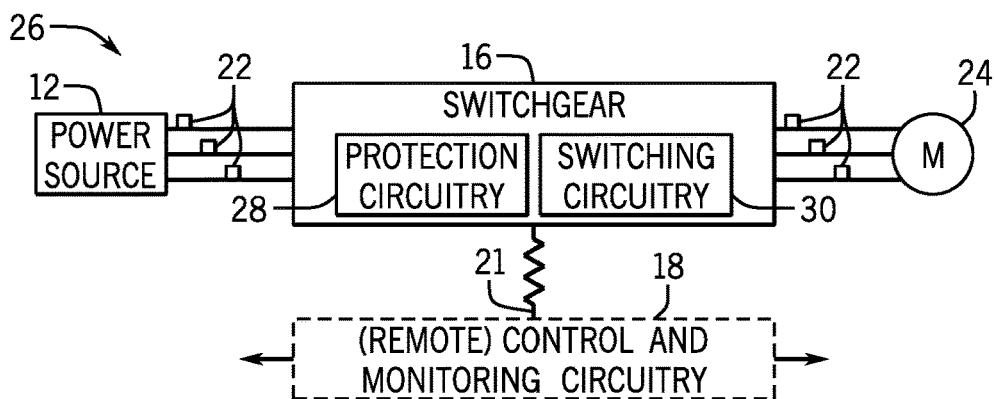
FIG. 2 is a similar diagrammatical representation of a set of switching devices to provide power to an electrical motor, in accordance with an embodiment.
Figure 3:
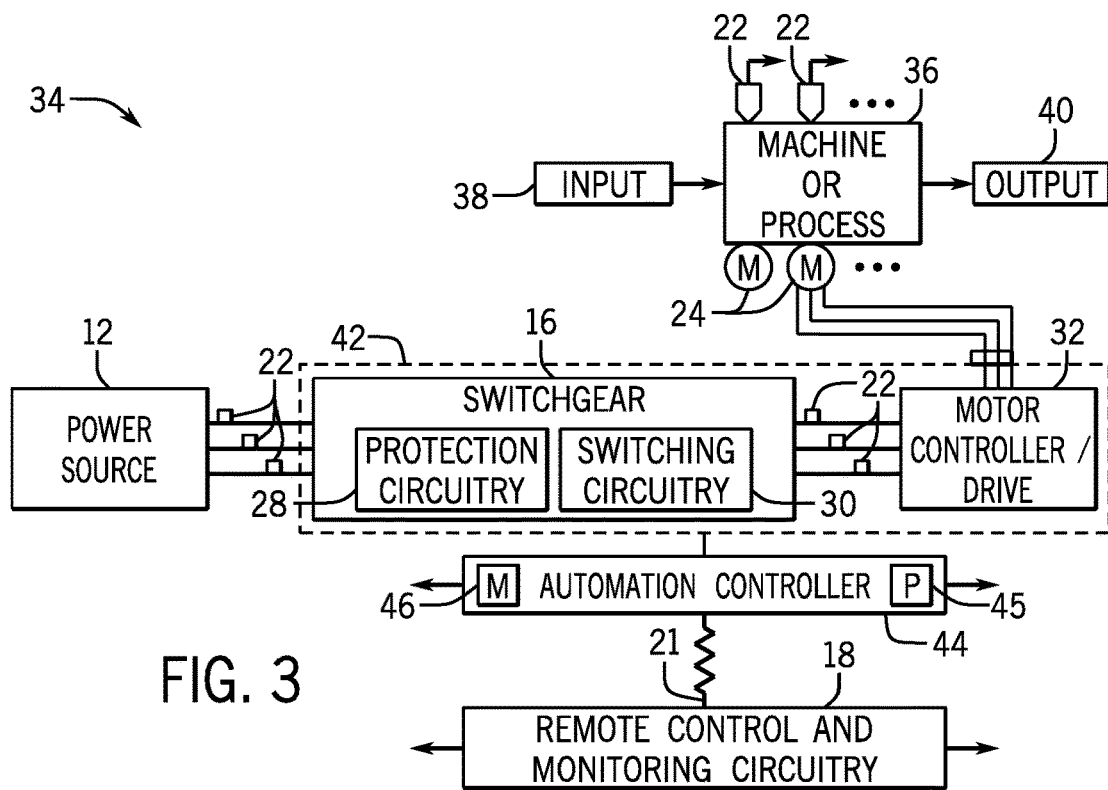
FIG. 3 is a similar diagrammatical representation of a set of switching devices to provide power to an electrical motor, in accordance with an embodiment.

As described above, the switchgear 16 may connect and/or disconnect electric power from various types of loads 14, such as an electric motor 24 included in the motor system 26 depicted in FIG. 2. As depicted, the switchgear 16 may connect and/or disconnect the power source 12 from the electric motor 24, such as during startup and shut down. Additionally, as depicted, the switchgear 16 will typically include or function with protection circuitry 28 and the actual switching circuitry 30 that makes and breaks connections between the power source and the motor windings. More specifically, the protection circuitry 28 may include fuses and/or circuit breakers, and the switching circuitry 30 will typically include relays, contactors, and/or solid-state switches (e.g., SCRs, MOSFETs, IGBTs, and/or GTOs), such as within specific types of assembled equipment (e.g., motor starters).

More specifically, the switching devices included in the protection circuitry 28 may disconnect the power source 12 from the electric motor 24 when an overload, a short circuit condition, or any other unwanted condition is detected. Such control may be based on the un-instructed operation of the device (e.g., due to heating, detection of excessive current, and/or internal fault), or the control and monitoring circuitry 18 may instruct the switching devices (e.g., contactors or relays) included in the switching circuitry 30 to open or close. For example, the switching circuitry 30 may include one (e.g., a three-phase contactor) or more contactors (e.g., three or more single-pole, single current-carrying path switching devices).

Accordingly, to start the electric motor 24, the control and monitoring circuitry 18 may instruct the one or more contactors in the switching circuitry 30 to close individually, together, or in a sequential manner. On the other hand, to stop the electric motor 24, the control and monitoring circuitry 18 may instruct the one or more contactors in the switching circuitry 30 to open individually, together, or in a sequential manner. When the one or more contactors are closed, electric power from the power source 12 is connected to the electric motor 24 or adjusted and, when the one or more contactors are open, the electric power is removed from the electric motor 24 or adjusted. Other circuits in the system may provide controlled waveforms that regulate operation of the motor (e.g., motor drives, automation controllers, etc.), such as based upon movement of articles or manufacture, pressures, temperatures, and so forth. Such control may be based on varying the frequency of power waveforms to produce a controlled speed of the motor.

In some embodiments, the control and monitoring circuitry 18 may determine when to open or close the one or more contactors based at least in part on the characteristics of the electric power (e.g., voltage, current, or frequency) measured by the sensors 22. Additionally, the control and monitoring circuitry 18 may receive an instruction to open or close the one or more contactors in the switching circuitry 30 from another part of the motor system 26, for example, via the network 21.

In addition to using the switchgear 16 to connect or disconnect electric power directly from the electric motor 24, the switchgear 16 may connect or disconnect electric power from a motor controller/drive 32 included in a machine or process system 34. More specifically, the system 34 includes a machine or process 36 that receives an input 38 and produces an output 40.

To facilitate producing the output 40, the machine or process 36 may include various actuators (e.g., electric motors 24) and sensors 22. As depicted, one of the electric motors 24 is controlled by the motor controller/drive 32. More specifically, the motor controller/drive 32 may control the velocity (e.g., linear and/or rotational), torque, and/or position of the electric motor 24. Accordingly, as used herein, the motor controller/drive 32 may include a motor starter (e.g., a wye-delta starter), a soft starter, a motor drive (e.g., a frequency converter), a motor controller, or any other desired motor powering device. Additionally, since the switchgear 16 may selectively connect or disconnect electric power from the motor controller/drive 32, the switchgear 16 may indirectly connect or disconnect electric power from the electric motor 24.

As used herein, the "switchgear/control circuitry" 42 is used to generally refer to the switchgear 16 and the motor controller/drive 32. As depicted, the switchgear/control circuitry 42 is communicatively coupled to a controller 44 (e.g., an automation controller. More specifically, the controller 44 may be a programmable logic controller (PLC) that locally (or remotely) controls operation of the switchgear/control circuitry 42. For example, the controller 44 may instruct the motor controller/driver 32 regarding a desired velocity of the electric motor 24. Additionally, the controller 44 may instruct the switchgear 16 to connect or disconnect electric power. Accordingly, the controller 44 may include one or more processor 45 and memory 46. More specifically, the memory 46 may be a tangible non-transitory computer-readable medium on which instructions are stored. As will be described in more detail below, the computer-readable instructions may be configured to perform various processes described when executed by the one or more processor 45. In some embodiments, the controller 44 may also be included within the switchgear/control circuitry 42.

Furthermore, the controller 44 may be coupled to other parts of the machine or process system 34 via the network 21. For example, as depicted, the controller 44 is coupled to the remote control and monitoring circuitry 18 via the network 21. More specifically, the automation controller 44 may receive instructions from the remote control and monitoring circuitry 18 regarding control of the switchgear/control circuitry 42. Additionally, the controller 44 may send measurements or diagnostic information, such as the status of the electric motor 24, to the remote control and monitoring circuitry 18. In other words, the remote control and monitoring circuitry 18 may enable a user to control and monitor the machine or process 36 from a remote location.

Moreover, sensors 22 may be included throughout the machine or process system 34. More specifically, as depicted, sensors 22 may monitor electric power supplied to the switchgear 16, electric power supplied to the motor controller/drive 32, and electric power supplied to the electric motor 24. Additionally, as depicted, sensors 22 may be included to monitor the machine or process 36. For example, in a manufacturing process, sensors 22 may be included to measure speeds, torques, flow rates, pressures, the presence of items and components, or any other parameters relevant to the controlled process or machine.

As described above, the sensors 22 may feedback information gathered regarding the switchgear/control circuitry 42, the motor 24, and/or the machine or process 36 to the control and monitoring circuitry 18 in a feedback loop. More specifically, the sensors 22 may provide the gathered information to the automation controller 44 and the automation controller 44 may relay the information to the remote control and monitoring circuitry 18. Additionally, the sensors 22 may provide the gathered information directly to the remote control and monitoring circuitry 18, for example via the network 21.

To facilitate operation of the machine or process 36, the electric motor 24 converts electric power to provide mechanical power. To help illustrate, an electric motor 24 may provide mechanical power to various devices, as described below. For example, the electric motor 24 may provide mechanical power to a fan, a conveyer belt, a pump, a chiller system, and various other types of loads that may benefit from the advances proposed.

Point-on-Wave (POW) Switching

As discussed in the above examples, the switchgear/control circuitry 42 may control operation of a load 14 (e.g., electric motor 24) by controlling electric power supplied to the load 14. For example, switching devices (e.g., contactors) in the switchgear/control circuitry 42 may be closed to supply electric power to the load 14 and opened to disconnect electric power from the load 14. However, as discussed above, opening (e.g., breaking) and closing (e.g., making) the switching devices may discharge electric power in the form of electric arcing, cause current oscillations to be supplied to the load 14, and/or cause the load 14 to produce torque oscillations.

Accordingly, some embodiments of the present disclosure provide techniques for breaking a switching device in coordination with a specific point on an electric power waveform. For example, to reduce magnitude and/or likelihood of arcing, the switching device may open based on a current zero-crossing or any other desired point on of an analog wave signal conducting through the respective switching device. As used herein, a "current zero-crossing" is intended to describe when the current conducted by the switching device is zero. Accordingly, by breaking exactly at a current zero-crossing, the likelihood of generating an arc is minimal since the conducted current is zero.

Although some embodiments describe breaking a switching device based on a current zero-crossing or making the switching device based on a predicted current zero-crossing, it should be understood that the switching devices may be controlled to open and close at any desired point on the waveform using the disclosed techniques. To facilitate opening and/or closing at a desired point on the waveform, one or more switching devices may be independently controlled to selectively connect and disconnect a phase of electric power to the load 14. In some embodiments, the one or more switching devices may be a multi-pole, multi-current carrying path switching device that controls connection of each phase with a separate pole. More specifically, the multi-pole, multi-current carrying path switching device may control each phase of electric power by movement of a common assembly under the influence of a single operator (e.g., an electromagnetic operator). Thus, in some embodiments, to facilitate independent control, each pole may be connected to the common assembly in an offset manner, thereby enabling movement of the common assembly to affect one or more of the poles differently.

In other embodiments, the one or more switching devices may include multiple single pole switching devices. As used herein a "single pole switching device" is intended to differentiate from a multi-pole, multi current-carrying path switching device in that each phase is controlled by movement of a separate assembly under influence of a separate operator. In some embodiments, the single pole switching device may be a single pole, multi-current carrying path switching device (e.g., multiple current carrying paths controlled by movement of a single operator) or a single-pole, single current-carrying path switching device, which will be described in more detail below.

As described above, controlling the making (e.g., closing) of the one or more switching devices may facilitate reducing magnitude of in-rush current and/or current oscillations, which may strain the load 14, the power source 12, and/or other connected components. As such, the one or more switching devices may be controlled such that they make based at least in part on a predicted current zero-crossing (e.g., within a range slightly before to slightly after the predicted current zero crossing).

Single-pole, Single Current-Carrying Path Switching Device

Figure 4:
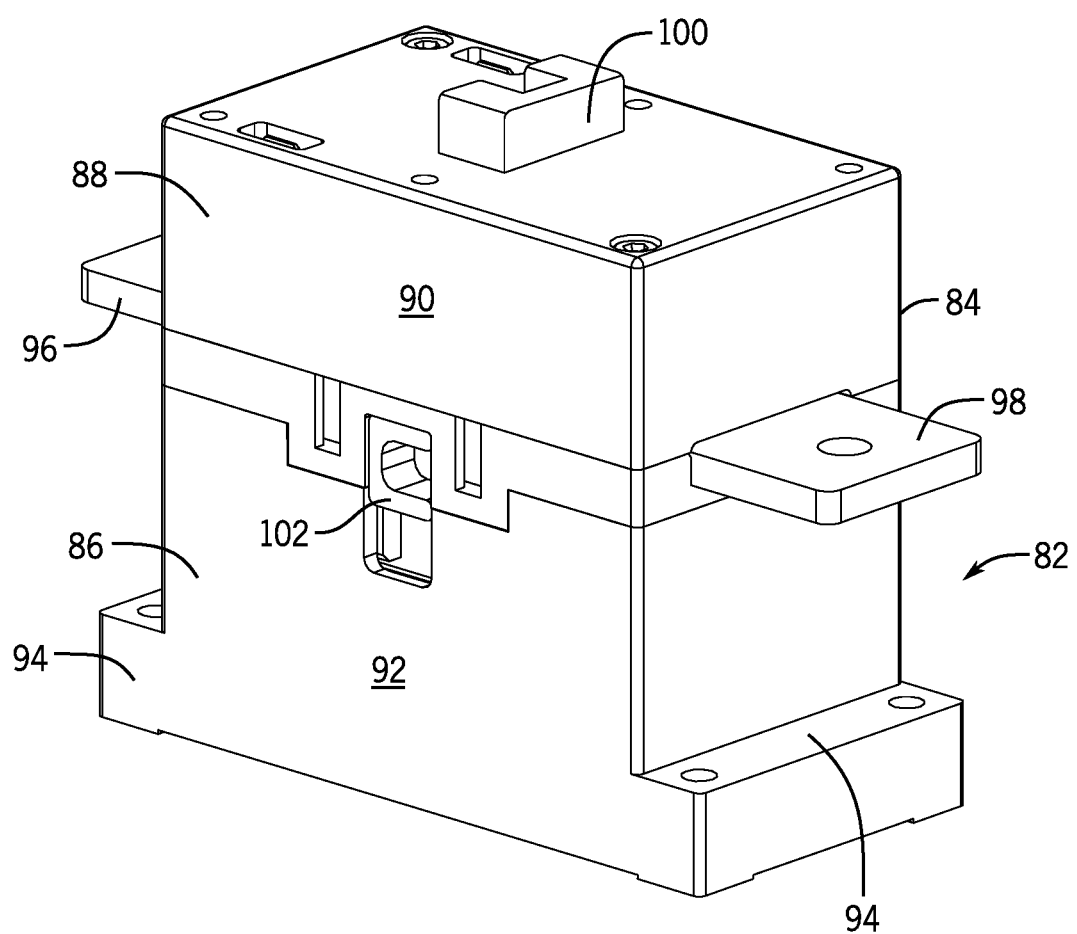
FIG. 4 is a perspective view of a single-pole, single current-carrying path switching device, in accordance with an embodiment.
Figure 5:
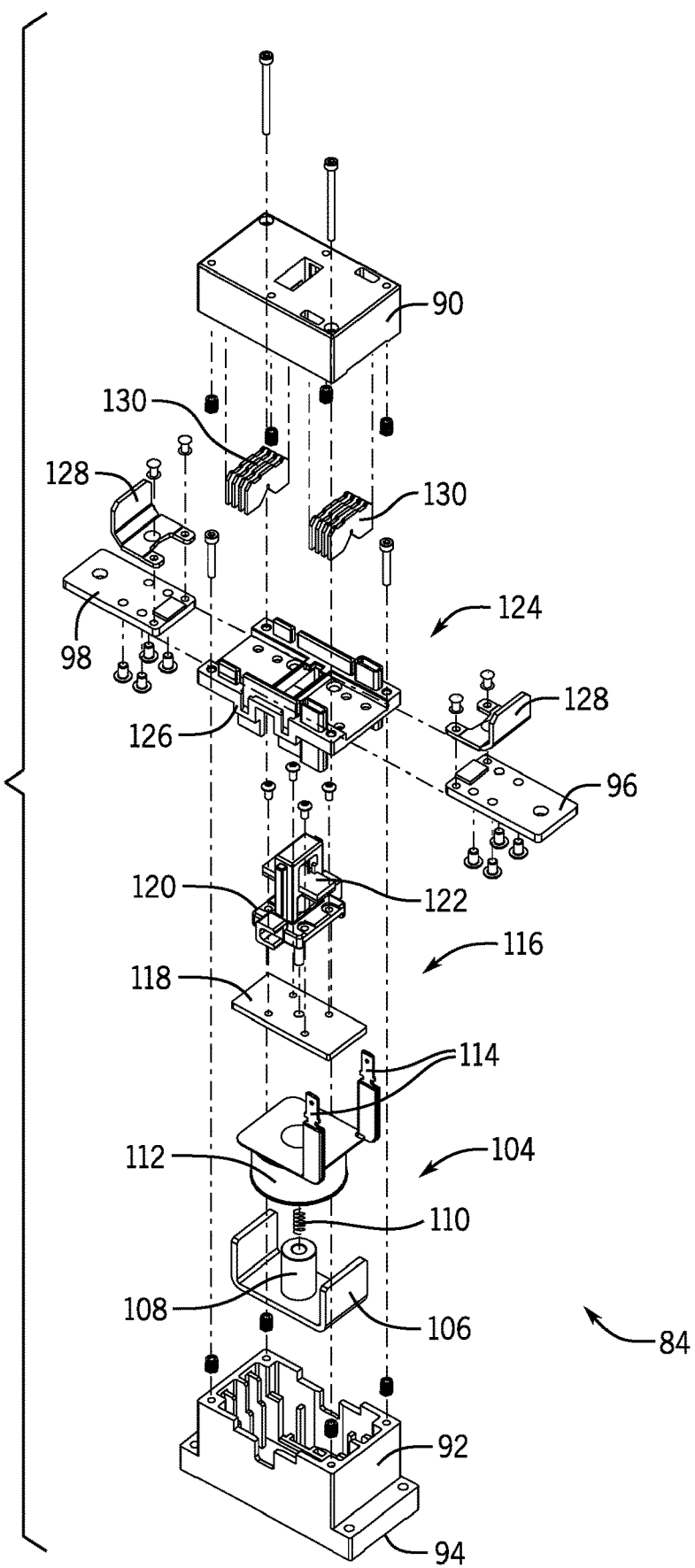
FIG. 5 is a perspective exploded view of the device of FIG. 4, in accordance with an embodiment.
Figure 6:
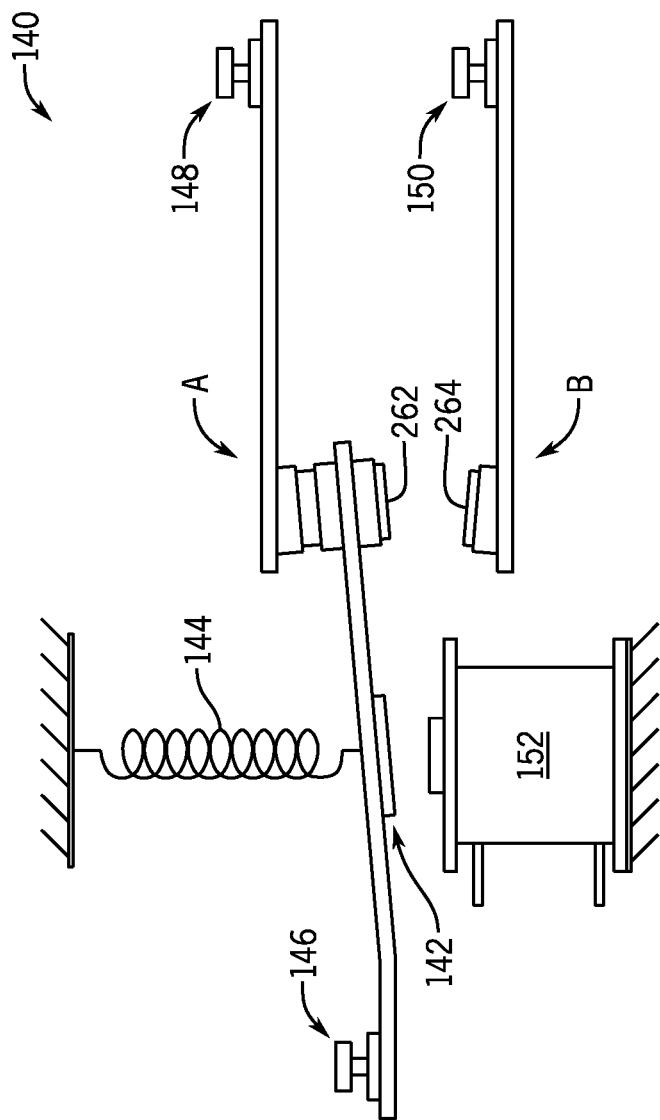
FIG. 6 is a system view of an example single-pole, single current-carrying path relay device, in accordance with an embodiment.

FIGS. 4-6 depict a presently contemplated arrangement for providing a single-pole, single current-carrying path switching device. The device may be used in single-phase applications, or very usefully in multi-phase (e.g., three-phase) circuits. It may be used alone or to form modular devices and assemblies such as for specific purposes as described below. Moreover, it may be designed for use in POW power application, and in such applications, synergies may be realized that allow for very compact and efficient designs due, as least in part, to the reduced operator demands, reduced arcing, and improved electromagnetic effects during the application of current through the device.

It should be noted that various embodiments of the single-pole switching devices may be used in single current-carrying path applications and also in multi current-carrying path applications. That is, references to single-pole switching devices throughout the disclosure may refer to single-pole, single current carrying path switching devices, single-pole, multiple current carrying path switching devices, or some combination thereof. In some embodiments, a single-pole, multiple current-carrying path switching device may allow for the repurposing of certain devices as modular three-phase circuits. For example, a single-pole, multiple current-carrying path may refer to a switching device with three current-carrying paths that have been interconnected to provide a single phase of power. Additionally, in some embodiments, three single-pole, single current-carrying path switching devices may each be configured to provide a separate phase of power (e.g., three-phase) and can be independently and/or simultaneously controlled in various beneficial configurations, as described in detail below. It should be understood, that the single-pole switching devices may be modularly configured to provide any number of power phases.

FIG. 4 illustrates a switching device 82 designed for use in certain of the applications described in the present disclosure. In the embodiment illustrated, a switching device is a single-pole, single current-carrying path device in the form of a contactor 84. The contactor 84 generally includes an operator section 86 and a contact section 88. As described more fully below, the operator section includes components that enable energization and de-energization of the contactor to complete and interrupt a single current-carrying path through the device. The section 88 includes components that are stationary and other components that are moved by energization and de-energization of the operator section to complete and interrupt the single-carrying path. In the illustrated embodiment, the upper conductive section has an upper housing 90, while the operator section has a lower housing 92. The housings fit together to form a single unitary housing body. In the illustrated embodiment flanges 94 extend from the lower housing allowing the device to be mounted in operation. Other mounting arrangements may certainly be envisaged. A line-side conductor 96 extends from the device to enable connection to a source of power. A corresponding load-side conductor 98 extends from an opposite side to enable the device to be coupled to a load. In other embodiments, conductors may exit the housing 90 and 92 in other manners. In this illustrated embodiment the device also includes an upper or top-side auxiliary actuator 100 and a side mount auxiliary actuator 102.

FIG. 5 illustrates certain of the mechanical, electrical and operational components of the contactor in an exploded view. As shown, the operator section is mounted in the lower housing 92 and includes an operator designated generally by reference numeral 104 which itself is a collection of components including a magnetic core comprised of a yoke 106 and a central core section 108. A return spring 110 is mounted through the central core section 108 as described more fully below for biasing movable contacts towards an open position. An operator coil 112 is mounted around the core section 108 and between upturned portions of the yoke 106. As will be appreciated by those skilled in the art, the coil 112 will typically be mounted on a bobbin and is formed of multiple turns of magnet wire, such as copper. The operator includes leads 114, which in this embodiment extend upwardly to enable connection to the operator when the components are assembled in the device. As will also be appreciated by those skilled in the art, the core, including the yoke and central core section, along with the coil 112 form an electromagnet which, when energized, attracts one or more parts of the movable contact assembly described below, to shift the device between an open position and a closed position.

A movable contact assembly 116 similarly includes a number of components assembled as a sub-assembly over the operator. In the embodiment illustrated in FIG. 8, the movable assembly includes an armature 118 that is made of a metal or material that can be attracted by flux generated by energization of the operator. The armature is attached to a carrier 120 which typically is made of a non-conductive material, such as plastic or fiberglass, or any other suitable electrically insulating material. A conductor assembly 122 is mounted in the carrier and is moved upwardly and downwardly by movement of the carrier under the influence of electromagnetic flux that draws the armature downwardly, and, when the fluxes are removed, the entire assembly may be moved upwardly under the influence of the return spring 110 mentioned above.

The device further includes a stationary contact assembly 124. In the illustrated embodiment, this contact assembly is formed of multiple hardware components, including a mounting assembly 126 that is fitted between the lower housing 92 and the upper housing 90. This mounting assembly will typically be made of an electrically non-conductive material, and it includes various features for allowing the mounting of the line and load-side conductors 96 and 98.

In some embodiments, the switching device may include a relay device that is composed of components illustrated in FIG. 6, some of which correspond to the components of the switching device 82 described above. As shown in FIG. 6, relay device 140 may include an armature 142 that is coupled to a spring 144. The armature 142 may have a common contact 146 that may be coupled to a part of an electrical circuit. The armature 142 may electrically couple the common contact 146 to a contact 148 or to a contact 150 depending on a state (e.g., energized) of the relay device 140. For example, when a relay coil 152 of the relay device 140 is not energized or does not receive voltage from a driving circuit, the armature is positioned such that the common contact 146 and the contact 148 are electrically coupled to each other. When the relay coil 152 receives a driving voltage, the relay coil 152 magnetizes and attracts the armature to itself, thereby connecting the contact 150 to the common contact 146.

Relay Coil Drive Circuit Using High Voltage and Constant Current

Figure 7:
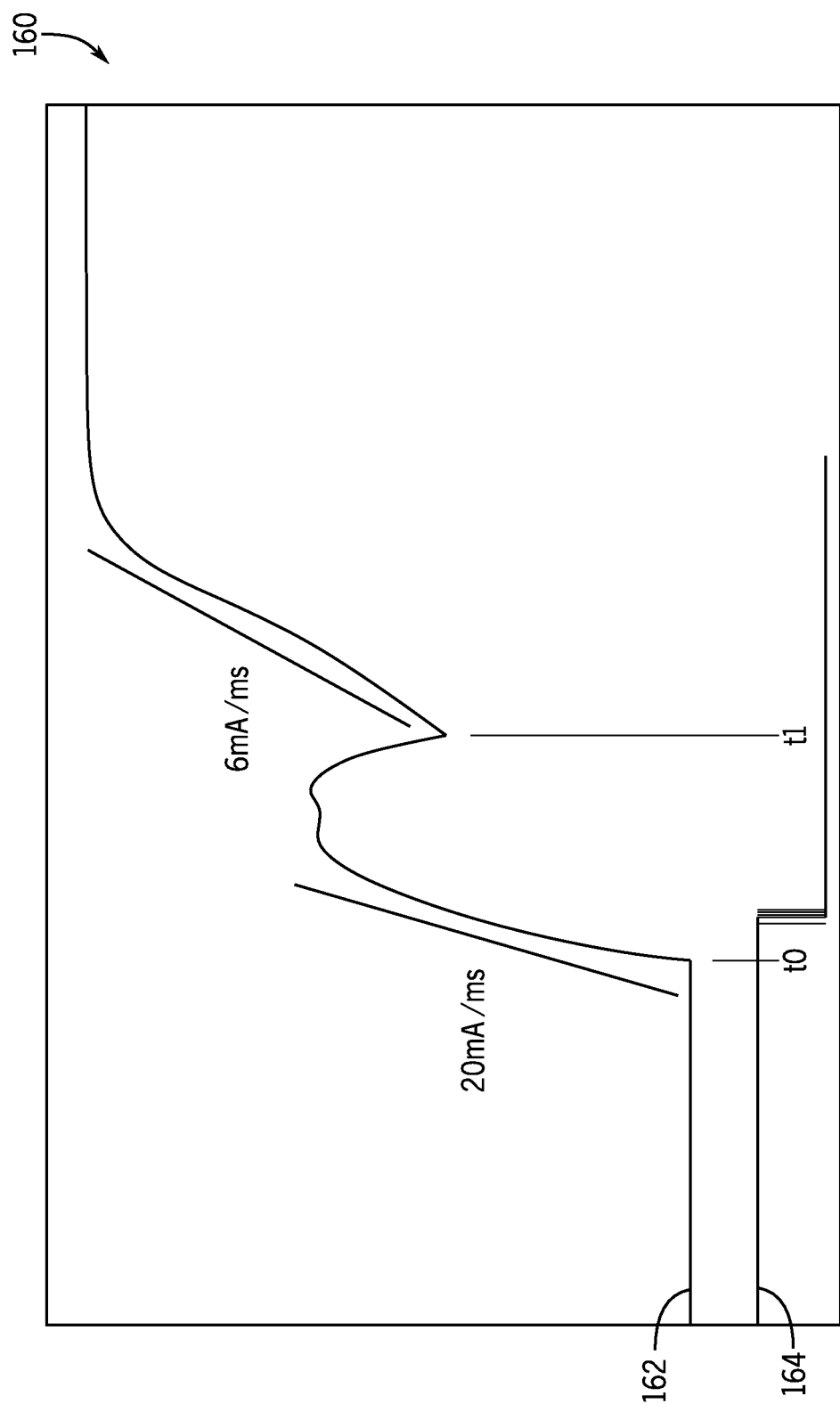
FIG. 7 is a current-time graph for a relay device operating using a nominal voltage, in accordance with an embodiment.

As mentioned above, the movement of the armature 142 causes a change in the inductance of the relay coil 152, thereby making the change in current within the relay coil 152 to move in a nonlinear fashion. For example, FIG. 7 depicts a current-time graph 160 that illustrates the change in current 162 within the relay coil 152 when a voltage is applied to the relay coil 152 at time t0 and after the armature 142 moves to close (e.g., curve 164) the relay device 140 at time t1. As shown in FIG. 7, the current through the relay coil 152 increase in a linear fashion at time t0 but loses its linear property just before the relay device 140 closes at time t0. This nonlinear property of the current conducting through the relay coil 152 is attributed to the movement of the armature 142 when the relay coil 152 magnetizes.

Figure 8:
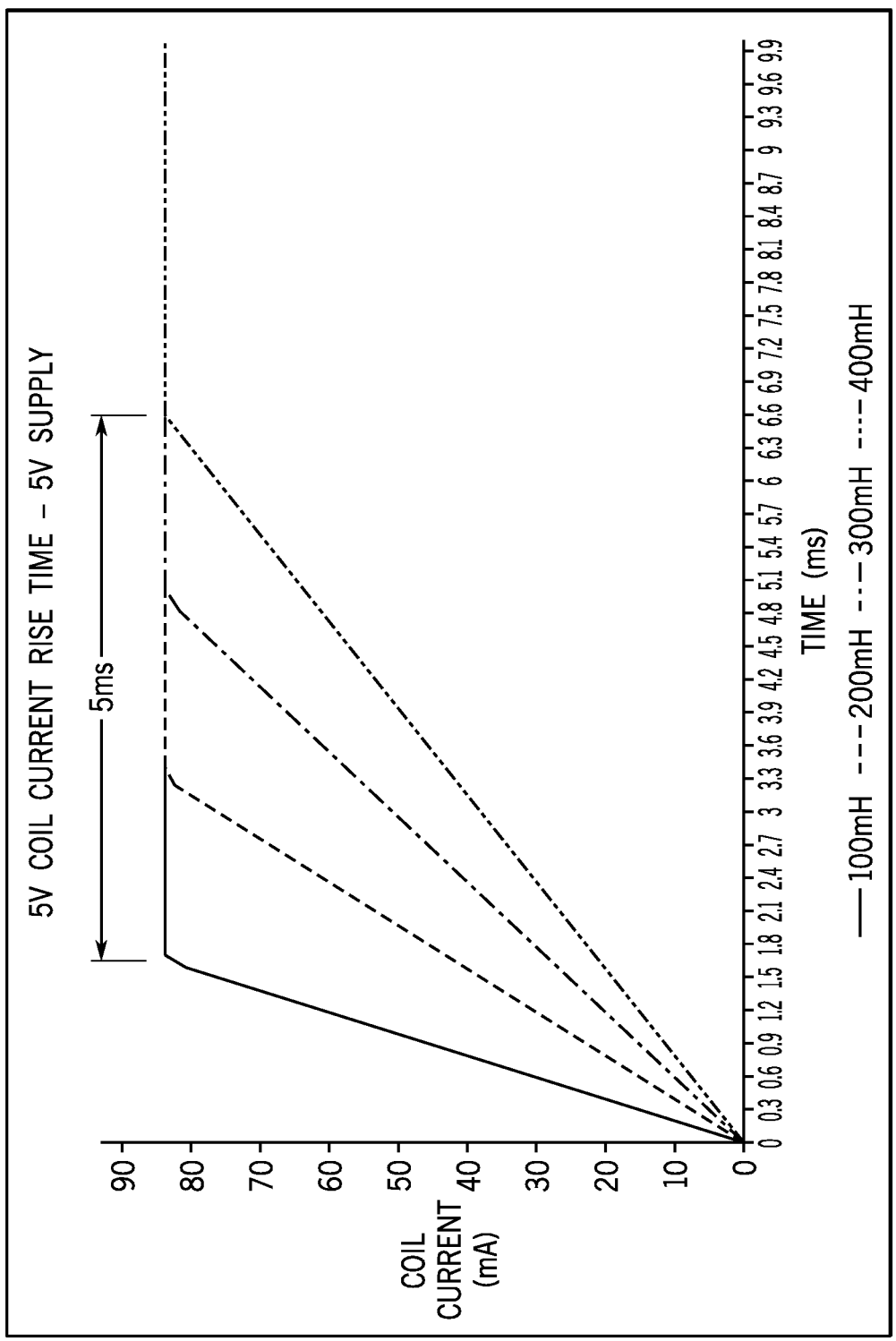
FIG. 8 is a current-time graph for various relay devices having various coil inductance operating with a voltage that corresponds to a rating of a respective coil in a respective relay device, in accordance with an embodiment.

Since the current follows a nonlinear curve that changes due to the inductance of the relay coil 152, the time in which various relay coils 152 having different inductances vary as well. For instance, FIG. 8 illustrates a current-time graph 170 that illustrates the differences in the amounts of times in which the relay coil 152 having different inductances may reach its driving current when provided with a rated voltage. The rated voltage may correspond to a rating associated with the relay coil 152. That is, the relay coil 152 may be rated for a particular voltage to ensure that the relay coil 152 operates effectively for a period of time and such that insulating features of the relay coil 152 are designed to withstand the rated voltage a number of times before becoming inoperable.

Figure 9:
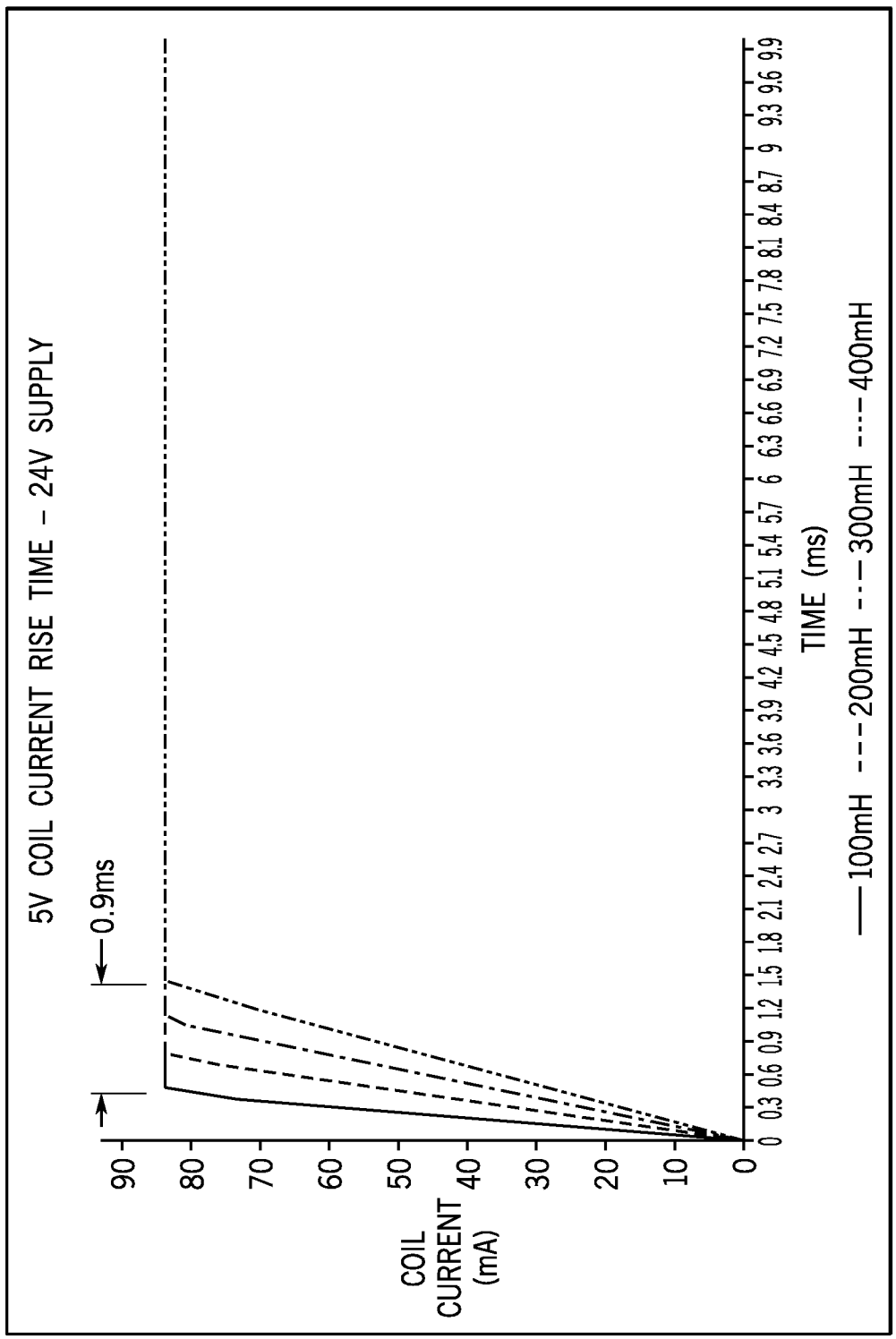
FIG. 9 is a current-time graph for various relay devices having various coil inductance operating with a voltage that is higher than a rating of a respective coil in a respective relay device, in accordance with an embodiment.

Although the relay coil 152 may be rated for a particular voltage or voltage range, in some embodiments, providing the relay coil 152 with a voltage that is higher than the rated voltage may reduce the discrepancies between the amounts of time in which the each of the various relay coils having various inductances reaches its driving current. For example, FIG. 9 illustrates a current-time graph 180 that illustrates the differences in the amounts of times in which the relay coil 152 having different inductances may reach its driving current when provided with a voltage that is higher than the voltage rated for the relay coil 152. As mentioned above, by providing a higher voltage to the relay coil 152, as compared to the rated voltage, the variability of the amount of time in which different relay coils 152 having different inductances may decrease. Indeed, as shown in the current-time graph 180, by providing a 24V supply to relay coils 152 having different inductances causes the time in which each relay coil 152 reaches its driving current to decrease, as compared to providing the 5V (e.g., relay coil rating) supply to the relay coils 152 depicted in FIG. 8.

In some embodiments, the voltage provided to the relay coil 152 may be between four and five times the rated voltage of the relay coil 152. That is, since the relay coil 152 is rated for a particular voltage or voltage range, providing a voltage supply that is higher than the voltage rating of the relay coil 152 may reduce the life of the relay coil 152 due to insulation breakdown and wear. However, by limiting the higher voltage supply to four and five times the rated voltage of the relay coil 152, the present embodiments may limit the effects of wearing down the relay coil 152. In any case, although the present embodiments are described herein as using a voltage source that provides four to five times the rated voltage of the relay coil 152 to the relay coil 152, it should be understood that the embodiments described herein should not be limited to voltage supplies that are four to five times the rated voltage of the relay coil 152. Instead, any suitable voltage supply may be used with the embodiments described herein.

Figure 10:
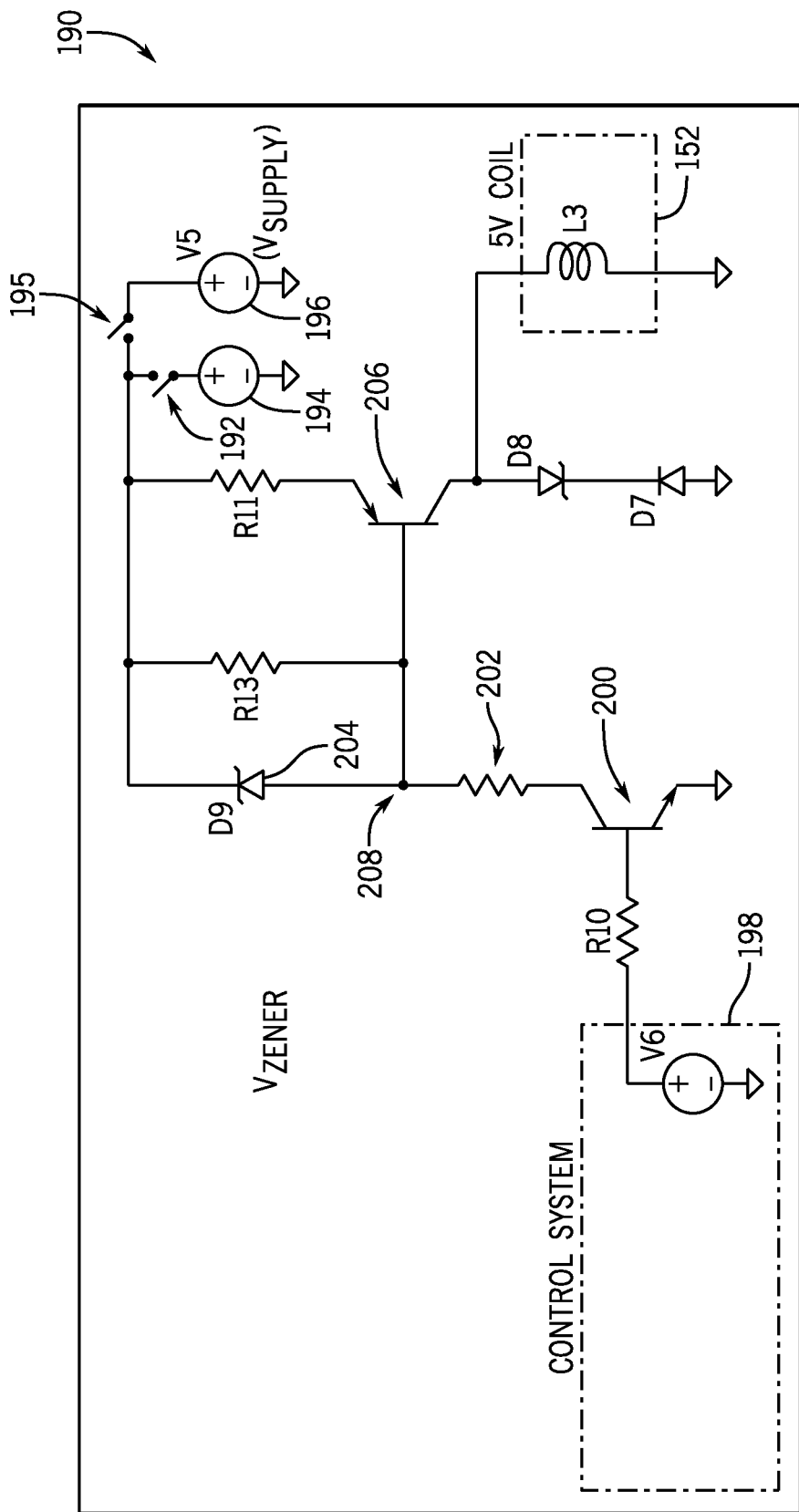
FIG. 10 is a circuit diagram for providing a constant current to a coil of a relay device, in accordance with an embodiment.

With this in mind, it should be noted that the relatively higher voltage supply provided to the relay coil 152 may be controlled in a manner that limits the exposure of the relay coil 152 to the higher voltage levels for a period of time that allows the relay coil 152 to reach its driving current. In some embodiments, two voltage sources may be used to energize the relay coil 152, such that the relay coil 152 may receive a relatively higher voltage for a short period of time to allow the relay coil 152 to reach its drive current. After the relay coil 152 is expected to reach its drive current, one of the voltage sources may be disconnected from the relay coil 152, while the other voltage source remains coupled to the relay coil 152 to provide a voltage that matches the voltage rating of the relay coil 15. For example, FIG. 10 illustrates an example circuit 190 that includes a switch 192 that couples a voltage source 194 when initially driving the relay coil 152. The voltage source 194 may output a voltage that is higher than the rating of the relay coil 152. After initially driving the relay coil 152, a switch 195 may be closed and the switch 192 may be opened to connect a voltage source 196 to the relay coil 152. The voltage source 196 may output a voltage that corresponds to the rating of the relay coil 152. In some embodiments, the voltage source 194 may provide the relay coil 152 with a voltage that corresponds to four to five times the rated voltage of the relay coil 152.

The switch 192 and the switch 195 may be controlled by a control system, controller, or the like. In some embodiments, the control system may: (1) close the switch 192 and open the switch 195 in response to a signal indicating that the relay coil 152 is being energized; and (2) open the switch 192 and close the switch 195 after the relay coil 152 is expected to reach its driving current. After the relay coil 152 is expected to reach its driving current, the switch 195 may open and the switch 192 may close, thereby allowing the voltage source 194 to keep the relay coil 152 energized. In this way, the relatively high voltage applied to the relay coil 152 may be provided for a limited amount of time to preserve the integrity and operability of the relay coil 152 over time.

In addition to coordinating the voltage applied to the relay coil 152, the circuit 190 may provide a constant current to the relay coil 152. Using a constant current source to energize the relay coil 152 may provide added benefits to the operation of the respective relay device. For example, providing a constant current to the relay coil 152 may provide for improved consistency in closing times and power efficiency, as compared to connecting a constant voltage source to the relay coil 152, over a spectrum of relay coils 152 having different inductances, armature positions, and the like. Additional details with regard to employing a constant current source to drive the relay coil 152 will be discussed below.

Referring back to the circuit 190 of FIG. 10, by way of operation, a control system 198 may provide a gate signal to a switching device 200 (e.g., transistor) to energize the relay coil 152. By providing the gate signal to the switching device 200, the switching device 200 may close and a current may be drawn through resistor 202 via the voltage source 196. In some embodiments, a Zener diode 204 may be coupled between the resistor 202 and the voltage source 196. The Zener diode 204 may be a semiconductor device that permits current to flow in a forward or reverse direction. In addition, the Zener diode 204 may clamp or limit the voltage provided to the resistor 202. When engaging the relay coil 152, the control system 198 may send a signal to the switch 192 to close at the same time (e.g., within microseconds) as a switching device 206 closes based on the gate signal provided via a node 208 between the resistor 202 and the Zener diode 204. As discussed above, by initially connecting the voltage source 194 and the voltage source 196 to the relay coil 152, the coil current may reach the drive current value within a faster amount of time, as compared to just connecting the voltage source 196. In some embodiments, after the amount of time that the relay coil 152 is expected to reach the drive current value, the control system 198 may send a command to the switch 192 causing the switch 192 to open, thereby connecting the relay coil 152 to just the voltage source 196. As mentioned above, the voltage source 196 may provide a voltage that matches the rated voltage of the relay coil 152. By disconnecting the additional voltage source 194 from the relay coil 152 after a limited amount of time, the present embodiments may preserve the life of the relay coil 152 while achieving a consistent close time.

Referring back to the Zener diode 204 of FIG. 10, in some embodiments, the Zener diode 204 may be selected or sized to match or offset temperature characteristics of the switching device 206. That is, the switching device 206 may have a base-to-emitter temperature coefficient that indicates how the properties (e.g., voltage) of the switching device 206 changes with respect to temperature. To prevent temperature from influencing the operation of the relay coil 152, the Zener diode 204 may be selected to have temperature properties that offset those of the switching device 206. For example, the switching device 206 may have a base-to-emitter temperature coefficient that indicates that the base-to-emitter voltage changes −1.3 mV for each degree Celsius. As such, the Zener diode 204 may be selected to have a voltage that changes +1.3 mV for each degree Celsius to offset the effects due to the switching device 206.

It should be noted that the control system 198 may include any suitable computing system, controller, or the like. As such, the control system 198 may include a communication component, a processor, a memory, a storage, input/output (I/O) ports, a display, and the like. The communication component may be a wireless or wired communication component that may facilitate communication between different components within the industrial automation system, the relay device 140, or the like.

The processor may be any type of computer processor or microprocessor capable of executing computer-executable code. The processor may also include multiple processors that may perform the operations described below. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal.

The I/O ports may be interfaces that may couple to other peripheral components such as input devices (e.g., keyboard, mouse), sensors, input/output (I/O) modules, and the like. The display may operate to depict visualizations associated with software or executable code being processed by the processor. In one embodiment, the display may be a touch display capable of receiving inputs from a user. The display may be any suitable type of display, such as a liquid crystal display (LCD), plasma display, or an organic light emitting diode (OLED) display, for example. Additionally, in one embodiment, the display may be provided in conjunction with a touch-sensitive mechanism (e.g., a touch screen) that may function as part of a control interface. It should be noted that the components described above with regard to the control system 198 are exemplary components and the control system 198 may include additional or fewer components as shown.

Referring back to FIG. 10, it should be appreciated that the circuit 190 described above may be employed in a number of ways. That is, in one embodiment, the relay coil 152 may be provided with a constant current using a high voltage source (e.g., voltage source 194 and voltage source 196). Alternatively, the relay coil 152 may be provided with a constant current using a voltage source (e.g., voltage source 196) that corresponds to the rating of the relay coil 152. In either case, using a constant current source to drive the relay coil 152 may provide a number of benefits as will be detailed below.

Figure 11:
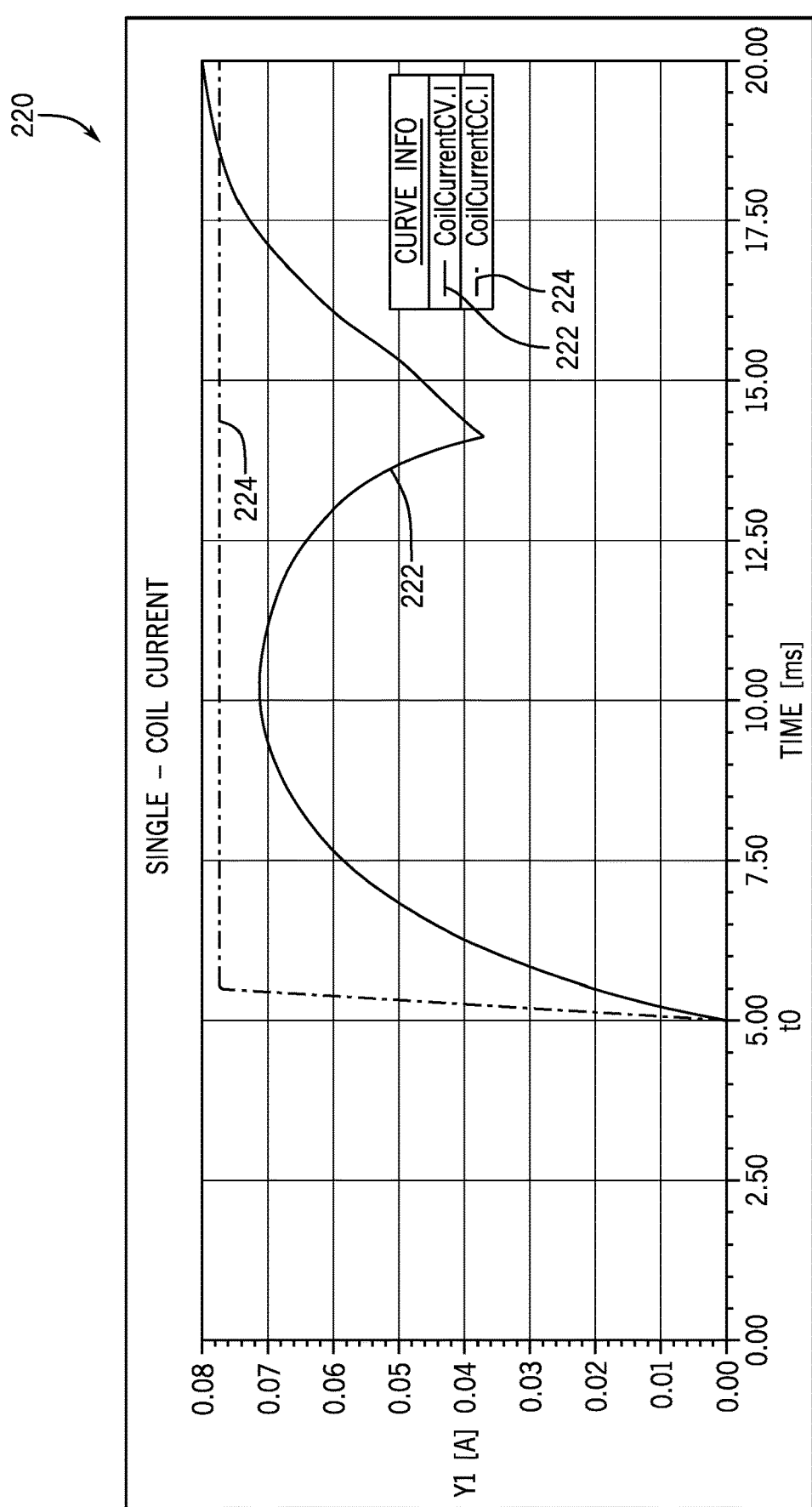
FIG. 11 is a current-time graph that depicts the coil current in two coils of two relays that are driven by a constant current source and a constant voltage source, respectively, in accordance with an embodiment.

For example, FIG. 11 illustrates a current-time graph 220 that depicts how the current within the relay coil 152 may change over time when the relay coil 152 is driven at time t0 using a constant voltage (e.g., curve 222) and using a constant current (e.g., curve 224). As shown in FIG. 11, at time t0, the current within the relay coil 152 reaches a steady state value within ~0.5 ms when the relay coil 152 is driven using the constant current (e.g., curve 224). Moreover, the current in the relay coil 152 changes in a nonlinear fashion when the relay coil 152 is driven using the constant voltage (e.g., curve 222). The nonlinear nature of the current in the relay coil 152 may cause the relay coil 152 to energize at inconsistent times, thereby causing the respective relay device to close inconsistently across a variety of inductances and armature positions.

Figure 12:
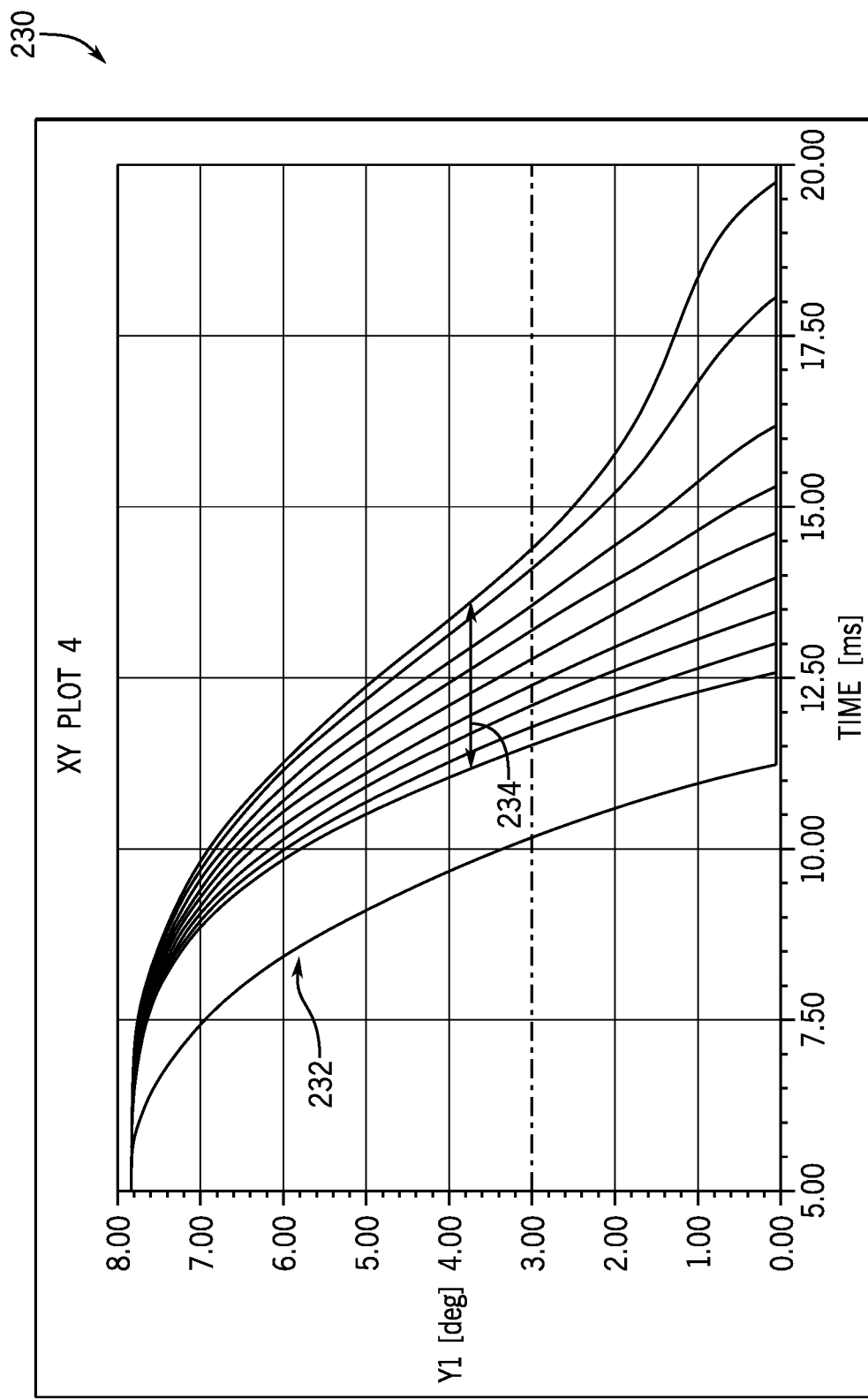
FIG. 12 is a position-time graph that depicts armature positions over time with respect to various coil resistances for various relay devices, in accordance with an embodiment.

In addition to reaching the driving current within the relay coil 152 according to a linear function, using the constant current source to drive the relay coil 152 may also enable the relay device to have a consistent movement profile for the armature 142 over a variety of coil resistances. For example, FIG. 12 illustrates a position-time graph 230 that depicts how the position of the armature 142 may change over time when the relay coil 152 is driven with a constant current source versus a constant voltage source. Referring to FIG. 12, curve 232 corresponds to the movement profile of the armature 142 over time when the relay coil 152 is driven with a constant current source for a variety of relay coils 152 having a variety of resistances. That is, the curve 232 represents a number of movement profiles for a number of relay coils 152. One curve 232 is visible in the position-time graph 230 because the respective movement profile curve for each different relay coil 152 having a different resistance is overlaid on top of each other due to the similarities in the respective movement profiles. In contrast, the curves 232 correspond to movement profiles of the armature 142 over time when the relay coil 152 is driven with a constant voltage source for a variety of relay coils 152 having a variety of resistances. As depicted with the curves 234, the movement profile of the armature 142 varies significantly based on the various resistances of the relay coil 152 when the relay coil 152 is driven with a constant voltage source, as compared to a constant current source (e.g., curve 232).

Figure 13:
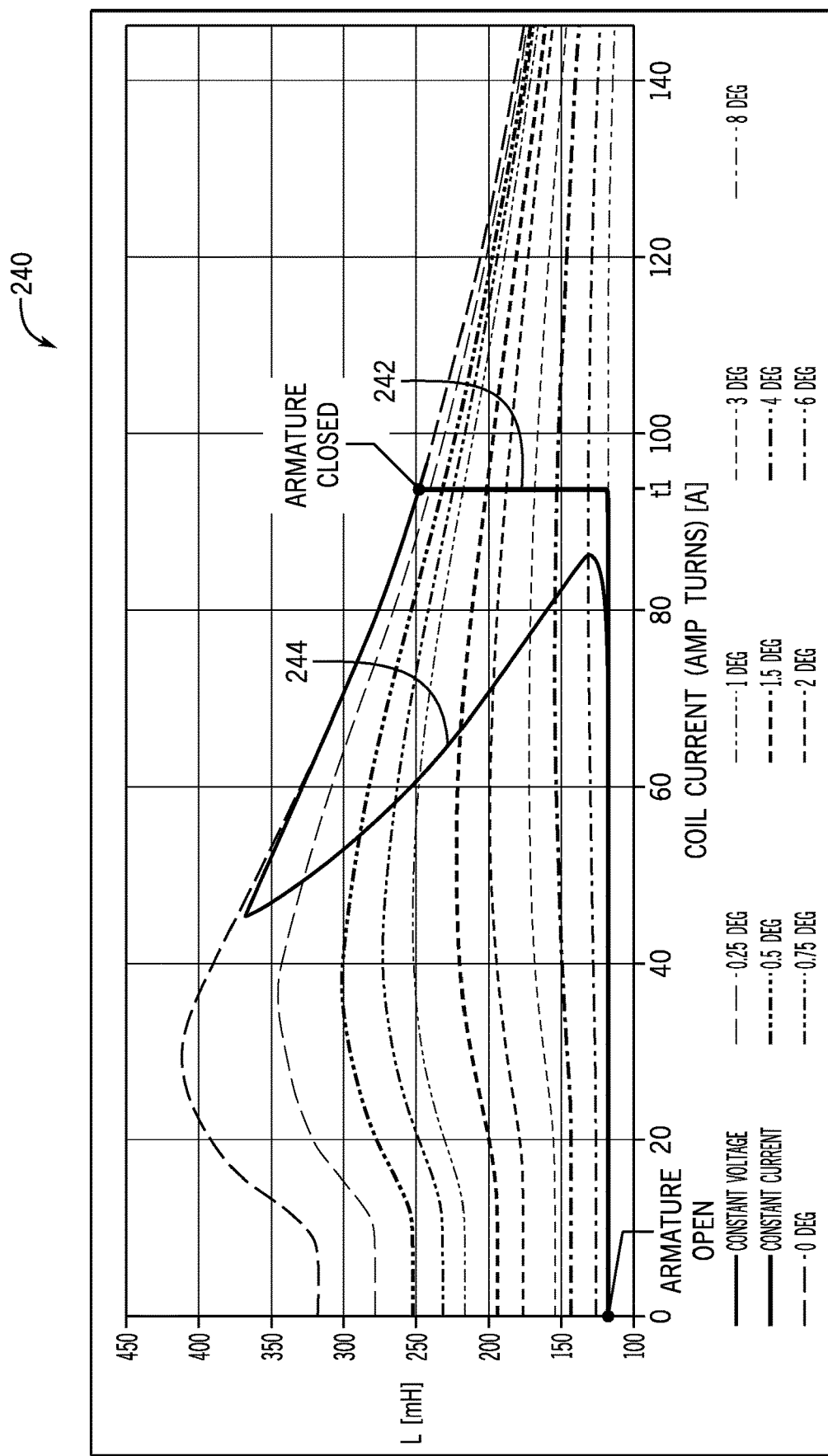
FIG. 13 is an inductance-current graph that depicts the coil currents in various relay devices having various armature positions that are driven by a constant current source and a constant voltage source, in accordance with an embodiment.

Driving the relay coil 152 using a constant current source may also enable the armature 142 to close more consistently across various inductances of the relay coil 152 when the relay coil 152 is driven with a similar current value. For instance, FIG. 13 illustrates an inductance-current graph 240 that indicates the coil current values that cause various relay coils 152 having various inductances to close when the relay coil 152 is driven with a constant current source versus a constant voltage source. Referring to FIG. 13, curve 242 traces when the relay coil 152 closes when driven with a constant current for a variety of relay coils 152 having a variety of inductance values. As shown in the graph 240, when the relay coil 152 is driven with the constant current source, the armature 142 closes at approximately the same time (e.g., t1). In contrast, the curve 244 traces the current values in the variety of relay coils 152 when the relay coils 152 close and when the relay coils 152 are driven with a constant voltage source. As made clear in the graph 240, the current values in the relay coil 152 that correspond to when the armature 142 closes vary greatly with respect to the inductance of the relay coil 152 when the relay coil 152 is driven with a constant voltage source, as compared to being driven with a constant current source.

Figure 14:
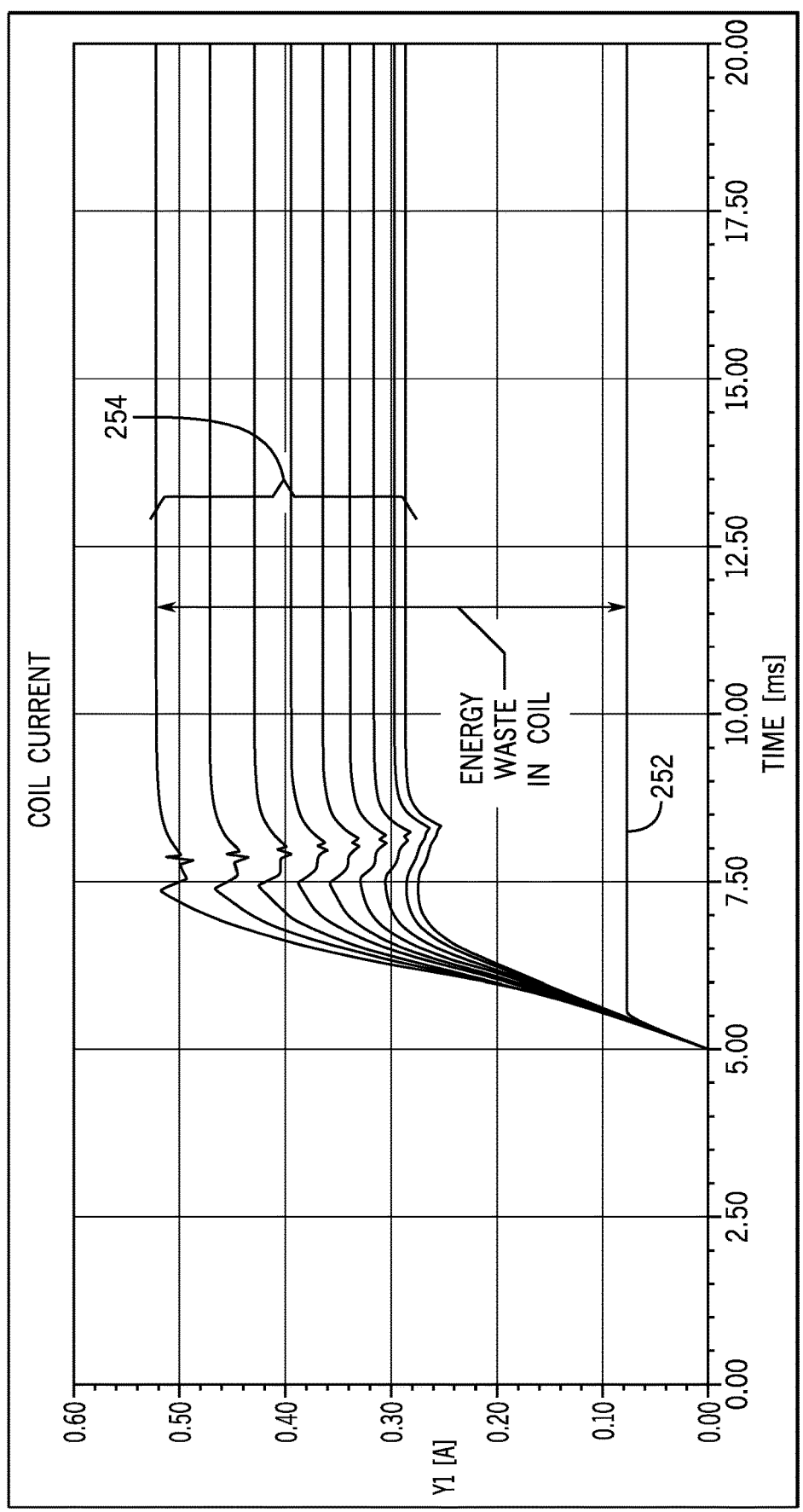
FIG. 14 is a current-time graph that depicts a relationship between the current of a number of coils in a number of relay devices having various coil resistances with respect to time when the respective coil is driven by a constant current source and a constant voltage source, in accordance with an embodiment.

The constant current source also enables the relay device to preserve more energy and operate the relay coil 152 more efficiently. FIG. 14 illustrates a current-time graph 250 that depicts the energy waste in the relay coil 152 when the relay coil 152 is driven with a constant current (e.g., curve 252) versus a constant voltage (e.g., curves 254). As shown in FIG. 14, the curve 252 remains consistent for a number of resistances of the relay coil 152, whereas the curves 254 varies as the resistances of the relay coil 152 varies. In addition, it is clear from the graph 250 that driving the relay coil 152 using the constant voltage source (e.g., curves 254) results in the relay coil 152 conducting more current as compared to when the relay coil 152 is driven with a constant current source (e.g., curve 252). The difference in the current between the two sources of power result in a certain amount of energy waste in the relay coil 152.

Figure 15:
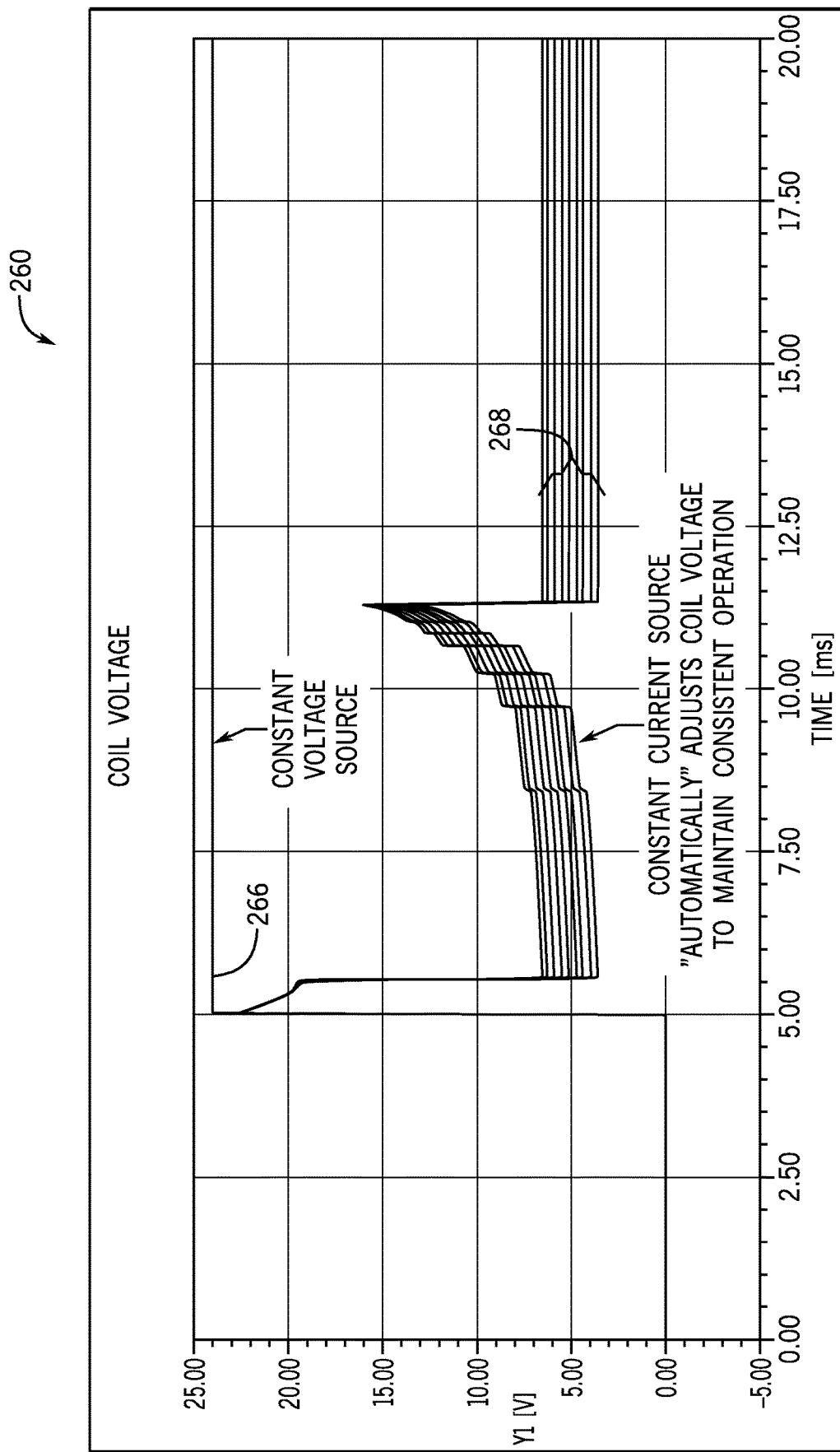
FIG. 15 illustrates a voltage-time graph that depicts a relationship between the voltage change in a relay coil when the relay coil is driven with a constant voltage source versus a constant current source, in accordance with an embodiment.

Indeed, the constant current source automatically adjusts the voltage of the relay coil 152 over time to maintain a consistent operation of the armature 142. To illustrate this, FIG. 15 illustrates a voltage-time graph 260 that depicts the voltage change in the relay coil 152 when the relay coil 152 is driven with a constant voltage source (e.g., curve 266) versus a constant current source (e.g., curves 268). As shown in FIG. 15, the curve 266 remains at a particular voltage level for a number of resistances of the relay coil 152, whereas the curves 268 detail how the constant current source automatically adjusts the voltage of the relay coil 152 across various resistances of the relay coil 152. In this way, the voltage of the relay coil 152 maintains consistent operation with the current source.

With the foregoing in mind, technical effects of the present embodiments include enabling POW switching to perform more consistently over various types of relay coils having various inductances, resistances, and the like. When switching devices are manufactured, a number of variables may cause the coil of a switching device to differ from other coils manufactured using the same process or in the same facility. To ensure that the switching device opens and closes according to a consistent and expected fashion, the coils may be driven using a constant current source. In some embodiments, the constant current source may be facilitated by a voltage source that outputs a voltage that is higher than the rated voltage of the respective coil. As a result, the switching devices may close at more consistent and predictable time intervals, while preserving energy and operating more efficiently.

Controlling Contact Bounce

In some embodiments, relay devices and contactor devices operate such that they are normally open or normally closed when the relay coil 152 is not energized. That is, normally open relay devices may include contacts or the armature 142 that is open or not electrically connecting two electrical nodes when relay coil 152 is not energized. In the same manner, normally closed relay devices may include contacts or the armature 142 that is open when the relay coil 152 is not energized. As such, when attempting to close or open during a respective POW close or POW open command, the respective relay device may have a number of variables, such as the magnetic properties in an air gap between the armature 142 and the relay coil 152 or between contacts of the contactor 84. That is, for example, when energizing a respective coil, a number of magnetic factors begin to affect the operation of the respective relay device or contactor. These magnetic factors may cause the respective device to act inconsistently, thereby reducing the accuracy of the POW switching. In addition, by energizing the respective coil to open or close the respective relay device or contactor under these variable conditions, the amount of times that the contacts close due to bouncing may increase, thereby resulting in a reduced life of the contacts. Indeed, since the coil has energy when the contactor closes or opens, the energy may dissipate across the relay and contacts, thereby increasing the wear on the relay.

Keeping this in mind, in some embodiments, POW switching may be employed to minimize the arc energy available across contacts when the respective device opens or closes. For example, if the contact is closed where the corresponding voltage signal is near its peak, the available arc energy may be relatively higher as compared to closing the contact when the voltage signal is near or approaching zero. Since the available arc energy is related to the amount of voltage and current available over time, the close timing can be coordinated to close when the available arc energy is expected to be the lowest. The arc energy is a significant factor is wearing out the contacts. That is, the arc energy is providing the high temperature event that wears down the material of the contact each time the contacts close or bounce against each other.

At times, coordinating the timing for a relay device or any other suitable switching device to open and close within a threshold amount of time with respect a zero-voltage crossing may not be practical. For instance, upon detection of a fault, a relay device may immediately open or close with regard to the voltage waveform present on the respective contacts. As a result, when the armature 142 moves and one contact moves to physically couple with another contact, the amount of available arc energy may not be minimized because the point on the voltage waveform in which the armature 142 moves may not be near the zero-crossing. In addition, depending on the number times that the contacts bounce against each other, additional opportunities for electrical arcing are present. Moreover, the number of bounces between the contacts under the various arcing conditions may be directly related to the wear on the contacts, and thus the relay device. Accordingly, to increase the life of the contacts and the relay device, the number of contact bounces between the contacts should be minimized.

Keeping this in mind, to reduce the number of contact bounces, in some embodiments, the speed in which the armature 142 of the relay device 140 (e.g., FIG. 6) moves may control the number of bounces that the contacts may occur during a close or open operation. That is, referring briefly again to FIG. 6, the speed in which the armature 142 moves from position A to position B may directly affect the number of times that contact 262 may bounce against contact 264. Since the contact 262 is electrically charged with some voltage, the bounces between the contact 262 and the contact 264 may result in electrical arcing that may wear down the conductive material (e.g., copper) that makes up the contact 262 and the contact 264.

Since the armature 142 controls the position of the contact 262 and the contact 264, it may be useful to reduce a speed of the armature 142 when it moves between positions A and B. That is, by reducing the speed in which the armature 142 moves between positions A and B, the kinetic energy dissipated through the bounces of the contacts 262 and 264 may be reduced, thereby reducing the total number of bounces that occur between the contacts 262 and 264.

Figure 16:
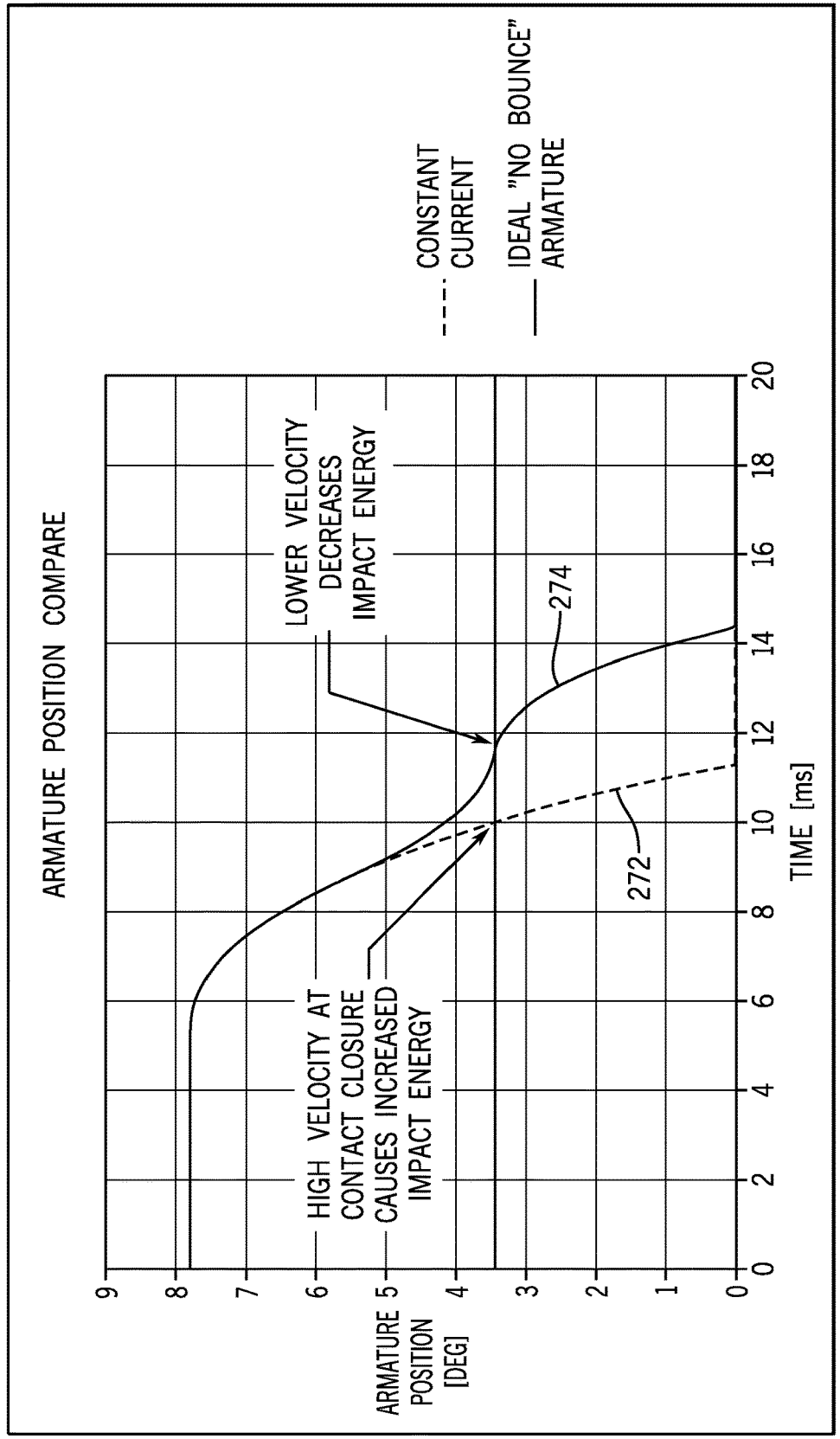
FIG. 16 illustrates an example position-time graph that depicts a position of the armature over time, in accordance with an embodiment.

FIG. 16 illustrates an example position-time graph 270 that depicts a position of the armature 142 over time when the armature 142 closes with a first velocity (e.g., curve 272), as compared to when the armature 142 closes with a second velocity slower than the first velocity (e.g., curve 274). The high velocity movement of the armature 142 characterized by the curve 272 causes a relatively high impact energy since kinetic energy (KE) is defined as a function of velocity (v) and mass (m), as shown in Equation 2 below.

$$KE = \tfrac{1}{2} m v^2 \qquad (2)$$

In contrast the impact energy available to the armature 142 that moves according to the curve 272, the armature 142 that moves in accordance to the curve 274 may have a smaller velocity and thus less impact energy available to contributed to contact bounce. To enable the armature 142 to reduce its speed during some operation (e.g., close), a control circuit may introduce or electrically couple an external inductance to the relay coil 152 at a time that is within some threshold period of time before the armature 142 moves between positions A and B. In some embodiments, the external inductance may be approximately one order of magnitude larger than the inductance of the relay coil 152 to overcome the momentum of the movement of the armature 142, such that the speed in which the armature 142 reduces within a threshold amount of time before the contacts 262 and 264 physically touch each other.

Figure 17:
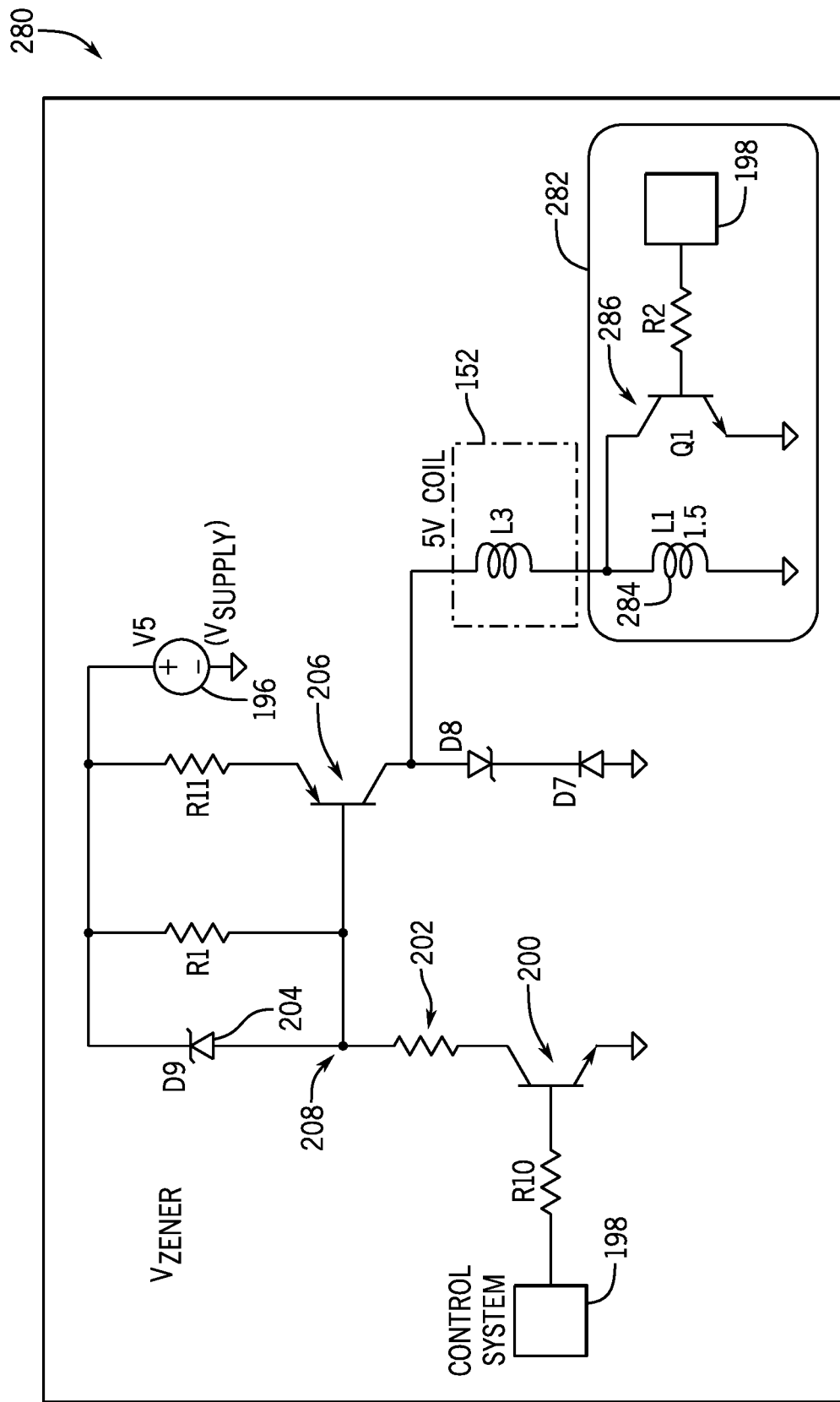
FIG. 17 illustrates an example circuit that may be employed to add external inductance to a relay coil, in accordance with the embodiments described herein.

FIG. 17 illustrates an example circuit 280 that may be employed to add external inductance to the relay coil 152 in accordance with the embodiments described herein. Referring to FIG. 17, the circuit 280 may be similar the circuit 190 described above with respect to FIG. 10. The circuit 280 includes additional circuitry 282 that inserts an additional inductor 284 in series with the relay coil 152 when the relay device 140 is opening or closing. The additional inductance may cause the armature 142 to reduce in speed, thereby reducing the amount of impact energy available to the contacts 262 and 264, such that the number of bounces between the contacts 262 and 264 are minimal.

By way of operation, the control system 198 may send a gate signal to a switching device 286 while the relay device 140 is in its normal operating condition (e.g., normally open, normally closed). That is, when the relay coil 152 is not energized, for example, the control system 198 may send a gate signal to the switching device 286 to cause the switching device 286 to close and couple the relay coil 152 to ground. After detecting that the relay coil 152 will be energized (e.g., in response to a signal/fault), the control system 198 may remove the gate signal provided to the switching device 286, thereby causing the switching device 286 to open. As such, the additional inductor 284 may be connected in series with the relay coil 152 to increase the effective inductance of the relay device 140 after the relay coil 152 is energized. As a result, the added inductance sharply decreases the coil current of the relay coil 152 when switched in, and then creates a second total inductance that should be re-energized. The sharp decrease in coil current momentarily decreases the armature force, as well as slows the rise time of the armature force, allowing for a soft close. In other words, the movement of the armature 142 decreases due to sharp decrease in the coil current, thereby causing the armature 142 to reduce its speed as shown in the curve 274 of FIG. 16.

With this in mind, depending on the size of the relay coil 152, it may be challenging to incorporate the additional inductor 284 into the relay device 140. That is, the additional inductor 284 may cause magnetic interference with other circuit components or the relay device 140 may not be large enough to physically include the additional inductor 284. As such, in some embodiments, the control system 198 may pulse a current to the relay coil 152 to achieve an optimal armature position profile that may reduce the speed of the movement of the armature 142. The pulsing current may enable the relay device 140 to reduce the speed in which the armature 142 operates without including the additional inductor 284 in the circuit 280. That is, an initial coil current that causes the armature 142 to move may be provided to the relay coil 152. In some embodiments, before the relay device 140 is expected to close, the control system 198 may remove the current provided to the relay coil 152, and the momentum of the armature 142 may decrease due to the loss of current to the relay coil 152. After the armature 142 moves to couple two contacts (e.g., contacts 262 and 264), the control system 198 may again provide the current to the relay coil 152.

Figure 18:
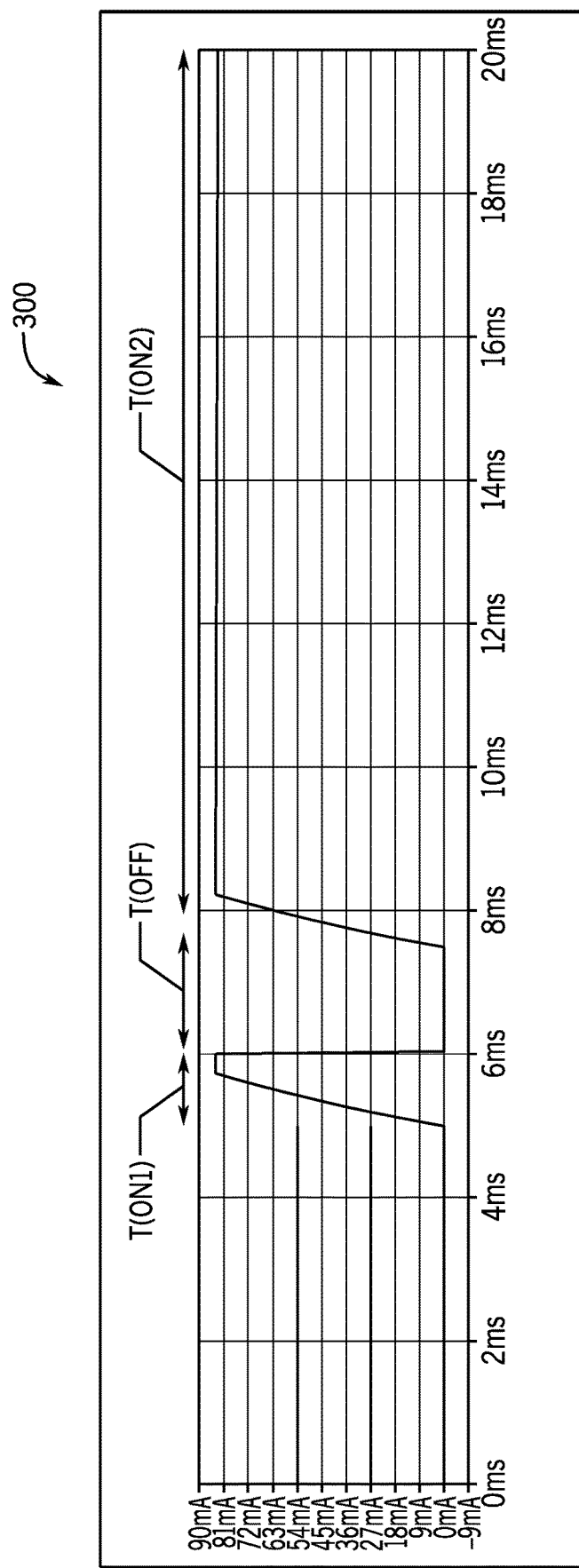
FIG. 18 illustrates a current-time graph that depicts a pulsed coil current being provided to a relay coil, in accordance with an embodiment.
Figure 19:
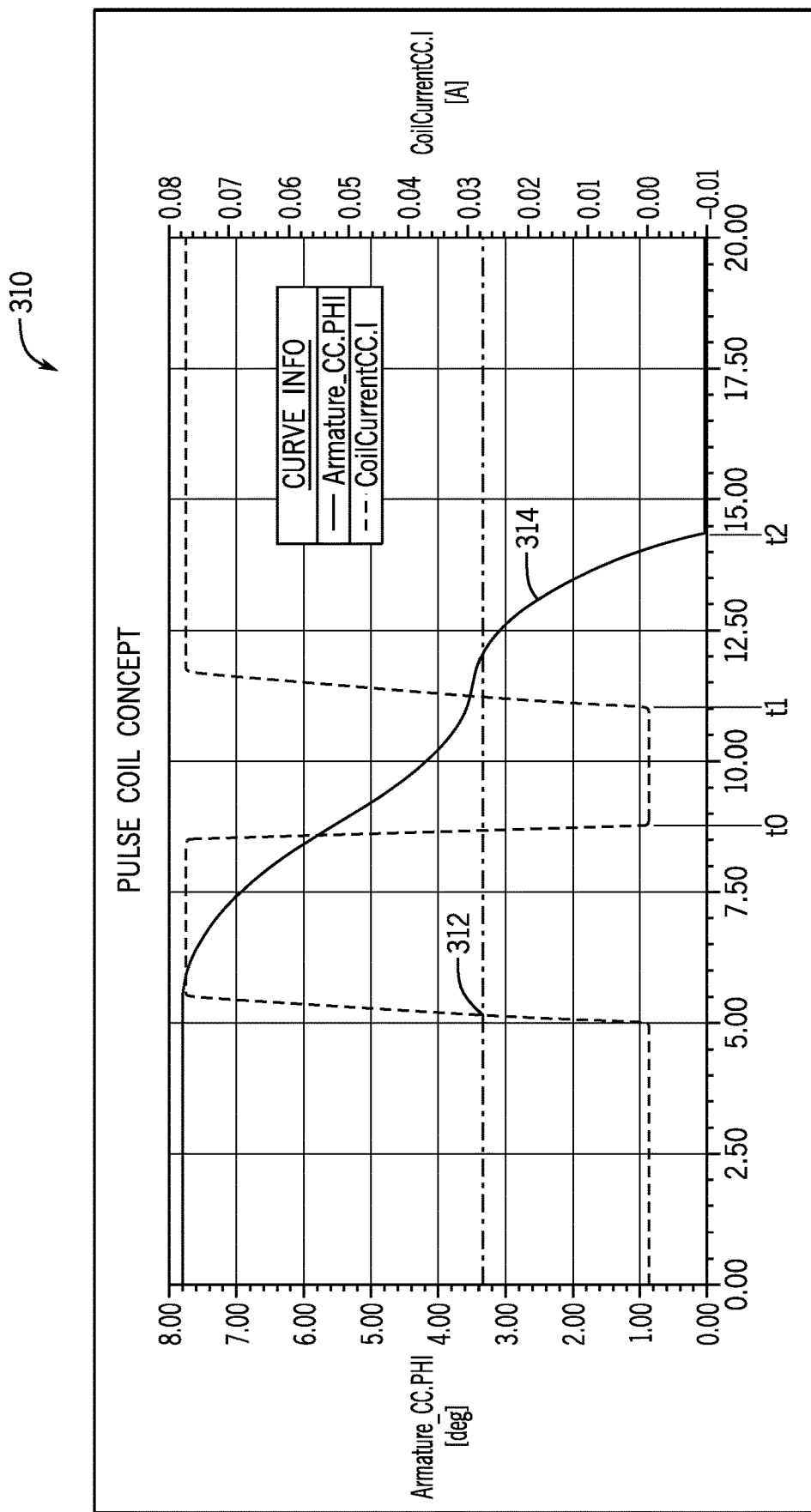
FIG. 19 illustrates a pulsed coil current graph that includes a coil current curve relative to an armature position curve, in accordance with an embodiment.

FIG. 18 illustrates a current-time graph 300 that depicts an embodiment in which a pulsed coil current is provided to the relay coil 152. As shown in FIG. 18, the current is provided to the relay coil 152 for a first duration of time (e.g., T(ON1)), the current is removed for a second duration of time (e.g., T(OFF)), and the current is returned for a third duration of time (e.g., T(ON2)). The third duration of time may correspond to keeping the relay coil 152 energized. FIG. 19 illustrates a pulsed coil current graph 310 that includes a coil curve 312 that represents a pulsed current provided to the relay coil 152. The pulsed coil current graph 310 also includes an armature position curve 314 that illustrates a movement profile of the armature 142 over time. As shown in FIG. 19, the slope of the armature position curve 314 is altered when the current is removed from the relay coil 152 at time T0. At time T1, the current is provided again to the relay coil 152, thereby causing the slope of the armature position curve 314 to increase again. However, since the slope of the armature position curve 314 decreased between times T0 and T1, the armature 142 slowly changes positions (e.g., from position A to B) until time T2. That is, the armature 142 is still moving slightly between times T0 and T1. The contacts change state after the armature position curve 314 crosses the horizontal line depicted in FIG. 19. As such, the armature 142 begins to slow down before the contacts change state until time T2 when the armature 142 is fully closed. In this way, the contacts close before the armature 142 closes (e.g., over travel). However, the kinetic energy associated with the movement of the armature 142 decreases between T0 and T1 to decrease impact energy when the contacts change state. As such, the speed of the armature 142 decreases before changing positions, thereby reducing the impact energy provided by the armature 142 when the contacts 262 and 264 physically touch each other.

Although the embodiments described above are detailed in accordance with an open loop system based on expected behavior or properties for various variables (e.g., armature speed), it should be noted that the operation of the various techniques described herein could be implemented in a closed-loop system with position measurement on the armature 142, current/voltage data (e.g., via sensors) to glean additional information, or the like. That is, different types of technology can be used to determine the positions of the armature 142, the contacts 262/264, or the like. In addition, the measured inductance of the relay coil 152 may be used to detect how fast the current changes with respect to voltage to determine characteristics of the position of the armature 142. The inductance of the relay coil 152 may also be used to provide some self-monitoring operations to detect a failure (e.g., a welded contact). In this way, the measurement would be made based on a voltage applied to the relay coil 152 and a measurement of the current on the relay coil 152 to determine the inductance, which may then be used to determine whether the contacts 262/264 or relay device 140 is operating correctly. If an error is detected, the control system 198 may annunciate an alarm, disable the relay device 140, or the like.

In some embodiments, the properties (e.g., speed, close time) of the armature 142 changes over time. To maintain the movement profile of the armature 142 to minimize the impact energy between the contacts 262 and 264, the control system 198 may monitor certain properties associated with the movement of the armature 142 as feedback to adjust the time in which a current pulse is applied, the additional inductor 284 is added to the relay coil 152, or the like. For example, the control system 198 may monitor the position of the armature 142 over time for each close operation, the voltage applied to the relay coil 152, the current applied to the relay coil 152, and other variables may be monitored via sensors (e.g., current sensor, voltage sensor) or other suitable monitoring equipment. Although the closed loop system is described herein is provided in the context of controlling a bounce of a contact, it should be noted that the closed loop system may be employed in any suitable aspect of opening and closing (e.g., timing, speed) of the POW switch.

As mentioned above, a constant current pulse may minimize or reduce the number of bounces between the contacts 262 and 264. It should also be noted that operating the relay device 140 using the current pulse described above does not change the bounce characteristics of the contacts 262 and 264 over different temperature ranges. As such, the pulsed coil embodiment may be agnostic to temperature changes within the relay device 140. It should again be noted that the various embodiments described herein may also be applied to contactors. That is, as more contactors use direct current (DC) coils, the systems and methods described herein may better manage the power consumption of the contactors and reduce the use of interposing relays in contactors.

Technical effects of the embodiments described herein controlling the velocity of the armature using constant current pulses and/or an additional external inductor. In some embodiments, the current pulses may be applied according a desired point on a voltage waveform present on a contactor of the armature. The desired point on wave should be near the zero crossing to minimize the area underneath the voltage waveform, thereby reducing the available arc energy. However, it should be noted that, in some embodiments, the relay device can switch at any point of the AC waveform with minimal arc energy (i.e., not just the zero cross of voltage).

De-Energize Relays for Point-on-Wave (POW) Close and Open Operations

Normally open relays include a contactor or a switch that is open when the coil of the relay is not energized. In the same manner, normally closed relays include contacts or a contactor or switch that is open when the coil of the relay is not energized. As such, when attempting to close or open during a respective POW close or POW open command, the respective relay is influenced by a number of variables, such as the magnetic properties between the contacts of the contactor within the air gap. Thus, when energizing the coil, a number of magnetic factors begin to affect the operation of the respective relay. These magnetic factors may cause the relay to act inconsistently, thereby reducing the accuracy of the POW switching. In addition, by energizing the relay's coil to open or close the respective switch, contact bounce may increase, resulting in a reduced life of the contacts. Indeed, since the coil has energy when the contactor closes or opens, the energy may dissipate across the relay and contacts, thereby increasing the wear on the relay.

Figure 20:
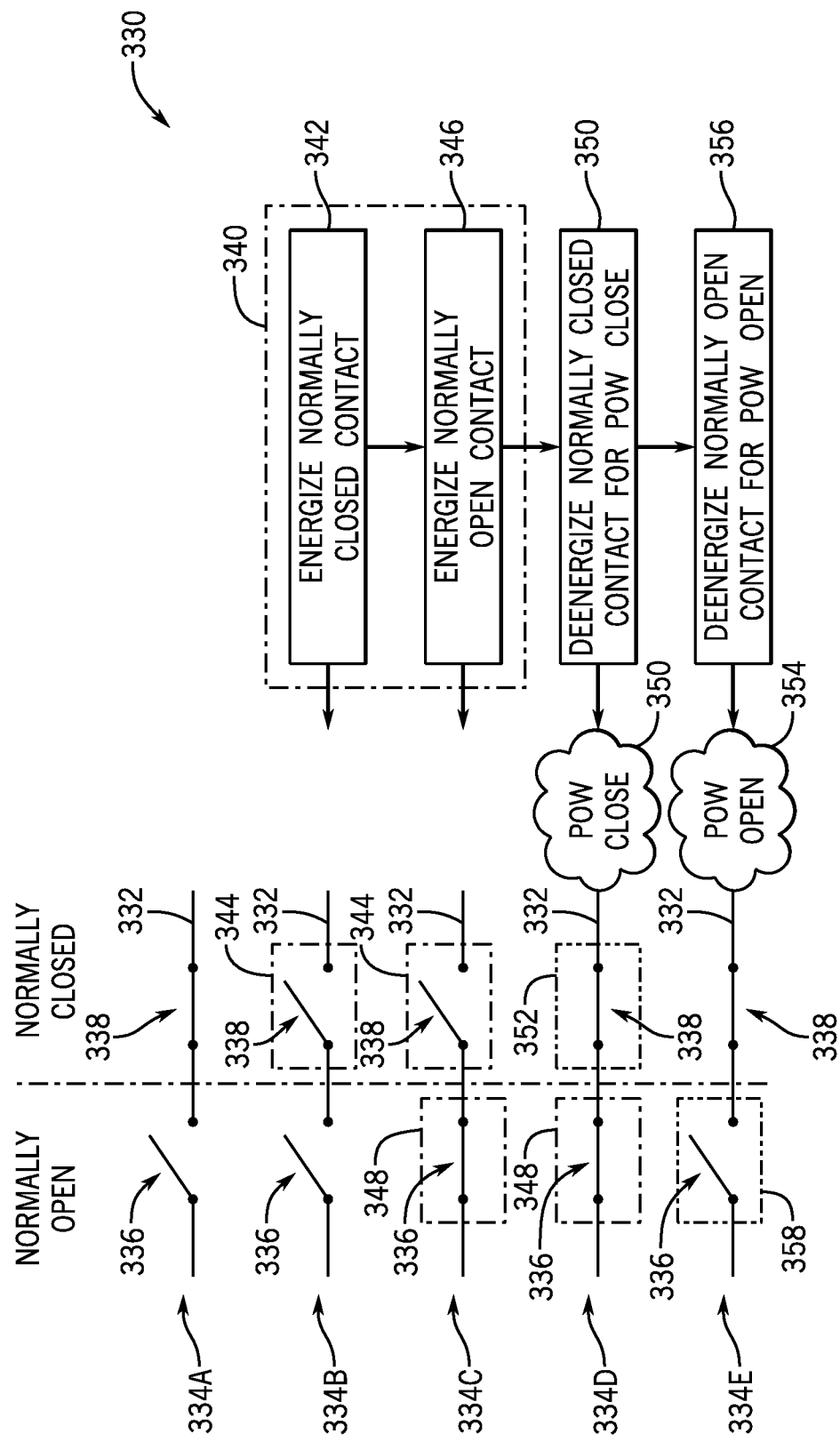
FIG. 20 illustrates a process implemented on specialized circuitry that may be employed to control POW close and open operations by de-energizing operations, in accordance with an embodiment.

With this in mind, the contacts and the relays may benefit from operating in a manner such that the POW close or open operation occurs by de-energizing a relay. FIG. 20 illustrates a process 330 implemented on specialized circuitry 332, which may be employed to control POW close and open operations by de-energizing operations, in accordance with an embodiment. For simplicity, the process 330 and the associated states (334A, 334B, 334C, 334D, and 334E) of the specialized circuitry 332 will be discussed together.

As illustrated, the specialized circuitry 332 includes a normally open contact 336 connected in series with a normally closed contact 338. State 334A illustrates the normal state of the specialized circuitry 332, where neither the normally open contact 336 nor the normally closed contact 338 are energized. In state 334A, the normally open contact 336 breaks the connection.

Next, process 330 begins to enable de-energized triggering of POW open and POW close operations. As mentioned above, triggering POW open and POW close operations via de-energizing triggers rather than energizing triggers may help to reduce variations that cause inconsistent POW open and/or POW close operations. For example, by performing the POW open and close operations in this de-energizing fashion, the rate of magnetic field collapse may be the primary variable of control as opposed to an energizing operation to perform the POW open and close operations, which may introduce inconsistent operations that are affected by the magnetic properties that are present within the air gap between the contacts, the energy stored in the coil, and the like.

The process 330 begins with initialization (block 340) of the specialized circuitry 332 into an energized state. In particular, the initialization (block 340) includes energizing the normally closed contact 338 (block 342). As illustrated by dashed line 344 in state 334B, the normally closed contact 338 is energized, causing the normally closed contact 338 to open.

Next, the initialization (block 340) continues with energizing the normally open contact (block 346). As illustrated by dashed line 348 in state 334C, the normally open contact 336 is energized, causing the normally pen contact to close. As may be appreciated, because the normally closed contact 338 was energized before the normally open contact 336, the circuit is still broken by the normally closed contact 338, despite closing of the normally open contact 336.

Upon energizing of both the normally open contact 336 and the normally closed contact 338, the initialization (block 340) is complete. Thus, a reliable POW open operation and/or POW close operation may be facilitated via de-energizing one or more of the contacts of the specialized circuitry.

For example, to perform a POW close operation 350, the normally closed contact may be de-energized (block 352). As illustrated by the block 352 in state 334D, the normally closed contact 338 is de-energized, causing it to close and completing the circuit. Thus, the POW close operation is implemented by de-energizing a contact, which may improve consistency of the POW close operation, by reducing variables that may cause timing variations in closing the circuit.

Conversely, when a POW open operation 354 is to be performed, the normally open contact 336 may be de-energized (block 356). As illustrated by the cross box 358 in state 334E, the normally open contact 336 is de-energized, causing the normally open contact 336 to open and also causing implementation of the POW open operation 354 (e.g., by causing the closed circuit to break). As with the de-energizing triggering of the POW open operation, the de-energizing triggering of the POW close operation may provide similar benefits of reducing variables that may cause timing variations in implementation of the POW open operation.

Figure 21:
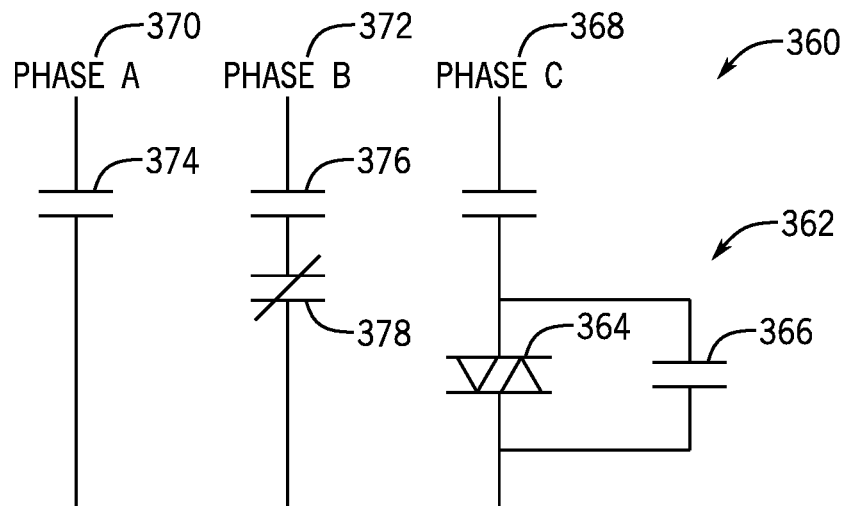
FIG. 21 illustrates an example circuit for arcing mitigation, in accordance with an embodiment.

As mentioned herein, arcing can sometimes occur between contacts. This may result in inconsistent POW open and POW close operations and can also damage the contacts. Accordingly, it may be desirable to implement additional arcing mitigation circuitry. FIG. 21 illustrates an example circuit 360 that implements arcing mitigation circuitry 362, in accordance with an embodiment.

As illustrated, a triode for alternating current (TRIAC) device 364 may be connected in parallel with contacts 366 of a relay on one or more phases of the circuit 360. Here, the TRIAC device 364 is implemented on a phase (e.g., Phase C 368) that will be the last phase to connect to the load and, thus, the most likely to experience contact arcing. As may be appreciated, the TRIAC device 364 can conduct current in either direction when triggered. Here, the TRIAC device 364 is used to absorb arcing energy that is provided to the contacts 366, by redirecting a portion of the current applied current away from the contacts 366. This absorption of arcing energy acts to protect the contacts 366 from arcing. In addition, the arrangement of the parallel TRIAC with the POW contact can be used as a cost-effective or simple starting torque controller (STC) or soft starter. Starting Torque Controllers help reduce mechanical and electrical stress on motor circuits and systems by limiting the torque surge at start-up. Starting torque controllers are ideal for adding on to existing across the line starters. They allow for adjustable initial torque and ramp time.

The other phases (Phase A 370 and Phase B 372) may or may not include a similar TRIAC device 364, depending on arcing mitigation needs for the circuit 360. In the current example, these phases do not include a TRIAC device 364, which may help reduce costs but may not provide the same level of arcing mitigation as embodiments that implement TRIAC devices 364 on one or more of these phases.

Phase A 370 may be provided via a normally open contact 374. Phase B 372 may be provided via a normally open contact or, as illustrated here, a normally open contact 376 in series with a normally closed contact 378. By way of operation, the contact in Phase A 370 may close to avoid any potential arcing because the current is not yet present on the phase. A coordinated close operation may be performed on Phase B 372 using POW switching (e.g., as discussed above in reference to FIG. 20). Phase C 368 may be connected through the TRIAC device 364, as discussed above. In some embodiments, the normally open contact 366 may be a multi-pole device shared between Phase A 370 and Phase C 368, while the TRIAC device 364 is closed.

Figure 22:
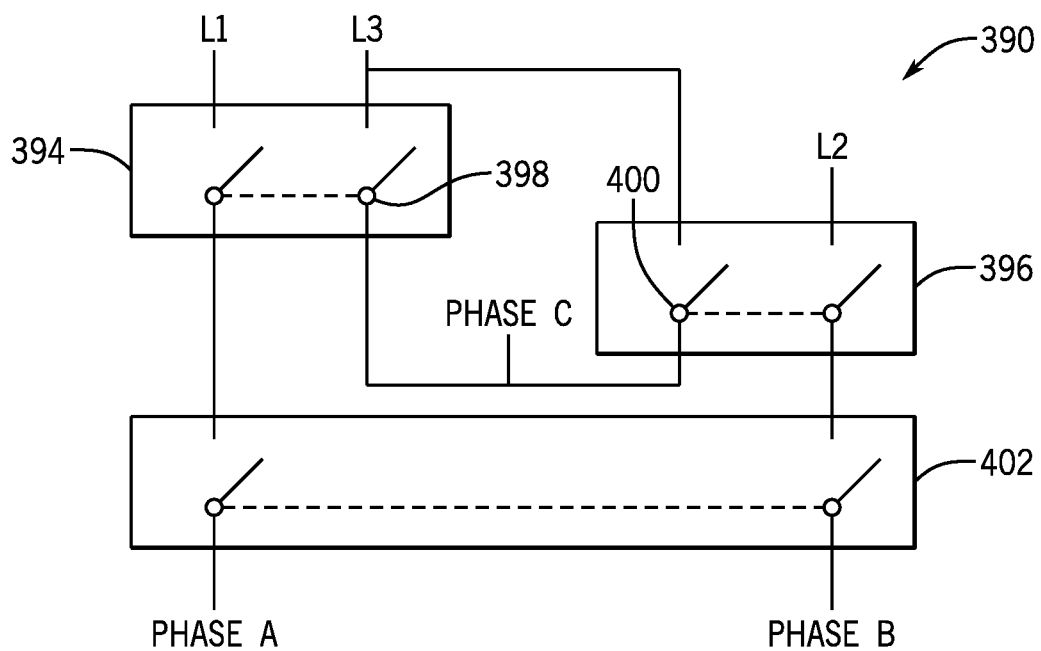
FIGS. 22 and 23 illustrate example circuitry for load balancing of operations on contacts and connection redundancy, in accordance with an embodiment.
Figure 23:
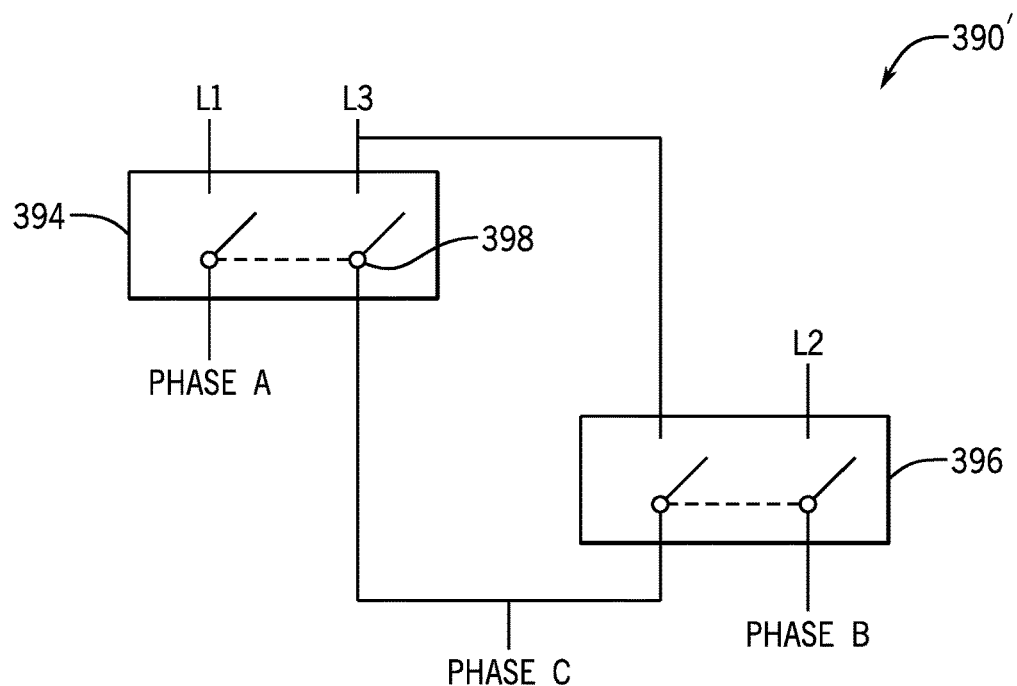

In some embodiments, double-pole single-throw relays can be used to minimize the amount of times that a particular contact is used when making a circuit connection. This may help in load balancing of operations on contacts, which may extend the life of the contacts. Further, these techniques may provide added connection redundancy, which may further enhance the circuitry. FIGS. 22 and 23 illustrate such example circuitry, in accordance with an embodiment.

In the circuitry 390 of FIG. 22 and the circuitry 390' of FIG. 23, Phase C may be alternatingly connected to the load via different relays (e.g., relay 394 and relay 396). For example, Phase C may be alternatingly connected to the load via relays 394 and 396 when the contacts 398 and 400 are alternatingly closed. This effectively reduces the number of operations sustained by contacts 398 and 400 by half. Thus, the contacts 398 and 400 may wear less quickly. Further, this configuration provides additional functional safety by providing redundant connections to the load (e.g., via contact 398 and contact 400). In some embodiments, as depicted in FIG. 22, an additional relay 402 may be provided to connect Phase A and Phase C to the load. Alternatively, as depicted in FIG. 23, other embodiments may not include the additional relay 402. By employing the two-relay circuity 390' configuration of FIG. 23 as opposed to the three-relay circuitry 390' configuration of FIG. 22, the final product may include less driver components and physical components, thereby reducing the cost and complexity of the device.

Contact Relay Reduction

Figure 24:
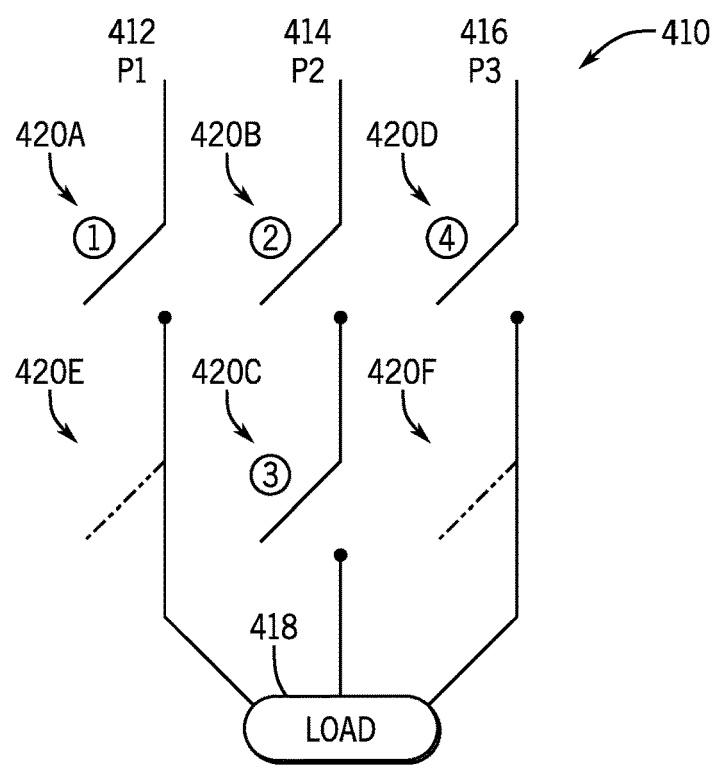
FIG. 24 illustrates an example three-pole relay circuit which uses POW techniques to provide reliable operation with a reduced number of contacts, in accordance with an embodiment.

In some instances, it may be desirable to reduce a number of contact elements provided in a relay. This may reduce manufacturing costs and provide a simpler relay design. FIG. 24 illustrates an example three-phase relay circuit 410 which uses POW techniques to provide reliable operation with a reduced number of contacts, in accordance with an embodiment. In the three-phase relay circuit 410, three poles, P1 412, P2 414, and P3 416 are connected to load 418. Contact relays/breaks 420A-F may be used to implement the POW techniques described herein. In a standard implementation, six contact relays/breaks 420A-F may be provided to implement these POW techniques. However, as mentioned herein, in some embodiments, it may be desirable to reduce and/or minimize the number of contact relay/breaks 420.

In the embodiment depicted in FIG. 24, the number of contact relays/breaks 420A-F may be reduced from 6 to 4 (e.g., contact relays/breaks 420A-D), as illustrated by dashed line contact relays/breaks 420E and 420F. It may be possible to reduce the number of contact relays/breaks 420A-F from 6 to 3 (e.g., contact relays/breaks 420A, 420B, 420D) with 420C becoming a dashed line connection similar to 420E/420F. Despite this reduction in contact relays/breaks 420, arcing mitigation can still be performed by adjusting opening/closing timings of the relays/breaks 420 between the different poles P1 412, P2 414, and P3 416, as will be described in more detail below.

In some embodiments, the relay/break 420 that is opened can be toggled between contact relays/breaks 420 that are likely to experience a fault or arc. Different opening patterns may be employed for each fault operation, which may help mitigate arcing effects. In other words, subsequent open operations can utilize different relay/breaks 420 to initiate toe open operation. This will be discussed in more detail below with regard to FIGS. 25 and 26.

In the embodiment of FIG. 24, the three-phase relay circuit 410 has one fully equipped pole (e.g., pole with two contact relay/breaks 420 (e.g., 420B and 420C)), P2 414. The other two poles, P1 412 and P2 416 each include a reduced number of contact relay/breaks 420. For example, pole P1 412 has been reduced to not include contact relay/break 420E and pole P3 has been reduced to not include contact relay/break 420F.

As may be appreciated, reducing the number of contact relay/breaks 420 on a pole may remove some re-strike mitigation, by relying on a single contact relay/break 420. Accordingly, it may be desirable to lead opening/breaking with the fully equipped pole (e.g. pole P2 414). By leading opening/breaking via fully equipped poles (e.g., pole P2 414), restrike mitigation may still be maintained for the contact relay/breaks 420 that are most likely to arc/re-strike (e.g., contact relay/breaks 420B and 420C) on the first-broken pole P2 414). After breaking the fully equipped poles, the other poles (e.g. poles P1 412 and P3 416) may be opened.

In other words, for opening operations/breaking a connection to a load, poles with an increased number of contact relay/breaks 420 may be opened prior to opening poles with a reduced number of contact relay/breaks 420. Thus, in the current embodiment, pole P2 414 may be opened prior to poles P1 412 and 43 416 during opening operations. This may be done by opening contact relay/breaks 420B and/or 420C.

Conversely, when connecting to a load, the poles with the reduced number of contact relay/breaks 420 may be closed first, followed by the poles having the increased number of contact relay/breaks 420. Thus, in the current embodiment, to make connection to the load 418, poles P1 412 and P3 416 may be closed first (e.g., by switching contact relay/breaks 420A and 420D, respectively). Then, after these poles are connected, the poles with the increased number of contact relay/breaks 420 may be connected. Thus, in the current embodiment, P2 414 may be closed (e.g., by switching contact relay/breaks 420B and 420C).

This delayed opening/closing time technique can be performed for POW as well as non-POW devices. For non-POW devices, the timing delay between the early break of the contact relay/breaks 420 on the pole(s) with the increased number of contact relay/breaks 420 and the later break of the contact relay/breaks 420 on the pole(s) with the reduced number of contact relay/breaks 420 should be at least a half cycle delay. For POW the time delay can be reduced to a quarter cycle, as more precise opening/closing may be possible.

Breaking capacity may be primarily dependent on contact gap in the moment of current zero cross for a switching device without any additional arc quenching. As mentioned above, coil control may be used to provide ideal contact gap and therefore best arc cooling conditions in the moment of current zero crossing. As described above, this could be done through pulsed coil control. This may increase an energy storage requirement, but some of this may be mitigated by enabling this feature only on the early break poles of a POW device.

As discussed above, arcing may occur with the contact relay/breaks 420 that initially break or make connections to a load. To further mitigate contact erosion, the order of opening and/or closing the contact relay/breaks 420 and/or poles may be alternated.

For making connections to the load 418, the poles with the increased number of contact relay/breaks 420 is closed after the poles with the fewer number of contact relay/breaks 420. The order of closing the poles with the fewer contact relay/breaks 420 may alternate. Thus, in the current embodiment, switching the contact relay/breaks 420A and 420D may interchangeably initiate the connection. The initial contact relay/break will not be prone to arcing. The other of the contact relay/breaks 420A and 420D may then be switched, which may have some possibility of arcing. By alternating the order of switching of 420A and 420D, the possibly arcing contact relay/break 420 may be shared, reducing contact erosion. After that, the pole with the increased number of contact relay/breaks 420 (e.g., P2 414) may be closed by, switching contact relay/breaks 420B and 420C alternatingly. This may cause distribution of the potentially arcing contact relay/break 420 (e.g., the last contact relay/break 420 to connect to the load 418).

For breaking a connection to the load 418, the poles with the increased number of contact relay/breaks 420 will be opened first, as this pole may be better equipped to handle arcing/re-strikes. The order in which the contact relay/breaks 420 on these poles are opened can be alternated to alleviate arcing on a particular one of the contact relay/breaks 420. Thus, in the current embodiment, for break sequences, contact relay/breaks 420B and 420C of pole P2 414 may alternatingly initiate the breaking procedure. From there, the other of relay/breaks 420B and 420C may be opened.

Next, the remaining poles may be opened in an alternating order. Thus, in the current embodiment poles P1 412 and P3 416 may be open in an alternating order, by alternating the order of opening contact relay/breaks 420A and 420D. This may help mitigate arcing caused by one of these contact relay/breaks 420A and 420 breaking the current.

Figure 25:
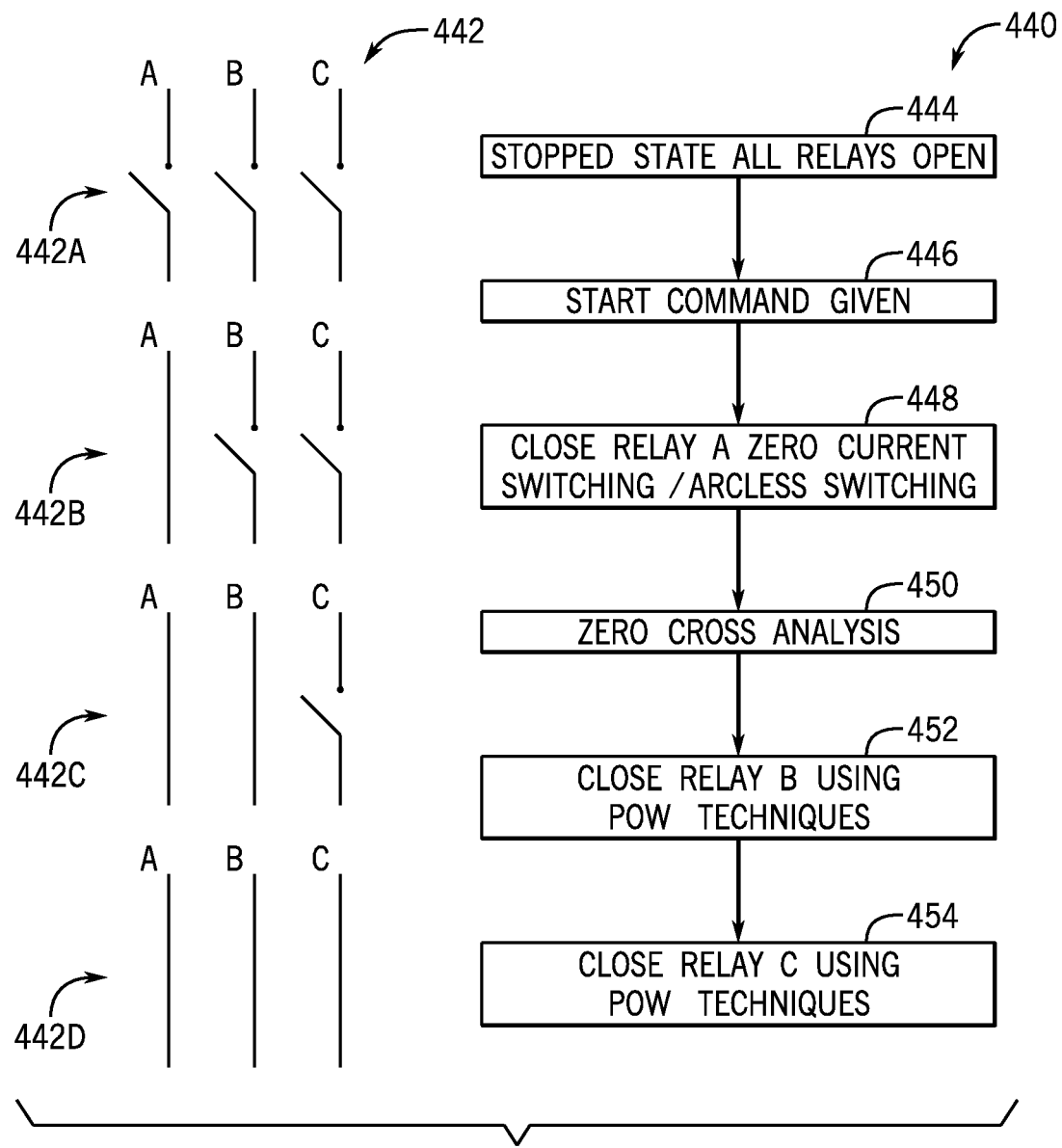
FIGS. 25 and 26 illustrate processes and associated circuitry states for contact erosion mitigation in an electromechanical switching device (e.g. like the one in FIG. 24), in accordance with an embodiment.
Figure 26:
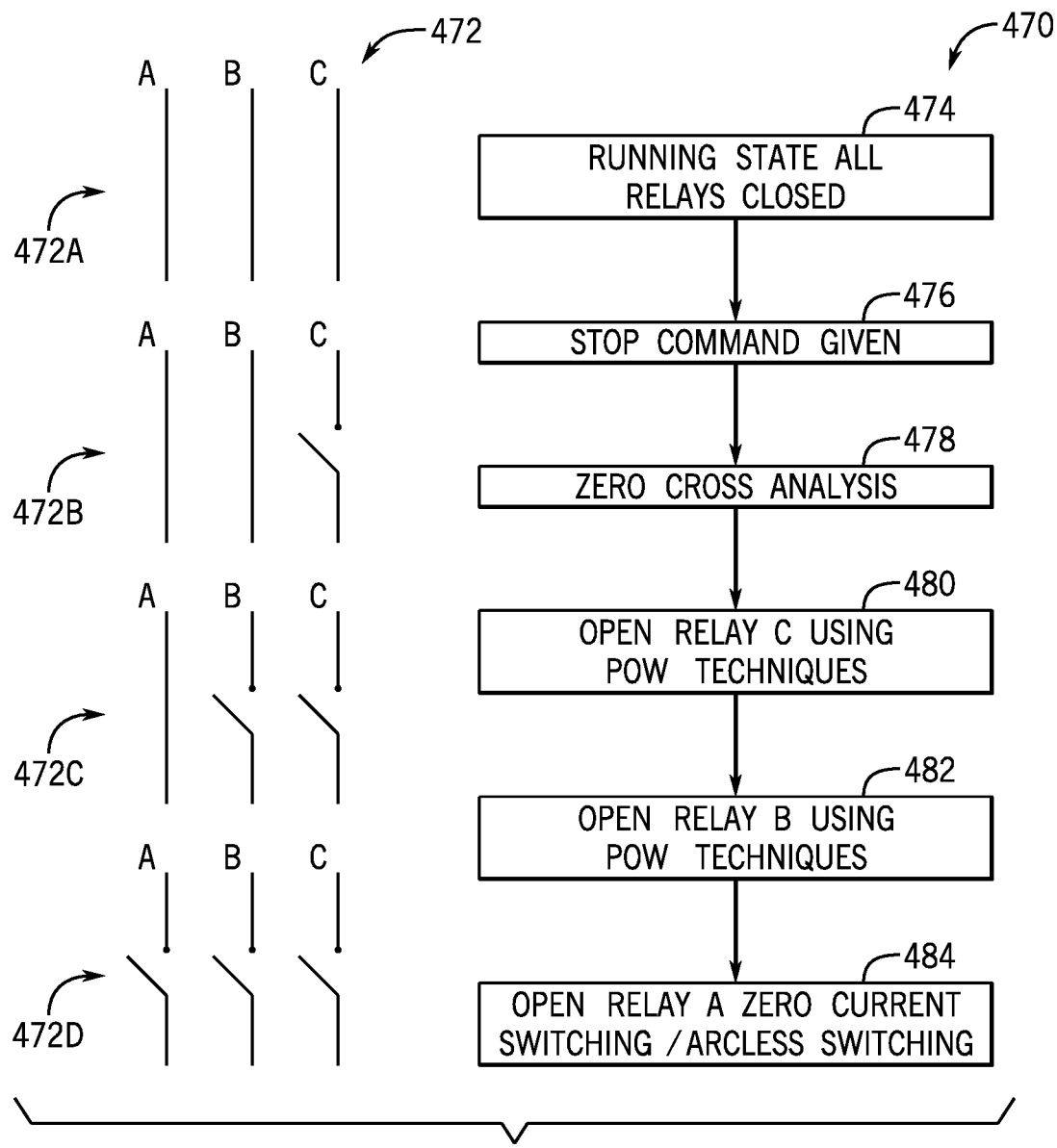

In some embodiments, there may be an equal number of contact relay/breaks 420 on all poles and each of these may be coordinated to start and stop operations on a connected load, such that the load is distributed across each pole. FIGS. 25 and 26 illustrate processes and associated circuitry states for such embodiments.

FIG. 25 illustrates a process 440 for a first close operation to connect to a load. As illustrated, states of a three-pole circuitry 442 is provided. In a first state 442A, all relays are open, as a stopped state is present (block 444).

Next, a start command is provided (block 446). As illustrated in state 442B, in response to the start command, Relay A is closed first, resulting in zero current/arcless switching (block 448).

As may be appreciated, the switching of the additional relays may cause arcing. Accordingly, these relays may be switched via the POW and anti-arcing techniques described herein. A zero cross analysis is performed (block 450), to pinpoint a time to switch the next of the remaining relays. Based upon the zero cross analysis, Relay B is closed using the POW/anti-arcing techniques provided herein (block 452). This is illustrated in state 442C.

Next, Relay C is closed using the POW/anti-arcing techniques described herein (block 454). This is illustrated in state 442D. By performing the second and third closings in this manner, arcing may be mitigated.

For subsequent iterations, the process 440 may remain the same, except that the order of relay closings may change. For example, relay B may be the first relay closed, followed by relay C and the relay A or followed by relay A and then relay C. In another subsequent iteration, relay C may be the first relay closed, followed by relay B and then relay A or followed by relay A and then relay B. By alternating ordering, contact damage due to arcing may be mitigated, as each of the contacts share in the burden of the closings that may cause a potential arc. These closings, as discussed above, may result in contact erosion over time. By sharing the responsibility for these loads across multiple contacts, the overall life of the relay may be extended. Additionally, one relay in each sequence is closed under zero current/arcless switching which may also extend the life of the switching device.

FIG. 26 illustrates a process 470 for a first open operation to disconnect from a load. As illustrated, states of a three-pole circuitry 472 are provided. In a first state 422A, all relays are closed, as a running state is present (block 474).

Next, a stop command is provided (block 476). Because the open command can cause arcing, the POW/anti-arcing techniques described herein may be implemented to break the initial relay connections. To do this, a zero cross analysis is performed (block 476). Based upon the zero cross analysis, an initial relay is opened. As illustrated in state 472B, in response to the start command, Relay C is opened first, using POW/anti-arcing techniques (block 480).

As may be appreciated, the switching of an additional relay may continue to cause arcing. Accordingly, the next relay may also be switched via the POW and anti-arcing techniques described herein. As illustrated in state 4723B, Relay B is opened using the POW/anti-arcing techniques provided herein (block 480). This is illustrated in state 442C.

Next, Relay A is opened under zero current/arcless switching (block 484). This is illustrated in state 472D. By performing the openings in this manner, arcing may be mitigated.

For subsequent iterations, the process 470 may remain the same, except that the order of relay openings may change. For example, relay B may be the first relay opened, followed by relay C and the relay A or followed by relay A and then relay C. In another subsequent iteration, relay A may be the first relay opened, followed by relay B and then relay C or followed by relay C and then relay B. By alternating ordering, contact damage due to arcing may be mitigated, as each of the contacts share in the burden of the openings that may cause a potential arc. These openings, as discussed above, may result in contact erosion over time. By sharing the responsibility for these loads across multiple contacts, the overall life of the relay may be extended. Additionally, one relay in each sequence is opened under zero current/arcless switching which may also extend the life of the switching device.

Minimizing Energy Available during a Fault Condition

In addition to the various schemes described above related to coordinating the operations of relay devices 140 that provide power to multi-phase system, the present embodiments may also involve coordinating the operations of the contacts based on potential fault conditions (e.g., overcurrent, overvoltage) that may be present within the connected system. In one embodiment, the POW switching may be employed to coordinate the opening and closing of contacts within the relay device 140 in response to detecting that a fault condition is present.

Figure 27:
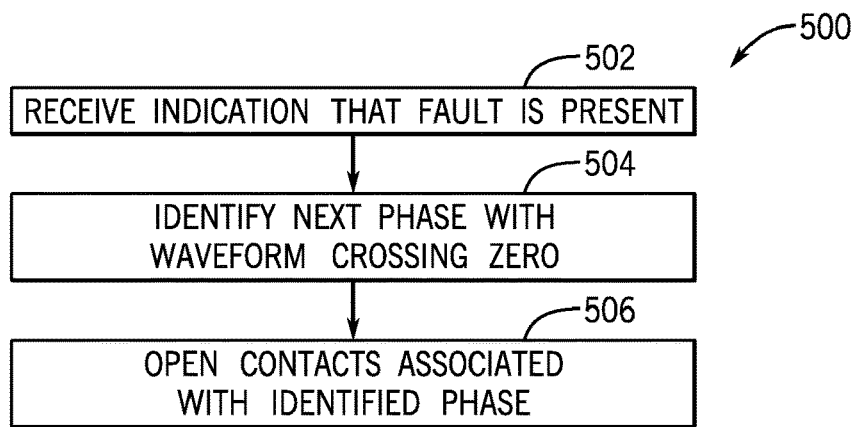
FIG. 27 illustrates a flow chart of a method for opening contacts of a relay device during a fault condition, in accordance with an embodiment.

By way of example, the control system 198 may receive data from sensors disposed on each phase of a multi-phase system, from other control systems that are part of the industrial automation system, or any other suitable data source that may provide data indicative of the presence of any fault condition. Each phase may provide power to a multi-phase load, such as a motor, via a multi-phase relay device with independently controllable contacts, via multiple single relay devices 140, or the like. In one embodiment, the control system 198 may detect or determine that a particular phase that may have a fault condition based on the received data. After detecting the particular phase that may have a fault, the control system 198 may start opening the contacts of the relay device 140 phase associated with the next phase that may have a voltage or current waveform reaching its respective zero crossing first. In this way, the control system 198 may minimize the energy available from the fault condition on the contacts of the respective relay device 140. With this in mind, FIG. 27 illustrates a flow chart of a method 500 for opening a contact associated with a particular phase based on the presence of a fault.

Although the method 500 is described as being performed by the control system 198, it should be noted that any suitable control circuit or system may perform the method 500. Referring now to FIG. 27, at block 502, the control system 198 may receive an indication that a fault condition is present on a part of a system connected to a respective relay device 140. The fault condition may be any type of fault such as an overload condition, an overvoltage condition, overcurrent condition, a temperature condition, or the like. The control system 198 may receive the indication by way of data acquired from sensors, a signal transmitted from another control system (e.g., controller, monitoring system), or any suitable signal generating device.

In some embodiments, the control system 198 may receive data that represents a change in current (e.g., di/dt) for a respective phase may be above some threshold. As such, the control system 198 may determine that the current is rapidly rising to a potential fault condition (e.g., overcurrent). In this way, the control system 198 may anticipate that a fault condition is likely to occur and proceed to block 504.

At block 504, the control system 198 may identify a particular phase that will have an electrical waveform that is approaching zero next. That is, in a multi-phase system, after receiving the indication that a fault is present at block 502, the control system 198 may identify the next phase in the multi-phase system that will conduct a voltage waveform or current waveform that crosses zero. In some embodiments, the control system 198 may monitor the voltage and current waveforms on each phase of the multi-phase system using voltage sensors and current sensors, respectively. In other embodiments, the control system 198 may use an internal clock to track the expected waveforms being conducted through each phase of the multi-phase system. To ensure that the expected waveforms match the actual waveforms, the control system 198 may calibrate the internal clock periodically with sensor data. By using the expected waveforms, the control system 198 may identify the next phase crossing zero more efficiently without receiving data from other sensors.

After identifying the next phase crossing zero, the control system 198 may, at block 506, send a signal (e.g., or remove a signal) to the relay device 140 associated with the next phase crossing zero. The signal may cause the contacts 262 and 264 to open. In some embodiments, the control system 198 may coordinate the opening (e.g., energizing/deenergizing relay coil 152) of the contacts 262 and 264, such that the contacts 262 and 264 open at the zero crossing of the voltage or current waveform.

In certain situations, after detecting a fault in an industrial system, upstream or downstream circuit protection devices (e.g., breakers) may open after a number of cycles of an electrical waveform conducts through each phase of the multi-phase system. To reduce the energy available for arcing or other undesirable condition, the control system 198 may open the contacts associated with the next phase to cross zero. In this way, the devices connected upstream and downstream in the multi-phase system may be powered down while the energy available due to the fault condition is minimized.

In addition to coordinating the operations of the relay device 140 based on fault conditions, the present embodiments may include detecting shock or external events that may cause contacts to unintentionally change states (e.g., closed to open). For example, certain external forces (e.g., magnetic, electric) may cause the contacts to open or close when they are expected remain closed or open, respectively. The external forces may be vibrational or mechanical forces that may cause the contacts to physically move. In this situation, the control system 198 may detect the external event and adjust power provided to the relay device 140 to ensure that the contacts remain in a desired or expected state.

Figure 28:
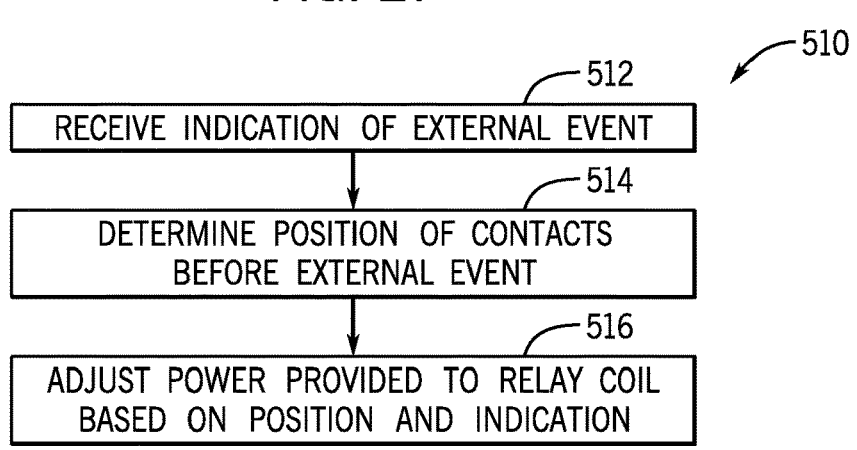
FIG. 28 illustrates a flow chart of a method for controlling power provided to a relay device during a disruptive event, in accordance with an embodiment.

With this in mind, FIG. 28 illustrates a method 510 for controlling power provided to the relay device 140 in response to detecting an external event. Like the method 500, the method 510 may be performed by the control system 198 or any suitable controller or control device.

Referring now to FIG. 28, at block 512, the control system 198 may receive an indication of an external event from a sensor, another control system, or the like. As mentioned above, the external event may be any event that may potentially cause the contacts 262 and 264 to change states. The presence of the external event may also be inferred based on related data. For instance, in some embodiments, an accelerometer may be coupled to the contacts 262 or 264, to the housing of the relay device 140, or to another part of a component that may be physically coupled to the contacts 262 or 264. The accelerometer may measure acceleration properties associated with a connected component. The acceleration properties, when above some threshold, may indicate that the connected component is moving rapidly. Since the components of relay device 140 are expected to be stationary unless power to the relay coil 152 is altered, the detection of movement within the relay device 140 or on a component connected to the accelerometer may be indicative of a potential external event (e.g., shock events).

At block 514, the control system 198 may determine the position of the contacts 262 and 264 before the external event. That is, the control system 198 may determine the expected state of the contacts 262 and 264 during normal operation of the respective relay device 140. Based on the determined position and the occurrence of the external event, at block 516, the control system 198 may adjust the power (e.g., current or voltage) provided to the relay coil 152. In some embodiments, the control system 198 may increase the coil current provided to the relay coil 152 to ensure that the relay device 140 operates as desired and is not influenced by external forces (e.g., magnetic, electric). That is, the additional current provided to the relay coil 152 may cause the relay coil 152 to produce a stronger magnetic field to ensure that the contacts 262 and 264 are securely positioned in the same position as it was prior to the external event.

In some embodiments, the amount of power adjustment provided to the relay coil 152 may be determined based on mechanical force data associated with the external event. For instance, the accelerometer may provide mechanical force data indicative of the force that is being applied to the contacts 262 and 264, and thus the power provided to the relay coil 152 should induce a magnetic force strong enough to overcome the mechanical force created by the external event.

With the foregoing in mind, in some embodiments, the control system 198 may determine a minimum amount of current that may be used to maintain a desired position or arrangement of the contacts within the relay device 140. That is, the control system 198 may incrementally increase the current used to drive the relay coil 153 until the armature 142 moves to couple the contacts 262 and 264 together. After determining the minimum amount of current for driving the relay coil 152, the control system 198 may provide the same amount of current each time the relay coil 152 is to be energized. In this way, the relay device 140 may use power (e.g., current) more efficiently as compared to the rated current for the relay coil 152. Although the minimum amount of current provided to the relay coil 152 may be sufficient to maintain contact closure, an external event may cause the contacts 262 and 264 to inadvertently change states. As such, by employing the method 510 described above, the control system 198 may increase the current provided to the relay coil 152 to ensure that the contacts remain in the desired state.

In addition to conserving energy while driving relay coil 152, by driving the relay coil 152 with the minimum current, the contacts may also change states more quickly when a fault or other condition is present that causes the relay device 140 to change states. As such, a fault current present on one phase of a three-phase system may be isolated from the three-phase system more quickly, thereby reducing the impact of the fault current on the three-phase load.

Although each of the preceding operations are described as a way to minimize the potential for arc energy to be present during an open or close operation of the relay device 140, it may still be difficult to implement one of the embodiments described herein to coordinate the timing for opening the contacts relative to current flow or voltage potential present on the contacts. In addition, other forces (i.e., electromagnetic and gas pressure forces) generated due to a fault being present may cause the contacts will open at an arbitrary instant in time. As such, arc energy may still be present when contacts of the relay device 140 change states. The armature may cause the contacts to couple together again after they opened. In this case, the contacts may weld together there because the arc energy creates a liquid metal (e.g., silver) that may cause the contacts to stick together.

Figure 29:
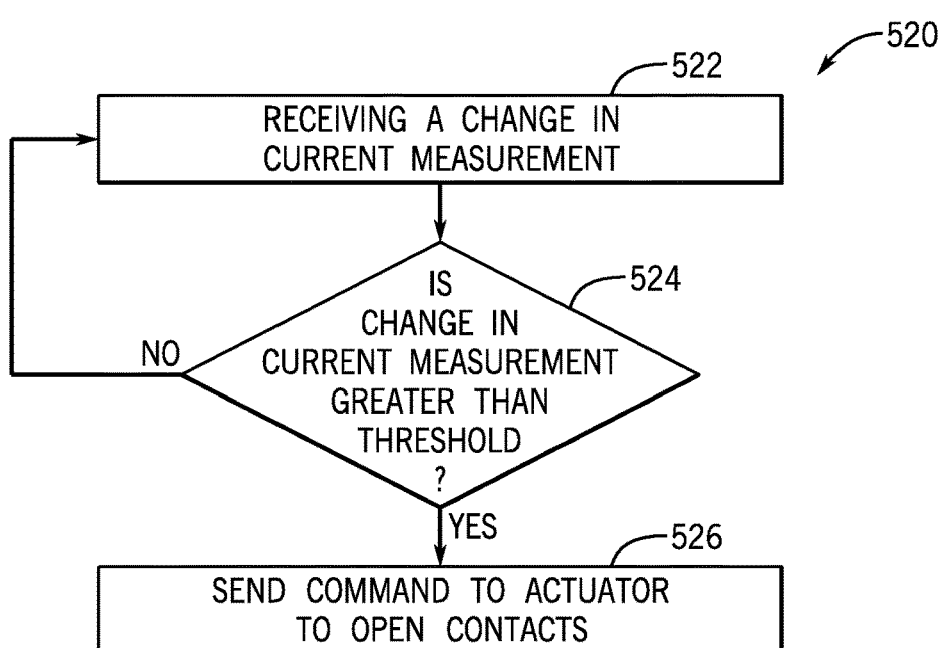
FIG. 29 illustrates a flow chart of a method for controlling an actuator to open contacts based on a change in current value, in accordance with an embodiment.

Keeping this in mind, to prevent this type of welding between the contacts, an actuator may be employed to push contacts open from a particular position. (e.g., position A or B). That is, an actuator may be coupled to the armature 142 and controlled by the control system 198 to change states of the contacts based on the presence of certain conditions. For example, FIG. 29 illustrates a method 520 for controlling an actuator in accordance with embodiments described herein. As discussed above, although the method 520 is described as being performed by the control system 198, any suitable controller or control system may perform the method 520.

At block 522, the control system 198 may receive a change in current (e.g., di/dt) measurement from a sensor. The change in current measurement may assist the control system 198 to anticipate when a current (e.g., through the contact or through another conductor) will exceed a threshold. At block 524, the control system 198 may determine whether the change in current measurement exceeds some threshold. The determination of the threshold may be based on a relationship between change in current and a condition in which the contacts may change states and may result in a weld between the contacts.

At block 526, the control system 198 may send a command to an actuator to change or maintain the position of the contacts at the desired state. That is, if the contacts are positioned in an unexpected manner (e.g., welded together), the actuator may be used to push the contacts apart to the desired position. In addition, the actuator may be used to secure the contacts in the desired position, to prevent re-closure (e.g., after contact lift-off with arc) of the contacts with molten contact material.

It should be noted that the control system 198 may control the operation of the actuator based on the presence of a number of conditions (e.g., detected fault, overcurrent detection). In some embodiments, the actuator may be activated or deactivated by actively switching off of a switching element or an opening of the magnet system through opening force data related to the movement of the contact.

In addition, the control system 198 may activate the actuator based on determining that the contacts are welded together. For example, the inductance of a closed and an open actuator is different. The inductance of the actuator's magnet system in an open and closed position changes due to an air gap in the magnet system. A constant current may be applied to the magnet system and a change in voltage may be measured. Alternatively, a constant voltage may be applied to the magnet system and a change in current may be measured. Based on the change in voltage or current, the control system 198 may determine the position of the contacts and control the actuator accordingly. It should be noted that the contact status determination may be made via measurement of actuator inductance during fault conditions and during the normal operation of the respective system.

Controlling Open and Close Operations of Contacts

Although the actuator, as described above, may be used to ensure that the position of contacts is correct or in an expected configuration, in some embodiments, the actuator may be used to position the armature 142 to enable the contacts to open and/or close in an efficient (e.g., power efficient) manner. That is, prior to the relay device 140 opening or closing, the position of the armature 142 or the connected contacts may be controlled in a manner to be placed at a particular angle or within a desired distance from another contact. By controlling the position of the armature 142, and thus the contacts connected thereto, the actuator may ensure that the contacts (e.g., 262, 264) have a certain gap distance between each other that may enable the armature to open or close more efficiently.

Keeping this in mind, it should be noted that the speed in which a contact assembly opens influences the capacity in which the contacts can open or break. In addition, the distance or gap between the two contacts in the moment the current flow (e.g., through the contacts) reaches its zero crossing should be at some threshold distance from each other to ensure that the contacts do not restrike after opening. That is, if the distance between the contacts after opening is larger than the threshold distance, the amount of arc energy (e.g., ions, thermal time constant of air column) that may be present between the contacts after the open operation is completed may cause the temperature of the air gap between the contacts to rise and create a suitable condition for restrike. In other words, if the open operation causes the contacts to open to a gap that is larger than some threshold, the air gap between the contacts may receive more heat (e.g., within the volumetric area) due to the arc energy present from the voltage waveform.

In the same manner, after the contacts are opened, it may be beneficial to position the contacts such that the two contacts are greater than the first threshold distance and less than a second threshold distance. By ensuring that the gap distance between the two contacts are between the first and second threshold distances, the present embodiments place the contacts in an optimal position to reduce the likelihood for restrike to occur. As such, the open operation should be coordinated such that the contacts open to a desired distance or optimal gap between each other that is greater than a first threshold distance (e.g., to prevent restrike) between the contacts and less than the second threshold distance (e.g., to prevent contact bounce) between the contacts.

Figure 30:
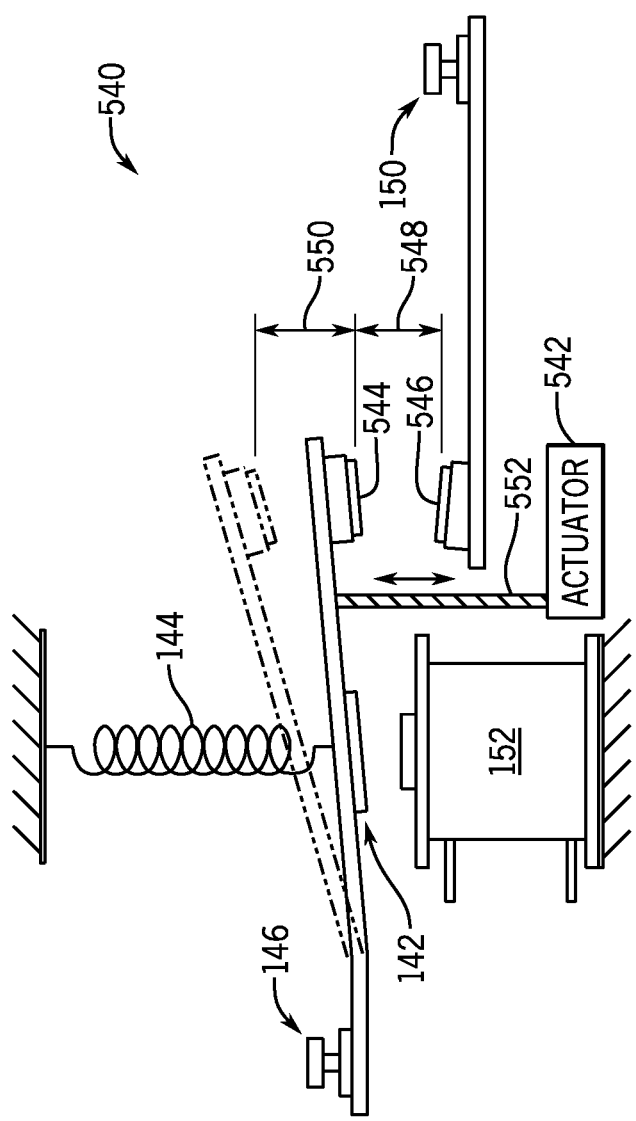
FIG. 30 is a system view of an example single-pole, single current-carrying path relay device with an actuator, in accordance with an embodiment.

With this in mind, FIG. 30 illustrates a relay device 540 that is similar to the relay device 140 of FIG. 6. However, the relay device 540 includes an actuator 542 that may be coupled to the armature 142. As shown in FIG. 30, a distance or gap between contacts 544 and 546 may extend between range 548 and range 550 based on a position of an arm 552 of the actuator 542. In some embodiments, the actuator 542 may be any suitable a motor or other positioning device (e.g., stepper motor) that may be used to position the armature 142 by way of the arm 552. That is, the actuator 542 may extend or retract the arm 552, which may be coupled to the armature 142. As such, the armature 142 may be moved to position the contact 544 within a certain distance from the contact 546. In some embodiments, an armature may include the arm 552, which may be a threaded shaft or any other suitable component that may push and/or pull the armature 142.

In some embodiments, the optimal gap may be determined for each contact assembly based on properties of the contact assembly. For example, the material of the contacts, the size or surface area of the contacts, the resistance of the spring 144, the inductance of the relay coil 152, the expected voltage and current conditions for the contacts, and other relevant factors may be associated with determining the desired distance between contacts.

To control the position of the contacts with respect to the gap therebetween, the control system 198 may send signals to the actuator 542 to cause the actuator 542 to move the arm 552. The actuator 542 may include any suitable deterministic positioning device in which the position of the arm 552 may be moved in a controlled and known (e.g., distance) manner. As mentioned above, the actuator 542 may include a stepper motor that may have predefined increments in which the arm 552 moves. As such, based on the incremental position of the stepper motor, the control system 198 may interpolate or determine the distance between the contacts 544 and 546. In another embodiment, the inductance of the relay coil 152 or the actuator 542 may be used to determine or verify the position of the armature 142 and thus the air gap between the contacts 544 and 546.

Figure 31:
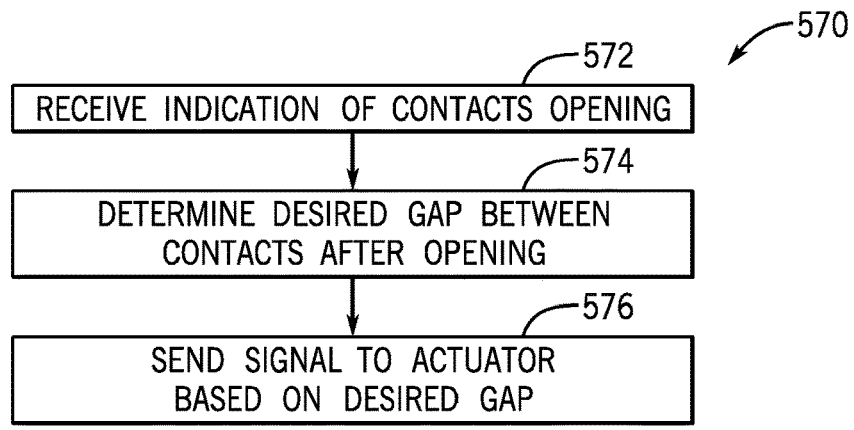
FIG. 31 illustrates a flow chart of a method for controlling an actuator to positions contacts for an open operation based on a position of an armature of in a relay device, in accordance with an embodiment.

Keeping the foregoing in mind, FIG. 31 illustrates a method 570 for controlling the open operation of the relay device 540. As discussed above, although the method 570 is detailed as being performed by the control system 198, the method 570 may be performed by any suitable controller or control system.

Referring now to FIG. 31, at block 572, the control system 198 may receive an indication that the relay device 540 is open. The indication may be received via a signal from the relay device 540, any suitable sensor, or some other control system. In some embodiments, the control system 198 may infer that the relay device 540 is open based on other factors, such as voltage being absent from a device connected downstream from the relay device 540 or the like. In addition, data obtained from sensors disposed within the system may indicate that the relay device 540 includes open contacts.

The indication received at block 572 may be representative of the relay device 540 opening or breaking the connection between the contacts 544 and 546. The contacts 544 and 546 may open in response to a fault condition being present or the like. As such, to prevent the contacts 544 and 546 from re-striking, the control system 198 may ensure that the contacts 544 and 546 are opened to a desired or optimal gap that reduces the probability for re-strike.

As such, at block 574, the control system 198 may determine a desired distance or gap between the contacts 544 and 546. As discussed above, the desired gap may be determined for each contact assembly based on properties of the contact assembly, such as the material of the contacts, the size or surface area of the contacts, the resistance of the spring 144, the inductance of the relay coil 152, the expected voltage and current conditions for the contacts, and other relevant factors may be associated with determining the desired distance between contacts. By way of example, the gap between contacts may be determined based on analyzing a likelihood of restrike occurring for certain current values with respect to various gap distances. That is, for a number of current values that may exceed a current rating for the contacts, an analysis may be performed to determine a probability that restrike conditions (e.g., charge between contacts, ions in the air gap) for a number of distances for the gap. Based on the results of this analysis, the desired gap distance between the contact may be determined, such that the gap distance corresponds to the lowest probability for restrike associated with the highest expected current (e.g., fault current) for the contacts.

In some embodiments, the analysis for determining the desired gap distance between the contacts 544 and 546 may be determined prior to performing the method 570. That is, the desired gap distance between the contacts 544 and 546 may be determined during manufacturing or testing of the relay device 540. Alternatively, the desired gap distance may be determined dynamically based on the current conditions (e.g., current, voltage, fault current) present on the contacts 544 and 546. The current conditions may be simulated based on machine learning algorithms that determine an expected current and/or voltage present on the contacts 544 and 546 based on sensor data obtained from downstream devices, upstream devices, or the like.

Referring back to the method 570, at block 576, the control system 198 may send a command or signal to the actuator 542 to adjust the position of the arm 552. The signal may cause the actuator 542 to move the arm 552 to cause the armature 142 to move the position of the contact 544 and achieve the desired gap between contacts 544 and 546. In some embodiments, the signal may include a number of steps for a stepper motor to move to achieve the desired distance. In addition, the distance between the contacts 544 and 546 may be verified based on the resistance of the spring 144, the inductance of the relay coil 152, an indication provided by the actuator 542, or the like.

In addition to controlling the open operations, the actuator 542 may control the gap between the contacts 544 and 546, such that they are positioned in an optimal position to minimize contact bounce for a close operation. That is, when a close operation begins, the magnetic field provided by the coil may cause the contact to close. By controlling the actuator 542 to position the contacts 544 and 546 closer to each other, as compared to a traditional relay device 140, the control system 198 may reduce the bounce properties associated with the contacts 544 and 546 by reducing the distance is traveled by the armature 142 to perform the close operation. Moreover, after the close operation is performed, the actuator 542 move back to a desired open position and wait for the magnetic field to collapse during an open operation to quickly have the armature 142 positioned for the optimal open position as described above. As a result, the present embodiments described herein may independently be used to reduce torque transients and contact erosion experienced by the contacts of the relay device.

Figure 32:
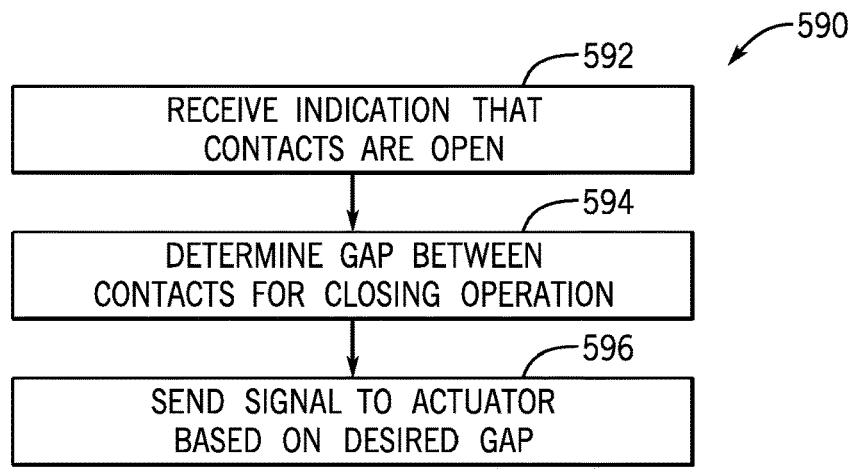
FIG. 32 illustrates a flow chart of a method for controlling an actuator to position contacts for a close operation based on a position of an armature of in a relay device, in accordance with an embodiment.

With the foregoing in mind, FIG. 32 illustrates a method 590 for positioning the gap between the contacts 544 and 546 in preparation for a close operation. As mentioned above, although the method 590 is described as being performed by the control system 198, it should be understood that any suitable controller or control system may perform the method 590 described herein.

At block 592, the control system 198 may receive an indication that the relay device 540 has open contacts 544 and 546 using similar techniques as described above with respect to block 572 of FIG. 44. In some embodiments, the indication may be received while the relay device 540 is in an initialized state. That is, the relay device 540 may receive a coil current at the relay coil 152, such that the contacts 544 and 546 (e.g., normally closed) open after the relay coil 152 is energized. As such, it should be noted that the embodiments described below with respect to the method 590 may be performed on any suitable relay device that includes normally open contacts or normally closed contacts. In any case, the indication that the contacts 544 and 546 are open may also include an indication that the contacts 544 and 546 are to remain open until a close operation is performed. As such, the method 590 may be performed using a normally closed contact arrangement where the contacts 544 and 546 open after the relay coil 152 is energized. However, it should be understood that the method 490 may also be performed in conjunction with the method 570 described above to ensure that the contacts 544 and 546 are positioned to balance between a gap that prevents restrike and reduces the bounce properties between the contacts 544 and 546 during a close operation.

In any case, at block 594, the control system 198 may determine a desired gap distance between the contacts 544 and 546 for performing a closing operation. Like the block 574 of FIG. 31, the desired gap distance may be determined based on testing that may occur during manufacturing or dynamically during the operation of the relay device 540. That is, the gap between contacts may be determined based on determining a minimum distance for the contacts 544 and 546 to travel to reduce the likelihood of contact bounce occurring for certain current values with respect to various gap distances. That is, for a number of gap distances between the contacts, an analysis may be performed to determine the bounce properties associated with a number of distances for the gap. Based on the results of this analysis, the desired gap distance between the contacts may be determined, such that the gap distance corresponds to the lowest number of expected bounces between the contacts after a close operation is performed.

At block 596, the control system 198 may send a command to the actuator 542 to cause the actuator 542 to move the arm 552 to achieve the desired gap distance. As a result, the contacts 544 and 546 are positioned in an optimal fashion to perform the close operation.

Automatically Configuring POW settings

Although the embodiments described above detail various systems and methods for increasing contact life or decreasing contact erosion, in some embodiments, POW switching may be configured to minimize a torque ripple that may occur when a three-phase power source is connected to a load (e.g., rotating load, motor, generator). That is, as discussed above, the timing related to making or connecting a load to a power source through relay devices that employ POW switching (e.g., closing operation) is generally optimized to increase contact life. However, by controlling the points on waves in which each phase of a multi-phase power supply connects to a rotating load, the control system 198 may coordinate the closing of relay devices (e.g., closing of contacts) to synchronize with the electrical waveforms present on the rotating load to minimize a torque ripple that may occur when the rotating load first starts rotating or when the rotating load is disconnected from the power source and is reconnected to the power source.

In any case, depending on the operation of the connected equipment, it may be beneficial to allow a user to select whether the relay devices are to be optimized with regard to increase contact life or decrease torque ripples. For example, a small motor may turn on and off frequently, and, as such, a user may prefer that the contact life is optimized to preserve the ability of the small motor to continue to operate for a longer period of time. In another example, a 10-horsepower motor may actuate a mechanism that is susceptible to stress and shortened life due to torque spikes that occur at startup. In this situation, a user may wish to minimize start torque ripple.

With these scenarios in mind, in certain embodiments, the relay devices described herein may be configurable to operate in a manner that will preserve or extend contact life or reduce the presence of torque ripples. That is, by controlling the point on the respective electrical wave (e.g., POW switching profiles) in which the respective relay devices close to connect to a load, the control system 198 may adjust the points on the respective electrical waveforms that the relay devices connect the loads to the power source. In some embodiments, the control system 198 may receive an indication related to operating the relay devices to preserve contact life or reducing torque ripples the using a switch disposed on the relay device, a jumper on a printed circuit board (PCB) that hosts the relay device, or any other suitable physical component (e.g., hardware) that may be set by the user. In some embodiments, the relay device may include a physical dial that may be moved to enable the user to select whether the relay should optimize for contact life, torque ripple, or some balance between the two. That is, the dial may include a range of operation parameters that correspond to preserving a maximum life of the contact to about a 10% torque ripple reduction in starting current provided to the load.

In addition to a physical dial, the control system 198 may receive a user input via a visualization representative of a dial that may be displayed on an electronic display. As such, the user may specify to the control system 198 a manner in which it may control the open and close operations of the relay device based on the preference of the user.

In some cases, the open and close operations of a relay device is controlled based on a POW switching profile used by the control system 198 to control the respective relay devices. However, the POW switching profile used to control the respective relay device may change dynamically based on a history of use of the load equipment (e.g., motor) being controlled by the relay device. That is, for example, the control system 198 may monitor and record the operations of the respective load device over a period of time and dynamically adjust the manner in which the respective relay devices operate to maximize contact life or minimize torque ripple based on the operation of the load device. In this way, during certain periods of operation, the relay device may operate in a particular mode that may be beneficial to the overall system performance. For instance, the control system 198 may determine an operating frequency of a load device, a frequency of start and stop operations performed during a period of time, load conditions (e.g., constant load, variable load, capacitive load) of the device, and other parameters to determine whether it may be more beneficial to maximize contact life or minimize torque ripples for the overall performance of the industrial system.

Figure 33:
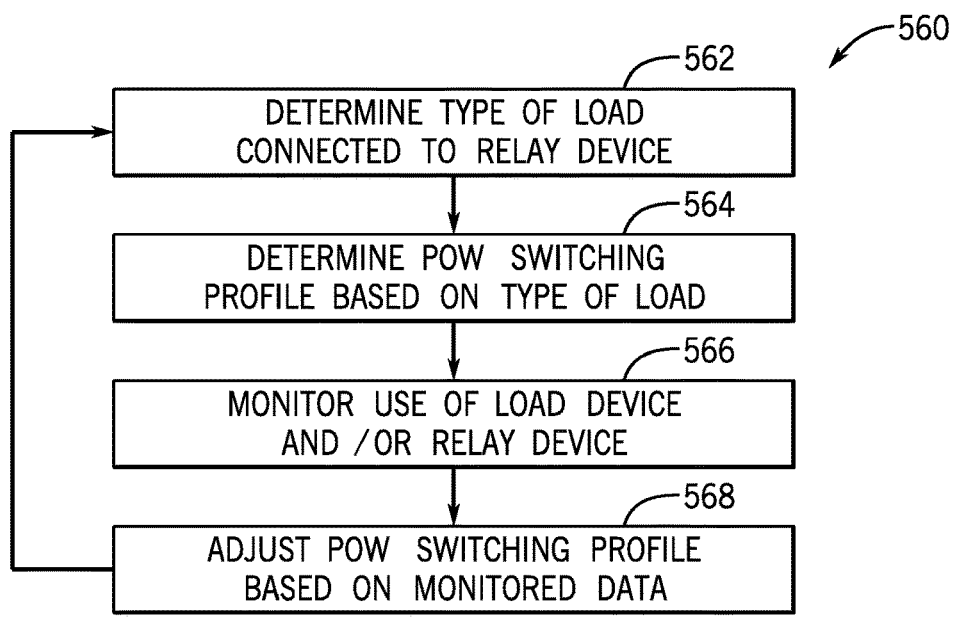
FIG. 33 illustrates a flow chart of a method for dynamically configuring POW settings for a relay device, in accordance with an embodiment.

With the forgoing in mind, FIG. 33 illustrates a method 560 for adjusting the POW switching profile based on the load device connected to the respective relay device. As mentioned above, although the method 560 is described as being performed by the control system 198, it should be understood that any suitable control system or controller may perform the method 560.

Referring now to FIG. 33, at block 562, the control system 198 may determine a type of load connected to the relay device. In some embodiments, the control system 198 may receive data from the respective load device. The data may be indicative of nameplate data that corresponds to the type of device, a rating for the device, and the like. For instance, the nameplate data for a connected device may be provided to the control system 198. The nameplate data may be used to determine a set of operating parameters for the relay device based on the specific device controlled by the relay device, based on the load present on the relay device, and the like. In addition to the nameplate data, metadata or data that is related to the specific device or load may be provided to the control system 198.

In some embodiments, the control system 198 may ping or send a signal to the load device to determine the type of load that may be connected to the device. That is, the control system 198 may send an electrical signal to the load device via the respective relay device and determine the type of the load device based on detected back EMF signals or the like. In other embodiments, the control system 198 may receive data from other control systems that may have access to information related to the load device connected to the relay device controlled by the control system 198. Alternatively, the control system 198 may receive input data from a user that identifies the type of load device.

In some embodiments, the control system 198 may determine whether the load device corresponds to an inductive or capacitive load. That is, by evaluating a load type (e.g., inductive/capacitive) connected to the relay device, the control system 198 may determine how the relay device should balance between the operating for optimizing between contact life and minimizing torque ripple. For instance, since the ideal angle for capacitive loads and the ideal angle for inductive loads are opposites of each other, the control system 198 may set a default setting for the relay device at a firing angle (e.g., 45°) that is between the ideal capacitive and ideal inductive loads. The control system 198 may then monitor whether the voltage waveform of the load device leads of lags the current waveform to determine whether the load device is capacitive or inductive. In this way, the control system 198 may determine a POW switching profile for the relay device that may protect load devices from potential damage. For instance, if the control system 198 used a POW switching profile that corresponds to an ideal angle for inductive load for a load that was actually capacitive, the load device may receive a relatively high inrush current that could damage the load device. By employing the technique described above, the control system 198 may minimize the amount of damage that the load device may experience.

After determining the type of load device connected to the respective relay device, the control system 198 may, at block 564, determine a POW switching profile to use for the respective relay device. That is, depending on the normal operating parameters of the load device, the expected frequency in which the load device operates, the number of times that the load device is cycled on and off, the amount of power used by the load device, another other suitable factors, the control system 198 may configure the POW settings for open and close operations of its relay device to preserve contact life or minimize torque ripples.

In some embodiments, the control system 198 may access a lookup table or other data that may provide an indication as to what POW switching profile to use for the respective load type. In addition, the control system 198 may determine the POW switching profile to use based on historical analysis of various types of loads connected to the relay device. That is, the control system 198 may track the various types of load devices connected to the respective relay devices over a period of time.

After determining the POW switching profile to use, the control system 198 may begin controlling the open and close operations according to the identified POW switching profile. That is, if the control system 198 determines that the load device switches on and off more than a threshold amount of times within some amount of time, the control system 198 may use a POW switching profile that preserves contact life by performing opening and closing operations at the zero crossing or using any of the other techniques described herein. Alternatively, if the control system 198 determines that the load device is susceptible to damage due to torque ripples, the control system 198 may select the POW switching profile that reduces the likelihood of torque ripples being present but may not allow the relay device to perform open and close operations at the zero crossing of various electrical signals.

After the relay device operates according to the determined POW switching profile, the control system 198 may, at block 566, monitor the use of the load device and/or the opening and closing operations of the relay device for a period of time. As such, the control system 198 may monitor whether the POW switching profile selected for the load device suits the performance of the load device or the relay device. In this way, at block 568, the control system 198 may adjust the POW switching profile based on the monitored use of the respective device.

In some embodiments, the method 560 may be performed continuously to dynamically adjust the POW switching profile used to control the relay device throughout the life of the relay device. As such, if the performance or use of the load device changes, the control system 198 may automatically adjust the POW switching profile without user interaction to ensure that the relay device and/or load device is protected. Moreover, by using the method 560, the control system 198 may automatically assess how to control the relay device without receiving user input or guidance, thereby protecting the various devices from human error or from the lack of knowledgeable human operators being present to initialize the operation of the load device or the relay device.

In addition to determining POW switching profile based on the load type and the monitored data, the control system 198 may coordinate the selected POW switching profile with other protection circuitry that may be in the system. That is, a protection component (e.g., circuit breaker) connected to the relay device may provide information (e.g., current detected through current transformer of circuit breaker) related to the operation of the relay device, the connected load device, or the like. For example, if the relay device uses a POW switching profile that optimizes contact life, the current ripple and inrush current for the respective device being controlled by the relay device may increase. This increased current amount may cause the protection component to inadvertently trip or actuate (e.g., during startup in rush current), thereby providing data related to the trip window or sensitivity of the protection component.

Figure 34:
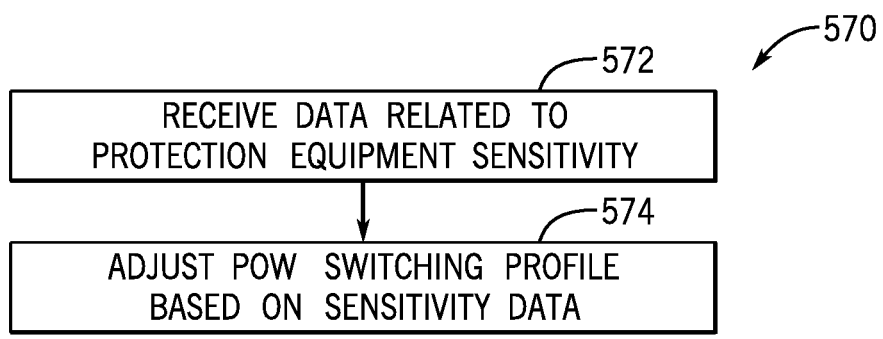
FIG. 34 illustrates a flow chart of a method for dynamically adjusting POW settings for a relay device based on protection equipment data, in accordance with an embodiment.

Keeping this in mind, FIG. 34 illustrates a flow chart of a method 570 for adjusting the POW switching profile for a relay device based on connected protection equipment data. As shown in FIG. 34, at block 572, the control system 198 may receive data related to protection equipment. The data may be received from protection equipment (e.g., circuit breakers, switchgear), from other control systems, or the like.

The data may be indicative of times and conditions in which the protection equipment activated. That is, the data may include electrical properties (e.g., voltage, current) that correspond to causing the protection equipment to trip. In some embodiments, the data may include information indicating that the protection equipment should not have tripped. The information may be received as input to the control system 198 to designate certain trips by the protection equipment as true or false trips.

In addition, the data may include sensitivity data regarding the protection equipment. The sensitivity data may include a range of voltage levels that the protection equipment received within a period time that may have caused the protection equipment to inadvertently trip. In some embodiments, the data may be received from a database containing manufacturing datasheets regarding the protection equipment. The data may detail the current ripples or voltage spikes that may cause the protection equipment to falsely trip.

After receiving the data related to the protection equipment, at block 574, the control system 198 may adjust a POW switching profile for the relay device based on the data. The control system 198 may adjust the POW switching profile for the relay device to prevent the inadvertent tripping of the protection component. As such, the control system 198 may reduce the likelihood of nuisance tripping by the protection equipment.

In some embodiments, the control system 198 may employ an angle auto-tuning process that identifies the limits of connected protection components and adjusts the POW switching to avoid reaching these limits. That is, during an initialization phase, the control system 198 may continuously adjust the POW switching profile for the relay device to identify the situations that cause the connected protection equipment to inadvertently trip. The control system 198 may adjust the firing angle in which the contacts of the relay device change states to detect whether the protection equipment may inadvertently trip due to current rippled, voltage spikes, or the like. Based on the conditions in which the protection equipment inadvertently trips, the control system 198 may determine the POW switching profile to use to control the switching of the contacts within the relay device.

In addition, the control system 198 may automatically tune the operation of the relay device based on a machine learning algorithm and data available to the control system. For example, the control system 198 may monitor the operation of the relay device for an initial period (e.g., 100 hours) and determine a best operation mode for the relay device during the various operation cycles of the load device. In another embodiment, load or device data that may be specific to the device being controlled by the relay device may be provided to the control system 198 associated with operating the relay device to determine a POW switching profile that suits longevity of the relay device.

Along with tuning the operation of an individual device, the control system 198 may coordinate the sequencing or the operation of a number of load devices using different POW switching profiles for multiple relay devices that operate multiple load devices. That is, in certain coordinated or parallel system, it may be useful to power on load devices according to a particular sequence to ramp up the inrush current or to reduce the peak in-rush current being provided to downstream devices.

Figure 35:
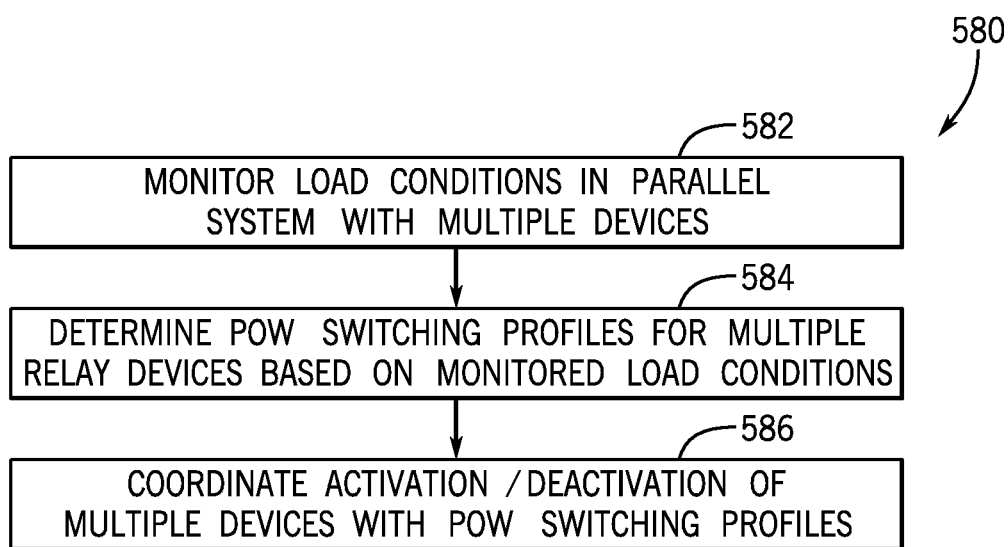
FIG. 35 illustrates a flow chart of a method for coordinating activation of multiple devices with respect to POW settings for multiple respective relay devices, in accordance with an embodiment.

With this in mind, FIG. 35 illustrates a flow chart of a method 580 for coordinating the activation of multiple load devices using various POW switching profiles. In some embodiments, the control system may, at block 582, receive data related to the operations of various load devices and certain load conditions for the load devices. The data may be received from the load devices, sensors disposed downstream from the relay device, other control systems or the like.

At block 584, the control system 198 may determine the POW switching profiles for the multiple relay devices used to provide power to the multiple load devices. The control system 198 may account for the load conditions present on the load devices when determining the appropriate POW switching profile to use for the respective relay device. That is, the control system 198 may delay switching or closing certain relay devices by adjusting the respective POW switching profiles to accommodate for the various monitored parameters. For example, if one of the load devices causes an inrush current greater than a threshold to be generated when powered on, the control system 198 may delay turning on or connecting power to another load device that may be in a parallel system (e.g., electrically parallel) to avoid the inrush current from being provided to other devices. Alternatively, the control system 198 may detect or anticipate the inrush current and adjust the POW switching profile for other relay devices to close at zero current crossing to avoid potential arcing events. In addition, the control system 198 may coordinate the turning on of various devices via respective relay devices to ensure that no two devices are powered on at the same time to ensure that the inrush current or other electrical specifications are maintained.

At block 586, the control system 198 may coordinate the activation and/or deactivation of the load devices using the POW switching profiles determined at block 584. As such, the control system 198 may control open and close operations of the armature in the relay device based on the updated POW switching profile. In addition, the control system 198 may coordinate the open and closing operations of various relay devices such that load devices are activated and/or deactivated in a controlled fashion to ensure that each load device operates within expected electrical parameters for the respective load device. That is, the control system 198 may coordinate the activation and/or deactivation of each load device to ensure that current ripples, voltage spikes, inrush current, and other electrical parameters do not cause damage to any of the load devices connected in parallel or in series with each other.

It should be noted that the process for sequentially turning-on multiple relays to reduce torque/current ripple will assist in reducing overall system torque ripple, just as adjusting and optimizing an alpha angle that the relay devices are closed or opened. In addition, this process may be used in conjunction with an alpha angle optimization process that may involve a staged/staggered turn-on of multiple motors.

Controlling Firing Delay in Multi-phase Relay Devices

A multi-phase relay device may include multiple armatures that control positions of respective sets of contacts. With this in mind, an alpha angle of three phase POW controlled relay device corresponds to a time at which two phases of the three phases are energized. The alpha angle is followed by a beta event when the third phase is energized. In some embodiments, the beta delay may be controlled to cancel or reduce harmonics that may be present on the overall system. By employing the embodiments described herein, the control system 198 may adjust the POW switching profiles for multi-phase relay devices to reduce harmonics, provide a soft start option for the load, and the like.

Figure 36:
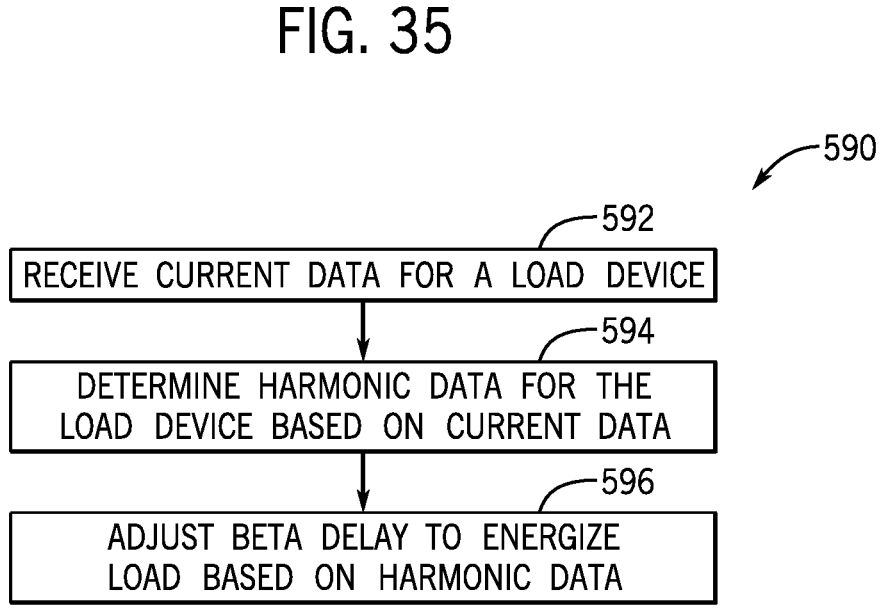
FIG. 36 illustrates a flow chart of a method for dynamically controlling a beta delay for a relay device based on harmonics data, in accordance with an embodiment.

With this in mind, FIG. 36 illustrates a flow chart of a method 590 for adjusting the beta delay to energize a load device. As discussed throughout this disclosure, although the method 690 is described as being performed by the control system 198, any suitable control system or controller may perform the methods described herein. Referring now to FIG. 36, at block 592, the control system 198 may receive current data related to current being received by a load device (e.g., motor). The current data may be received via a current sensor or other suitable sensor capable of measuring current waveforms received at the load device. The current data may provide information related to the resonance frequency of the load device.

At block 594, the control system 198 may use the resonance frequency data to determine whether harmonics are present on the load or expected to be present on the load. At block 596, the control system 198 may use the expected harmonics that may be present when starting the load device to adjust the beta delay associated with energizing a particular phase of the input power to reduce or minimize the presence of the harmonics on the load.

In some embodiments, the control system 198 may cycle power to the load device and receive the current data from sensors to detect whether harmonics are present on the load side. In addition, the control system 198 may incrementally adjust the beta delay after each cycle to identify the beta delay that enables the load device to operate with the lowest amount of harmonics.

Figure 37:
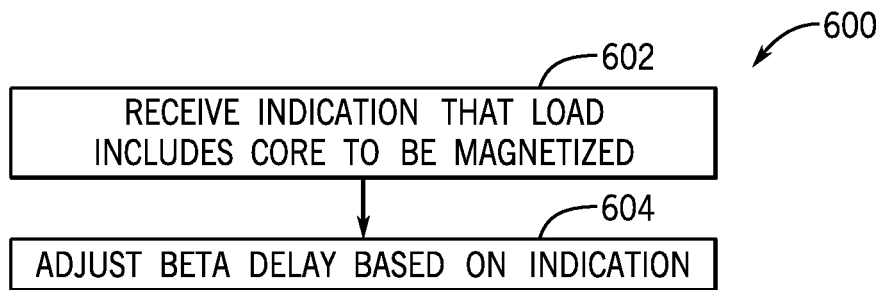
FIG. 37 illustrates a flow chart of a method for dynamically controlling a beta delay for a relay device based on a presence of a magnetic core, in accordance with an embodiment.

In some devices, a three-phase power source connected to a load via a three-phase relay device to magnetize a core of a motor. Keeping this in mind, FIG. 37 illustrates a flow chart of a method 600 for adjusting the beta delay based on whether the load includes a magnetic core. At block 602, the control system 198 may receive an indication that a magnetic core is present in the load device. In one embodiment, the control system 198 may receive a user input indicative of the load including the magnetic core. In another embodiment, a control system that operates the load device may send an indication that the load device includes a magnetic core to the control system 198. In yet another embodiment, the control system 198 may receive nameplate data from a database or other suitable storage that provides information regarding the load device.

At block 604, the control system 198 may adjust the beta delay based on the presence or lack of presence of the magnetic core in the load device. The beta delay may be used to provide additional time for the core to magnetize before proceeding with the operation of the motor. In some embodiments, the beta delay may vary directly to the size of the magnetic core. That is, as for magnetic cores that are larger than others, the control system 198 may extend the beta delays further, as compared to the load devices with smaller magnetic cores.

In some embodiments, the control system 198 may cycle power to the load device and receive the data from sensors to detect whether a magnetic core is present on the load device. In addition, the control system 198 may incrementally adjust the beta delay after each cycle to identify the beta delay that enables the load device to have a sufficient amount of time to energize its magnetic core.

In yet another embodiment, the control system 198 may use a number of POW open and close operations (e.g., on and off signals) with various beta delays to provide a soft starter feature for a respective load. For example, the control system 198 may use a POW close operation to provide power to a load device. The POW close operation may be provided in cycles along with open operations to provide a pulse width modulated (PWM) signal to the downstream devices. The first POW close operation may be provided with a first beta delay at, for example, a half-cycle delay, while the second POW close operation may be provided with a beta delay at a full cycle.

Figure 38:
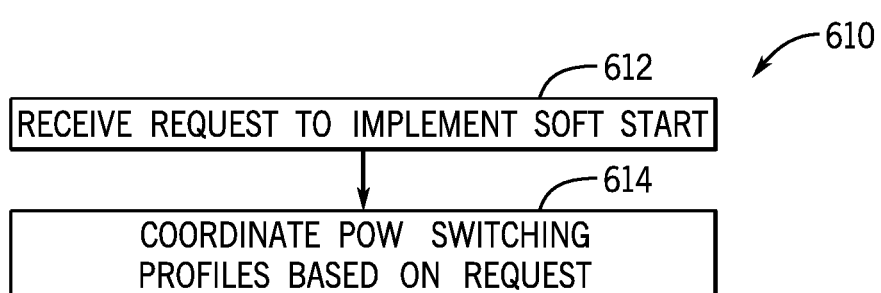
FIG. 38 illustrates a flow chart of a method for implementing a soft start initialization process using POW switching, in accordance with an embodiment.

With the foregoing in mind, FIG. 38 illustrates a flow chart of a method for coordinating the POW switching profile of relay devices for soft start operations. At block 612, the control system 198 may receive a request to implement a soft start. The request may be received via user input to the control system 198. After receiving the request, the control system 198 may, at block 614, coordinate the POW switching profiles of the relay device to perform a soft start operation as described above.

The controlled cycling on and off of the respective device may also be coordinated by the control system 198, such that different relays are used to control each respective phase. That is, each phase may be cycled on and off at different intervals or according to a different sequence using POW switching profiles. In this way, different phases are being used to energize the respective device instead of using the beta delay to continuously connect one particular phase of power to the respective device. For instance, the phases that are connected to the respective device may be coordinated using the POW switching according to a round robin sequence, such that phases A and C are connected to the respective device with the alpha angle, phases A and B are connected to the respective device with the alpha angle during a subsequent cycle, and so forth. In this way, instead of repeatedly using one particular phase to energize the connected device, the contact of the respective relay may be preserved to operate for longer life cycles.

POW Switching to Synchronize with Rotating Load

In addition to controlling the beta delay for various situations, the control system 198 may use different POW switching profiles to resynchronize a power source (e.g., a starter) with a rotating load (e.g., motor). That is, the control system 198 may monitor the power properties of the rotating load to understand the frequency properties of the power provided to the rotating load and remake the power connection to the rotating load (e.g., high inertia load) at an optimized point on wave. For instance, a rotating load may continue to rotate while power has been removed from the power source. If power is to be reconnected, the control system 198 may optimize the synchronization of providing power back to the rotating load without introducing any additional torque than necessary to maintain the desired frequency.

Figure 39:
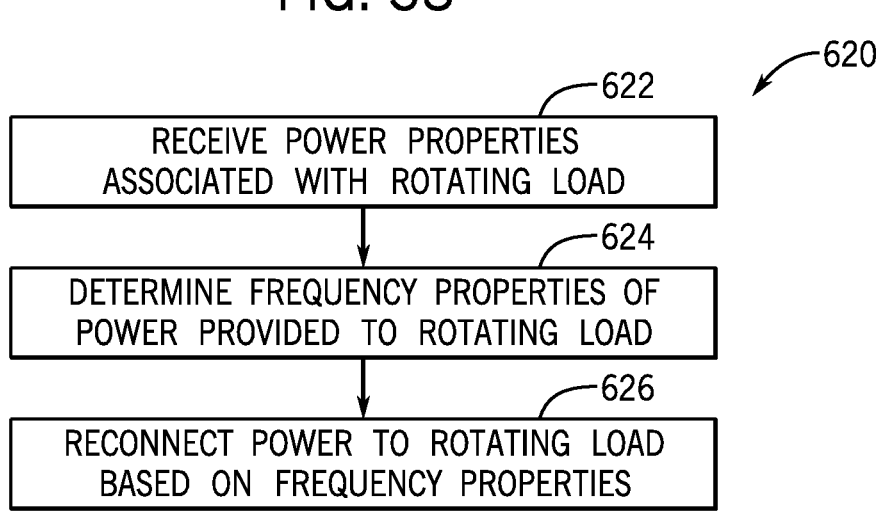
FIG. 39 illustrates a flow chart of a method for reconnecting power to a rotating load, in accordance with an embodiment.

With this in mind, FIG. 39 illustrates a flow chart of a method 620 for resynchronizing a power connection to a rotating load. As such, the method 620 may be performed after receiving an indication that the rotating load is no longer connected to a power source or that at least one phase of the rotating load is no longer connected to the rotating load. After at least one phase of power is removed from the rotating load, the rotating load device may reduce the speed in which it rotates. As such, the electrical waveforms conducting on the windings and internal circuitry of the rotating load device may also be changing in light of the reduced speed.

To reconnect the power to the rotating load device, the control system 198 may connect power to the rotating load device using a particular point-on-wave (POW) switching profile that ensures that the rotating load device resumes its rotation while minimizing the introduction of additional torque to maintain a desired frequency. As shown in FIG. 39, at block 622, the control system 198 may receive power properties associated with a rotating load. The power properties may include an electrical frequency of the voltage signal and/or current signal being provided to each phase of a rotating load. The power properties may be received via voltage sensors, current sensors, or the like.

In some embodiments, the power properties may be determined by the control system 198 based on a speed in which a shaft of the rotating load device rotates and data indicative of power properties provided to each phase of the rotating load device. Using the speed of the shaft and the data indicative of power properties provided to each phase of the rotating load device, the control system 198 may determine a frequency (e.g., voltage waveform frequency) that the rotating load device is rotating. In addition, the control system 198 may determine a rate of deceleration of the rotating load device, such that the control system 198 may anticipate the frequency of the rotating load device at a certain time.

At block 624, the control system 198 may determine frequency properties of the power present on the rotating load device based on the data received at block 622. The frequency properties may include an amplitude of voltage and current provided to each phase of rotating load device, a period or frequency of the voltage or current waveform provided to each phase of the rotating load, and the like.

At block 626, the control system 198 may reconnect the power to the rotating load device based on the frequency properties of the power present on the rotating load device. In some embodiments, the control system 198 may determine the expected frequency properties present on the rotating load device at a particular time in the future and perform a close operation for a particular phase of power connected to the rotating load device using a POW switching profile that matches a frequency and amplitude of the detected frequency properties. In some embodiments, the control system 198 may control the open and closing operations of the relay device to provide the power at the desired frequency properties.

By connecting the power to the rotating load device in this fashion, the control system 198 may synchronize the power provided to the rotating load device, such that the rotating load device is optimized to resolve a residual voltage difference between the power source and the rotating load device to zero after the POW switching remakes the connection between the power source and rotating load. To optimize the synchronization, as mentioned above, the control system 198 may use the determined the amplitude of the voltage waveform and the frequency of the voltage waveform to coordinate the POW switching for one or more sets of contacts to perform close operations that will be coordinated to connect the power source to the load at the determined amplitude and time.

In some embodiments, the back EMF signal may be used to determine the electrical properties of the rotating load. In this case, the back EMF signal may be determined by the control system 198 or received via a sensor. The back EMF signal may be used to determine the frequency properties of the power present on the rotating device. However, if the back EMF signal collapses, the control system 198 may connect one phase of a three-phase power source (e.g., pulsing a single-phase power) to the rotating load to determine the power characteristics of the rotating load and remake the connection between the power source and the rotating load at a time or point on a voltage waveform that may reduce harmonics, minimize additional torque being provided on the rotating load device, or the like. In some embodiments, if the control system determines that the rotating load is rotating in an opposite or reverse direction, the control system may adjust its optimization process accordingly.

Figure 40:
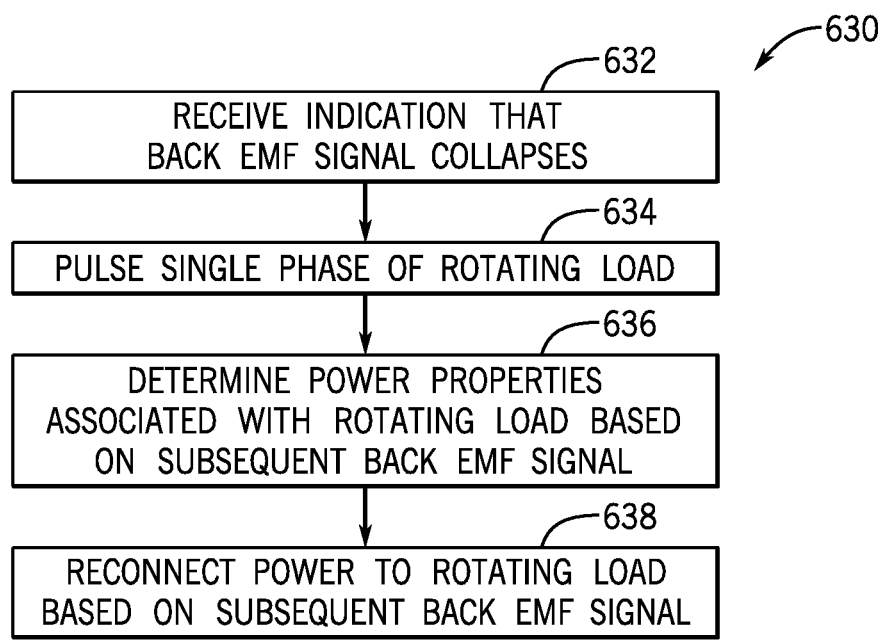
FIG. 40 illustrates a flow chart of a method for reconnecting power to a rotating load based on back electromotive force (EMF), in accordance with an embodiment.

With this in mind, FIG. 40 illustrates a flow chart of a method 630 for reconnecting power to a rotating load device after detecting that the back EMF signal has collapsed. Referring to FIG. 40, at block 632, the control system 198 may receive an indication that the back EMF signal from a rotating load device has collapsed or decreased to zero. In some embodiments, the control system 198 may monitor the back EMF signal that corresponds to feedback from the rotating load device via a sensor or other suitable measurement circuitry.

The indication that the back EMF signal has collapsed may alert the control system 198 that the rotating load device may be offline. As such, the control system 198 may attempt to remake a power connection to the rotating load device when the upstream power becomes available. At block 634, the control system 198 may send one or more voltage or current pulses to a single phase of the rotating load device via a respective contact of a respective relay device. The electrical pulses may be used to provide energy to the rotating load device, such that the rotating load device may begin or resume rotating.

At block 636, the control system 198 may determine power properties associated with the rotating load based on the back EMF signal received after the electrical pulses are sent to the rotating load device at block 634. The power properties determined based on the subsequent back EMF signal may represent the voltage or current waveform that is presently on the rotating load device. In this way, at block 638, the control system 198 may reconnect power to the rotating load device via a respective set of contacts based on the power properties determined at block 634. That is, the control system 198 may reconnect power to the rotating load device using a POW switching profile that may be determined using the procedure described above in block 626, using a delayed beta angle, or any suitable methodology that may enable the rotating load device to resume its rotation at a rate or desired frequency.

Printed Circuit Board (PCB) Implementations

Multiple motors associated with a machine or a process may be controlled using a control system and motor starters. However, routing wires between each motor controller and various motors may pose various manufacturing and assembly challenges. For example, each wire to be routed between each motor starter and a respective motor is typically labeled to ensure that the wire is connected to an appropriate terminal to effectively control the respective motor. However, this process is time and work intensive. Accordingly, certain embodiments of the present application relate to implementing multiple motor controllers (e.g., motor starters) on a printed circuit board (PCB) to automatically operate and control a respective number of motors coupled to the PCB. For example, after a number of motor starters are integrated with certain terminals of the PCB, control circuitry of the PCB may automatically adjust circuit connections on the PCB to properly route wires used to control each motor to the appropriate motor starter. That is, in one embodiment, the control circuitry may send a signal to each load-side terminal of the PCB in a controlled fashion to measure the back electromotive force (EMF) properties of each motor to determine how the respective wires connected to each load-side terminal are connected to each respective motor starter. Based on the back EMF properties of each motor, the control circuitry may adjust the circuit connections on the PCB to properly route the wires between each motor to the appropriate motor starter. As such, embodiments of the present application provide an initialization process of motor starters coupled to the PCB that automatically configures the motor starters to operate and control respective motors coupled to the PCB, thereby reducing the time to assemble and manufacture motor control systems and minimizes the probability of incorrectly wiring such motor control systems.

After performing the initialization process described above, the control circuitry of the PCB may also monitor and control the operation of one or more relays of each motor controller coupled to the PCB. For example, the control circuitry may detect the number of relays present on the PCB and determine the number of motors the PCB is capable of controlling. As described above, the control circuitry of the PCB may perform the initialization process of the motor starters coupled to the PCB to measure the back EMF properties of each motor connected to the PCB and adjust the circuit connections on the PCB to properly route the wires that control each motor to the appropriate motor starter. The PCB may then determine the number of motors currently coupled to the PCB and disable any relays that are not electrically connected to such motors through the PCB. In this way, the control circuitry may increase the power efficiency of the motor control system by disabling any relays that are not currently utilized.

In yet another embodiment, the control circuitry of the PCB may automatically configure a collection of relays on the PCB to operate according to different current ratings of the types of motors coupled to the PCB and/or the number of motors coupled to the PCB. For example, the control circuitry of the PCB may configure one or more relays of the PCB to support two lower amp-rated motors or one higher amp-rated motor via the initialization process described above. By measuring the back EMF properties of each motor coupled to the PCB and adjusting the circuit connections on the PCB to electrically couple the relays with the motors coupled to the PCB based on the back EMF properties, the control circuitry of the PCB may automatically configure the relays to support different types of motors and/or different numbers of motors. Additionally, the control circuitry may provide a recommendation to add one or more jumpers to the PCB to make appropriately rated relay connections based on the number of motors and/or the type of motors coupled to the PCB. Accordingly, the control circuitry may increase the flexibility of a single PCB to be utilized in various applications associated with motor control systems, thereby reducing the number of PCBs needed to implement such applications.

Figure 41:
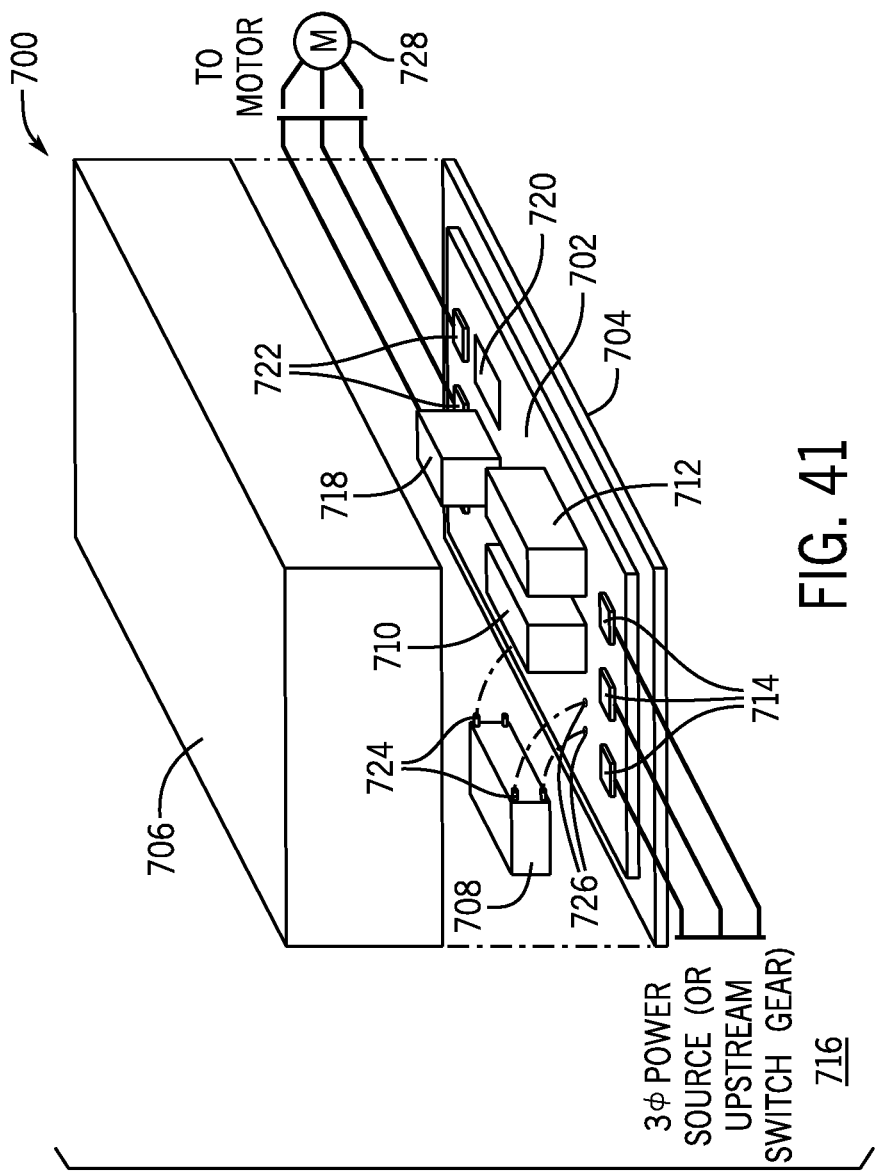
FIG. 41 is a perspective view of an exemplary printed circuit board (PCB) implementing a single motor controller, in accordance with an embodiment.

With the foregoing in mind, FIG. 41 illustrates an exemplary PCB implementing a motor controller 700 (e.g., a motor starter). The motor controller 700 is electrically coupled to a PCB 702 that supports various components of the motor controller 700 and facilitates routing of power signals, data signals, and control signals during operation. In certain embodiments, the motor controller 700 may be packaged in a manner that conforms to industry standards for three-phase automation devices, 208, 230, or 560 VAC motor controllers, or other motor starter applications. In the illustrated embodiment, the PCB 702 and the mounted components to the PCB 702 are supported on a base 704 and are covered by a housing or an enclosure 706 that couples to the base 704.

As illustrated in FIG. 41, three relays 708, 710, 712 of the motor controller 700 are mounted to the PCB 702 and are electrically coupled to other circuit components through the PCB 702. The relays 708, 710, 712 may be mounted to the PCB 702, for example, through pins or tabs 724 extending from the packaging of the relays 708, 710, 712. Each pin or tab 724 may be electrically coupled to a respective hole 726 in the PCB 702 (e.g., by soldering). The relays 708, 710, 712 have control connections that facilitate the automatic opening and closing of the relays 708, 710, 712 (i.e., automatically changing the respective conductive state of each relay) by applying control signals through the control connections to the relays 708, 710, 712. Additionally, the motor controller 700 is coupled to a three-phase power source 716 via line-side terminals 714. The relays 708, 710, 712 may receive three-phase power from the line-side terminals 714 through the PCB 702 and output the three-phase power through respective load-side terminals 722 to a motor 728. It should be noted that the three-phase implementation described herein is not intended to be limiting. More specifically, certain aspects of the disclosed techniques may be employed on single-phase circuitry.

A power supply 718 is also coupled to the PCB 702. The power supply 718 may provide power to control circuitry 720 through the PCB 702. More specifically, the power supply 718 receives power from one or more of the phases of power from the line-side terminals 714 and converts the power to regulated power (e.g., direct current (DC) power). The control circuitry 720 receives the regulated power from the power supply 718 and utilizes the regulated power for monitoring, computing, and control functions, as described herein.

In certain embodiments, to facilitate operation of a machine or a process, the motor 728 may include an electric motor that converts electric power to provide mechanical power. To help illustrate, the electric motor may provide mechanical power to various devices, as described herein. For example, the electric motor may provide mechanical power to a fan, a conveyer belt, a pump, a chiller system, and various other types of loads that may benefit from the advances proposed. Additionally, the machine or the process may include various actuators (e.g., motors 728) and sensors. The motor controller 700 may control a motor 728 of the machine or the process. For example, the motor controller 700 may control the velocity (e.g., linear and/or rotational), torque, and/or position of the motor 728. Accordingly, as used herein, the motor controller 700 may include a motor starter (e.g., a wye-delta starter), a soft starter, a motor drive (e.g., a frequency converter), or any other desired motor powering device.

Figure 42:
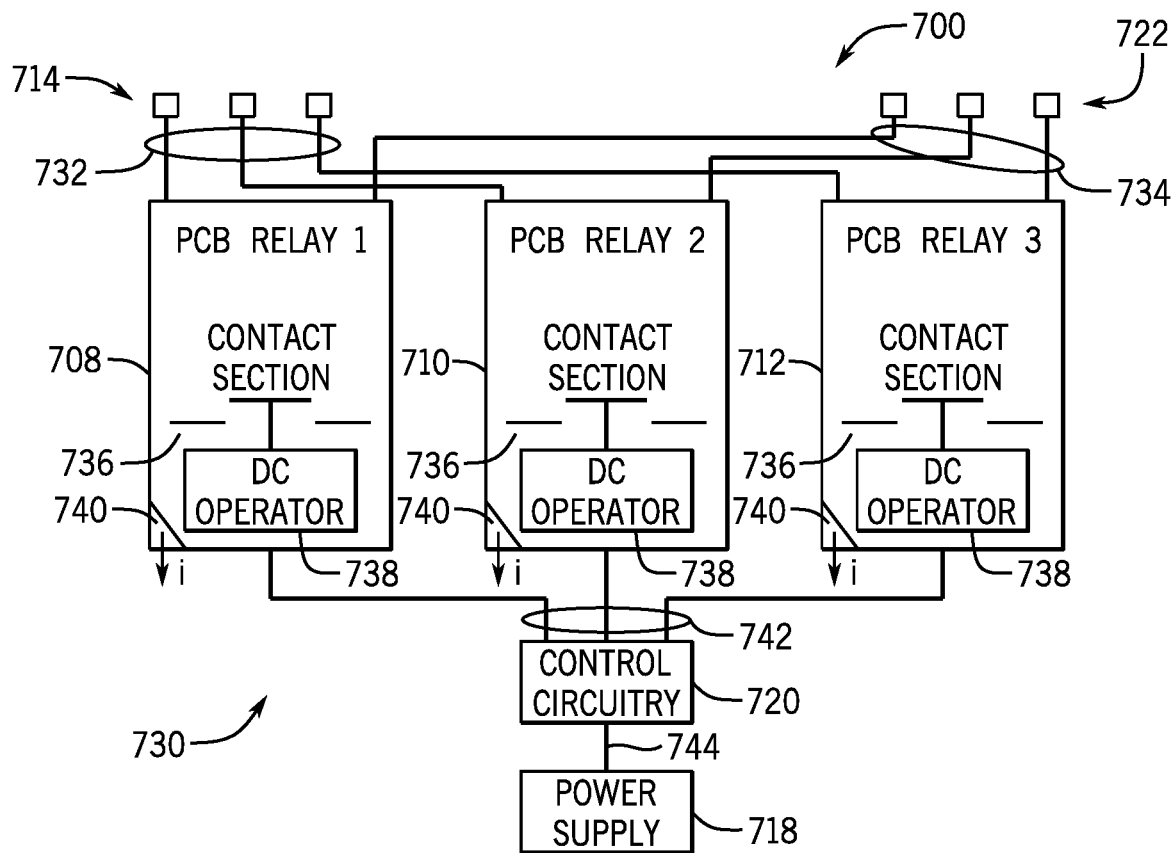
FIG. 42 is a schematic representation of the motor controller of FIG. 41, in accordance with an embodiment.

FIG. 42 illustrates a schematic representation 730 of the motor controller 700. As illustrated in FIG. 42, the relays 708, 710, 712 are electrically coupled to the control circuitry 720 and the power supply 718 via the control circuitry 720. The relays 708, 710, and 712 may operate according to any of the techniques described above. Conductive traces 732 in or on the PCB 702 and between the line-side terminals 714 and the relays 708, 710, 712 may facilitate provision of the three-phase power from the power supply 718 to the relays 708, 710, 712. Similarly, conductive traces 734 in or on the PCB between the load-side terminals 722 and the relays 708, 710, 712 may facilitate provision of the three-phase power from the relays 708, 710, 712 to the motor 728 via the load-side terminals 722. In some embodiments, the conductive traces 732, 734 may be made by conventional PCB manufacturing techniques (e.g., plating, etching, layering, drilling, etc.).

Each relay 708, 710, 712 may be an electromechanical device that completes a single current carrying path (or interrupts the current carrying path) under the control of an electromagnetic coil structure as discussed above. As illustrated in FIG. 42, the relays 708, 710, 712 include a contact section 736 and a direct current (DC) operator 738. The contact section 736 typically has at least one moveable contact and at least one stationary contact. The moveable contact is displaced under the influence of a magnetic field created by energization of a coil of the DC operator 738 via control signals provided by the control circuitry 720. Each relay 708, 710, 712 also has a current sensor 740 that allows for detection of currents of incoming and/or outgoing power. In some embodiments, the current sensor 740 may be a separate component that is associated with the conductive traces 732, 734 that facilitate provision of the three-phase power from the line-side terminals 714 to the relays 708, 710, 712 or facilitate provision of the three-phase power from the relays 708, 710, 712 to the load-side terminals 722.

Additionally, conductive traces 742 in or on the PCB 702 electrically couple the DC operator 738 of each relay 708, 710, 712 to the control circuitry 720. Further, conductive traces 744 in or on the PCB may facilitate provision of the three-phase power between the power supply 718 and the control circuitry 720. In some embodiments, additional monitoring, programming, data communication, feedback, and the like, may be performed by the components of the motor controller 700. In such embodiments, the signals may be provided and exchanged by additional conductive traces in or on the PCB 702.

Figure 43:
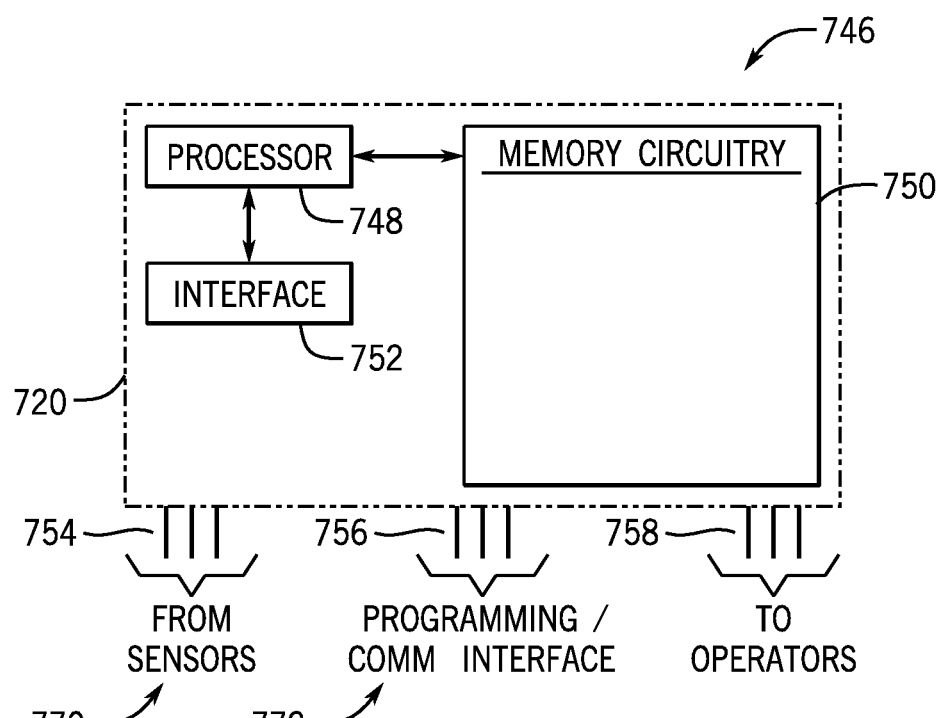
FIG. 43 is a diagrammatical view of exemplary control circuitry of the motor controller of FIG. 41, in accordance with an embodiment.

FIG. 43 illustrates a block diagram 746 of various components of the control circuitry 720. As illustrated in FIG. 43, the control circuitry 720 has one or more processors 748 and memory circuitry 750. More specifically, the memory circuitry 750 may include a tangible, non-transitory, computer-readable medium that stores instructions, which when executed by the one or more processors 748 perform various processes described herein. It should be noted that "non-transitory" merely indicates that the media is tangible and not a signal. Although described as being part of the PCB 702, the control circuitry 720 may be separate from the PCB 702 and communicate with components on the PCB 702. It should also be noted that the control circuitry may also include elements described above as part of the control system 198.

In some embodiments, operation of the motor controller 700 (e.g., opening or closing of the relays 708, 710, 712) may be controlled by the control circuitry 720. The control circuitry 720 may also have one or more interfaces 752 to exchange signals between the control circuitry 720 and sensors, external components and circuits, relay coils, and the like. The control circuitry 720 also has conductors 754, 756, 758 or pinouts for communicating with various devices via conductive traces of the PCB 702. For example, conductors 754 may receive sensor data from various sensors 770 associated with the power supply 718, the motor controller 700, the motor 728, and the like. More specifically, the sensors 770 may monitor (e.g., measure) characteristics (e.g., voltage or current) of the power. Accordingly, the sensors 770 may include voltage sensors and current sensors. The sensors 770 may alternatively be modeled or calculated values determined based on other measurements (e.g., virtual sensors). Many other sensors and input devices may be used depending upon the parameters available and the application. Additionally, conductors 756 may exchange data with a programming or communications interface 772, and conductors 758 may provide control signals to the relays 708, 710, 712.

Figure 44:
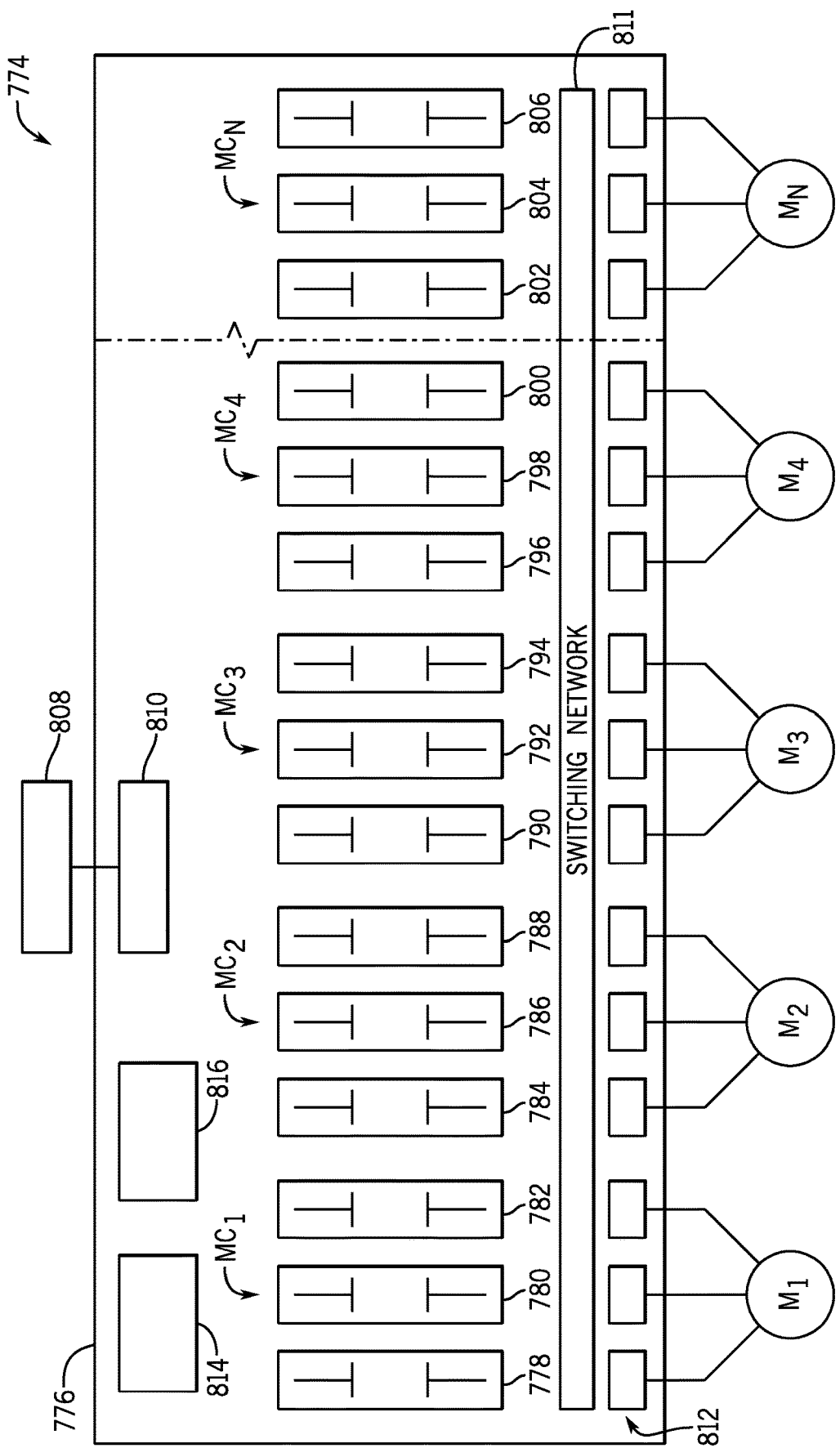
FIG. 44 is a simplified representation of an exemplary PCB implementing multiple motor controllers, in accordance with an embodiment.
Figure 45:
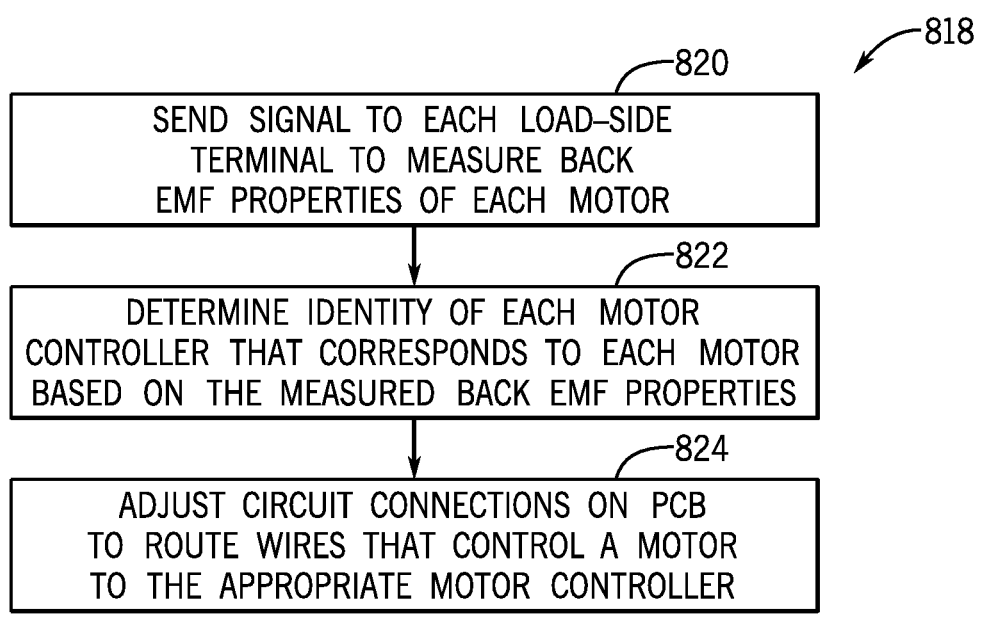
FIG. 45 is a flowchart of a method for an initialization process to automatically adjust circuit connections on the PCB of FIG. 44 to route wires between motors coupled to the PCB and motor controllers coupled to the PCB, in accordance with an embodiment.

Although the PCB 702 described in FIGS. 60 and 61 is implemented with a single motor controller 700, other PCB configurations may be implemented with multiple motor controllers in order to control respective motors. In some embodiments, for example, a PCB may be implemented with more than five motor controllers, more than ten motor controllers, or any other suitable amount of motor controllers to control respective motors of a particular machine or process. With the foregoing in mind, FIG. 44 illustrates a block diagram 774 of an exemplary PCB 776 implemented with a number of motor controllers (e.g., $MC_N$) configured to control a respective number of motors (e.g., $M_N$) of a particular machine or process. Each motor controller (e.g., $MC_1, MC_2, MC_3, MC_4, \ldots MC_N$) may have three relays mounted to the PCB 776 associated therewith. For example, motor controller $MC_1$ may be associated with relays 778, 780, 782, motor controller $MC_2$ may be associated with relays 784, 786, 788, motor controller $MC_3$ may be associated with relays 790, 792, 794, motor controller $MC_4$ may be associated with relays 796, 798, 800, and motor controller $MC_N$ may be associated with relays 802, 804, 806. The relays 802, 804, 806 associated with each motor controller $MC_N$ are electrically coupled to other circuit components through the PCB 776. In particular, the relays 802, 804, 806 have control connections that facilitate the automatic opening and closing of the relays 802, 804, 806 (i.e., automatically changing the respective conductive state of each relay) by applying control signals through the control connections to the relays 802, 804, 806. Each motor controller $MC_N$ is coupled to a three-phase power source 808 via a set of line-side terminals 810. The relays 802, 804, 806 of each motor controller $MC_N$ receive three-phase power from the set of line-side terminals 810 through the PCB 776 and output the three-phase power through respective load-side terminals 812 to a respective motor $M_1, M_2, M_3, M_4, \ldots M_N$. As described above, it should be noted that the three-phase implementation described herein is not intended to be limiting. More specifically, certain aspects of the disclosed techniques may be employed on single-phase circuitry.

Additionally, a power supply 814 is coupled to the PCB 776. The power supply 814 provides power to control circuitry 816 through the PCB 776. More specifically, the power supply 814 receives power from one or more of the phases of power from the set of line-side terminals 810 and converts the power to regulated power (e.g., direct current (DC) power). The control circuitry 816 receives the regulated power from the power supply 814 and utilizes the regulated power for monitoring, computing, and control functions, as described herein. It should be noted that the power supply 814 and the control circuitry 816 may have similar respective features and functions as the power supply 718 and the control circuitry 720 described herein.

As mentioned above, after a number of motor controllers $MC_N$ (e.g., motor starters) have been electrically coupled to the PCB 776, the control circuitry 816 of the PCB 776 may perform an initialization process to automatically adjust circuit connections on the PCB to properly route wires used to control each motor $M_N$ to the appropriate motor controller $MC_N$. With this in mind, FIG. 64 illustrates a flow chart of a method 818 for the initialization process performed by the control circuitry 816. In block 820, the control circuitry 816 may send a signal to each load-side terminal 812 of the PCB 776 in a controlled fashion to measure the back EMF properties of each motor $M_N$ electrically coupled to the PCB 776 to determine how the respective wires connected to each load-side terminal 812 are connected to each motor controller $MC_N$. In some embodiments, the control circuitry 816 may receive back EMF data (e.g., voltage data) associated with each motor $M_N$ electrically coupled to the PCB 776 and determine the back EMF of each motor $M_N$ based on the received data. In block 822, based on the back EMF properties of each motor $M_N$, the control circuitry 816 may determine the identity of each motor controller $MC_N$ that correctly corresponds to a particular motor $M_N$.

In block 824, the control circuitry 816 may then adjust the circuit connections on the PCB 776 to properly route the wires that control each motor $M_N$ to the appropriate motor controller $MC_N$. For example, the control circuitry 816 may determine that the motor controller $MC_1$ corresponds to the motor $M_4$ and the motor controller $MC_4$ corresponds to the motor $M_3$. That is, the motor $M_4$ may be electrically coupled to the PCB 776 through load-side terminals 812 not ordinarily used to couple a motor corresponding to the motor controller $MC_1$ (e.g., not directly in line with or underneath the relays 778, 780, 782 of motor controller $MC_1$ on the PCB 776), and the motor $M_3$ may be electrically coupled to the PCB 776 through load-side terminals 812 not ordinarily used to couple a motor corresponding to the motor controller $MC_4$ (e.g., not directly in line with or underneath the relays 796, 798, 800 of the motor controller $MC_4$ on the PCB 776). The control circuitry 816 may then automatically adjust the circuit connections on the PCB 776 to route the wiring that controls the motor $M_4$ to the motor controller $MC_1$ and the wiring that controls motor $M_3$ to the motor controller $MC_4$. That is, the PCB 776 may include a switching network 811 that may be composed of a network of switches that interconnect the outputs of the relays 778-806 to different load-side terminals 812.

By way of example, the switching network 811 may include a subset of switches for each set of relays (e.g., 778, 780, 782) connected to a subset of the load-side terminals 812 associated with a particular motor. The subset of switches may enable each individual relay of the set of relays (e.g., 778, 780, 782) to connect to any one of the subset of load-side terminals 812, such that a wire mistakenly placed in one load-side terminal 812 may be internally routed via the switching network 811 to the correct relay (e.g., 778, 780, 782).

In addition, the switching network 811 may facilitate changing the routing between any individual relay disposed on the PCB 776 to any individual load-side terminal 812. In this way, if the control circuitry 816 detects that the load-side terminals 812 are incorrectly wired to connect one output of a relay to a motor that is not associated with the relay, the switching network 811 may automatically reroute the incorrectly wired load-side terminal 812 to the correct relay output.

By automatically adjusting the circuit connections on the PCB 776 to route the wiring that controls a particular motor $M_N$ to the appropriate motor controller $MC_N$, the time associated with the initialization process of the motor controllers $MC_N$ coupled to the PCB 776 may be reduced, thereby reducing the time for assembling and manufacturing motor control systems. That is, motor controllers $MC_N$ may be coupled to the PCB 776 without regard to how each motor controller $MC_N$ is physically positioned on the PCB 776. Instead, the switching network 811 may connect the appropriate load-side terminals 812 for a corresponding motor $M_N$ to the corresponding relay of the PCB 776. Additionally, the initialization process may also minimize the probability of incorrectly wiring such motor control systems during assembly and manufacturing because the control circuity 816 automatically determines and connects each motor controller $MC_N$ with the appropriate motor $M_N$ through the PCB 776.

After the control circuitry 816 of the PCB 776 has performed the initialization process described above, the control circuitry 816 may monitor and control the operation of one or more relays 802, 804, 806 of each motor controller $MC_N$ on the PCB 776. For example, the control circuitry 816 may detect the number of relays 802, 804, 806 and determine the number of motors $M_N$ the PCB 776 is capable of controlling. The control circuitry 816 of the PCB 776 may then determine the number of motors $M_N$ currently coupled to the PCB 776 and disable any relays 802, 804, 806 that are not currently connected to such motors $M_N$. For instance, the control circuitry 816 may detect that twelve relays are present on the PCB 776 and that the PCB 776 is capable of controlling four motors. However, after performing the initialization process described above, the control circuitry 816 may determine that two motors $M_1$, $M_3$ are currently connected to the PCB 776. The control circuitry 816 may disable the relays 784, 786, 788, 796, 798, 800 of the motor controllers (e.g., $MC_2$ and $MC_4$) that are not currently in use to control a corresponding motor. In this way, the control circuitry 816 may increase the power efficiency of the motor control system by disabling any relays that are not currently in use.

Additionally, the control circuitry 816 of the PCB 776 may automatically configure a collection of relays (e.g., the relays 802, 804, 806 of each motor controller $MC_N$) on the PCB 776 to operate according to different current ratings based on the type of motors $M_N$ coupled to the PCB 776 and/or the number of motors $M_N$ coupled to the PCB 776. For example, the control circuitry 816 may configure one or more relays 802, 804, 806 (e.g., a 16-amp relay) to support two lower amp-rated motors or one higher amp-rated motor via the initialization process described above. Additionally, the control circuitry 816 may provide a recommendation to add one or more jumpers to the PCB 776 to make appropriately rated relay connections based on the number and/or the type of motors $M_N$ currently coupled to the PCB 776. Accordingly, the PCB 776 may provide motor control systems with an increase in flexibility between various applications, thereby reducing the number of PCBs needed to implement such applications.

In some embodiments, the control circuitry 816 of the PCB 776 may monitor the temperature of the line-side terminals 810 or the load-side terminals 812. Temperature sensors, such as thermocouples and the like, may measure the temperature of the line-side terminals 810 and/or the load-side terminals 812 and relay the temperature data to the control circuitry 816 of the PCB 776. Upon determining that the temperature of a particular line-side terminal 810 and/or a particular load-side terminal 812 has exceeded a given threshold, the control circuitry 816 may provide a visual indication or an audible indication. For example, the indication may represent a recommendation for retightening of the wires connected to the particular line-side terminal 810 and/or the particular load-side terminal 812. In some embodiments, the indication may be provided on a visualization depicted in a display, or the like.

Technical effects of the embodiments described herein include reducing the time of assembling and manufacturing motor control systems by allowing motor controllers to be coupled to a PCB without regard to how each motor controller is connected to a corresponding motor through the PCB (e.g., as compared to individually labeling wires to be routed between motor controllers and a control system). Additionally, the probability of incorrectly wiring such motor control systems during assembly and manufacturing may be minimized. Further, by monitoring and controlling one or more relays on the PCB (e.g., disabling or activating the relays) during operation based on motors currently being controlled by the PCB, the power efficiency of the motor control system may increase by disabling any relays that are not currently in use.

It should be noted that although certain embodiments described herein are described in the context or contacts that are part of a relay device, it should be understood that the embodiments described herein may also be implemented in suitable contactors and other switching components. Moreover, it should be noted that each of the embodiments described in various subsections herein, may be implemented independently or in conjunction with various other embodiments detailed in different subsections to achieve more efficient (e.g., power, time) and predictable devices that may have a longer lifecycle. It should also be noted that while some embodiments described herein are detailed with reference to a particular relay device or contactor described in the specification, it should be understood that these descriptions are provided for the benefit of understanding how certain techniques are implemented. Indeed, the systems and methods described herein are not limited to the specific devices employed in the descriptions above.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A relay device, comprising:
    an armature configured to move between a first position that electrically couples the armature to a first contact and a second position that electrically couples the armature to a second contact;
    a relay coil configured receive a voltage configured to magnetize the relay coil, thereby causing the armature to move from the first position to the second position; and
    a drive circuit configured to couple the voltage to the relay coil, wherein the voltage is higher than a rated voltage associated with the relay coil, wherein the drive circuit is configured to output a constant current to the relay coil, and wherein the drive circuit comprises:
        a switching device associated with a first temperature coefficient; and
        a Zener diode configured to couple to the switching device, the Zener diode having a second temperature coefficient that is different than the first temperature coefficient to maintain the constant current in the relay coil during a change in temperature.

2. The relay device of claim 1, wherein the voltage is approximately between four and five times the rated voltage.

3. The relay device of claim 1, wherein the drive circuit comprises:
    a first voltage source configured to output the rated voltage to the relay coil; and
    a second voltage source configured output an additional voltage.

4. The relay device of claim 3, wherein the drive circuit comprises a switch configured to couple the second voltage source to the relay coil.

5. The relay device of claim 4, wherein the switch is configured to uncouple the second voltage source from the relay coil after the armature moves from the first position to the second position.

6. The relay device of claim 1, wherein the drive circuit is configured to output a constant current to the relay coil.

7. The relay device of claim 1, wherein the Zener diode is configured to offset a change in a property of the switching device due to the change in temperature.

8. The relay device of claim 1, wherein the first temperature coefficient corresponds to a base-to-emitter temperature coefficient.

9. A circuit, comprising: a voltage source; a coil configured receive a voltage output by the voltage source, wherein the voltage is configured to magnetize the coil, thereby causing an armature to move from a first position to a second position, and wherein the voltage is greater than a voltage rating associated with the coil, a Zener diode configured to couple to the voltage source; and a switching device configured to couple the voltage source to the coil, wherein the switching device is configured to couple to the Zener diode, wherein a first temperature coefficient of the Zener diode is different from a second temperature coefficient of the switching device to maintain providing a constant current to the coil during a change in temperature.

10. The circuit of claim 9, wherein the voltage is approximately between four and five times the voltage rating.

11. The circuit of claim 9, wherein the voltage source comprises:
    a first voltage source configured to output the voltage rating to the coil; and
    a second voltage source configured output an additional voltage to the coil.

12. The circuit of claim 11, wherein the circuit comprises a switch configured to couple the second voltage source to the coil.

13. The circuit of claim 12, wherein the switch is configured to uncouple the second voltage source from the coil after the armature moves from the first position to the second position.

14. The circuit of claim 11, wherein the first temperature coefficient of the Zener diode is configured to offset the second temperature coefficient of the switching device.

15. The circuit of claim 9, wherein the Zener diode is coupled to a gate of the switching device.

16. A method, comprising:
    coupling, via a circuit, a first voltage source to a coil, wherein the coil is configured receive a first voltage output via the first voltage source, wherein the first voltage is configured to magnetize the coil, thereby causing an armature to move from a first position to a second position;
    coupling, via the circuit, a second voltage source to the coil, wherein the coil is configured receive a second voltage output via the second voltage source; and
    uncoupling, via the circuit, the second voltage source from the coil after the armature moves from the first position to the second position, wherein the first voltage source remains coupled to the coil after the second voltage source is uncoupled from the coil.

17. The method of claim 16, wherein the first voltage corresponds to a voltage rating of the coil.

18. The method of claim 16, wherein the second voltage corresponds a value greater than to a voltage rating of the coil.

19. The method of claim 16, wherein the coil is configured to receive four to five times a voltage rating of the coil when the first voltage source and the second voltage source is coupled to the coil.

20. The method of claim 16, wherein the coil is configured to receive a constant current from the first voltage source and the second voltage source, and wherein a coil voltage of the coil automatically adjusts to maintain consistent operation with the constant current.

* * * * *